（12）United States Patent
Togashi et al.

(10) Patent No.: US 11,196,004 B2
(45) Date of Patent: Dec. 7, 2021

(54) HIGH-MOLECULAR-WEIGHT COMPOUND HAVING SUBSTITUTED TRIARYLAMINE SKELETON

(71) Applicant: HODOGAYA CHEMICAL CO., LTD., Tokyo (JP)

(72) Inventors: Kazunori Togashi, Tokyo (JP); Hideyoshi Kitahara, Tokyo (JP); Junichi Izumida, Tokyo (JP); Mari Kaneko, Tokyo (JP)

(73) Assignee: HODOGAYA CHEMICAL CO., LTD., Tokyo (JP)

( * ) Notice: Subject to any disclaimer, the term of this patent is extended or adjusted under 35 U.S.C. 154(b) by 132 days.

(21) Appl. No.: 16/487,554

(22) PCT Filed: Mar. 9, 2018

(86) PCT No.: PCT/JP2018/009117
§ 371 (c)(1),
(2) Date: Aug. 21, 2019

(87) PCT Pub. No.: WO2018/168667
PCT Pub. Date: Sep. 20, 2018

(65) Prior Publication Data
US 2019/0378989 A1 Dec. 12, 2019

(30) Foreign Application Priority Data

Mar. 15, 2017 (JP) .............................. JP2017-049629

(51) Int. Cl.
*H01L 51/00* (2006.01)
*C08G 61/12* (2006.01)
(Continued)

(52) U.S. Cl.
CPC ........ *H01L 51/0039* (2013.01); *C08G 61/121* (2013.01); *C09K 11/06* (2013.01);
(Continued)

(58) Field of Classification Search
CPC ........ H01L 51/0039; C08G 2261/3162; C08G 2261/143; C08G 2261/411;
(Continued)

(56) References Cited

U.S. PATENT DOCUMENTS

2001/0026878 A1 10/2001 Woo et al.
2003/0165713 A1 9/2003 Oguma et al.
(Continued)

FOREIGN PATENT DOCUMENTS

CN 102372670 A 3/2012
JP 10-308280 A 11/1998
(Continued)

OTHER PUBLICATIONS

Extended European Search Report for European Application No. 18767921.2, dated Dec. 11, 2020.
(Continued)

*Primary Examiner* — Shane Fang
(74) *Attorney, Agent, or Firm* — Birch, Stewart, Kolasch & Birch, LLP

(57) ABSTRACT

A high molecular weight compound according to the present invention includes a substituted triarylamine structural unit represented by a general formula (1) below,

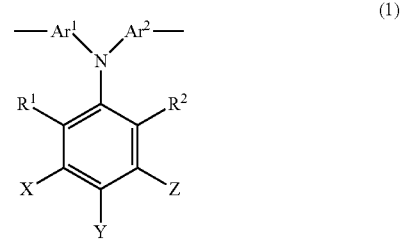

(Continued)

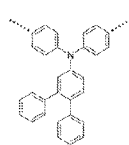

(Structural Unit 1)

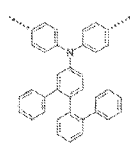

(Structural Unit 2)

(Structural Unit 3)

where $Ar^1$ and $Ar^2$ are a divalent aromatic hydrocarbon group or a divalent aromatic heterocyclic group, $R^1$ and $R^2$ represent a hydrogen atom, a heavy hydrogen atom, a fluorine atom, a chlorine atom, a cyano group, a nitro group, an alkyl group, a cycloalkyl group, an alkenyl group, an alkyloxy group, or a cycloalkyloxy group, X, Y and Z are, on the condition that at least one of them is an aryl group or a heteroaryl group, an aryl group, a heteroaryl group, or a group similar to the groups represented by $R^1$ and $R^2$ above.

8 Claims, 62 Drawing Sheets

(51) Int. Cl.
*C09K 11/06* (2006.01)
*H01L 51/50* (2006.01)

(52) U.S. Cl.
CPC .... *H01L 51/0043* (2013.01); *C08G 2261/124* (2013.01); *C08G 2261/148* (2013.01); *C08G 2261/1412* (2013.01); *C08G 2261/1646* (2013.01); *C08G 2261/18* (2013.01); *C08G 2261/228* (2013.01); *C08G 2261/312* (2013.01); *C08G 2261/3142* (2013.01); *C08G 2261/3162* (2013.01); *C08G 2261/3325* (2013.01); *C08G 2261/512* (2013.01); *C08G 2261/95* (2013.01); *C09K 2211/1416* (2013.01); *C09K 2211/1425* (2013.01); *C09K 2211/1433* (2013.01); *H01L 51/5016* (2013.01); *H01L 51/5056* (2013.01); *H01L 51/5088* (2013.01); *H01L 51/5096* (2013.01)

(58) Field of Classification Search
CPC ............ C08G 2261/18; C08G 2261/95; C08G 2261/3142; C08G 2261/1434; C08G 2261/512; C08G 2261/91
See application file for complete search history.

(56) References Cited

U.S. PATENT DOCUMENTS

| | | |
|---|---|---|
| 2005/0070710 A1 | 3/2005 | O'Dell et al. |
| 2006/0091359 A1 | 5/2006 | Lai et al. |
| 2007/0160847 A1 | 7/2007 | Ong et al. |
| 2009/0146164 A1 | 6/2009 | Tierney et al. |
| 2011/0017983 A1 | 1/2011 | Mizuki et al. |
| 2011/0042661 A1 | 2/2011 | Endo et al. |
| 2011/0303908 A1 | 12/2011 | Min et al. |
| 2012/0193611 A1 | 8/2012 | Chen et al. |
| 2014/0114040 A1 | 4/2014 | Brown et al. |
| 2015/0188069 A1* | 7/2015 | Patel .................. H01L 51/5016 257/40 |
| 2016/0308141 A1 | 10/2016 | Radu et al. |

FOREIGN PATENT DOCUMENTS

| | | |
|---|---|---|
| JP | 2003-226744 A | 8/2003 |
| JP | 2003-238558 A | 8/2003 |
| JP | 2005-272834 A | 10/2005 |
| JP | 2005-285749 A | 10/2005 |
| JP | 2007-119763 A | 5/2007 |
| JP | 2007-162009 A | 6/2007 |
| JP | 2007-177225 A | 7/2007 |
| JP | 2008-280386 A | 11/2008 |
| JP | 4375820 B2 | 12/2009 |
| JP | 2011-126803 A | 6/2011 |
| JP | 2012-7022 A | 1/2012 |
| JP | 2012-126813 A | 7/2012 |
| JP | 2014-519537 A | 8/2014 |
| JP | 2017-22194 A | 1/2017 |
| WO | WO 01/68740 A1 | 9/2001 |
| WO | WO 2005/049546 A1 | 6/2005 |
| WO | WO 2005/059951 A2 | 6/2005 |
| WO | WO 2009/102027 A1 | 8/2009 |
| WO | WO 2009/110360 A1 | 9/2009 |
| WO | WO 2014/009310 A1 | 1/2014 |

OTHER PUBLICATIONS

Endo et al., "Efficient up-conversion of triplet excitons into a singlet state and its application for organic light emitting diodes", Appl. Phys. Let., 2011, vol. 98, pp. 083302-1 to 083302-3.
International Search Report, issued in PCT/JP2018/009117, dated May 29, 2018.

* cited by examiner (Structural Unit 1)

(Structural Unit 2)

(Structural Unit 3)

(Structural Unit 4)

(Structural Unit 5)

(Structural Unit 6)

(Structural Unit 7)

(Structural Unit 8)

(Structural Unit 9)

(Structural Unit 10)

(Structural Unit 11)

(Structural Unit 12)

(Structural Unit 1 3)

(Structural Unit 1 4)

(Structural Unit 1 5)

(Structural Unit 1 6)

(Structural Unit 1 7)

(Structural Unit 1 8)

(Structural Unit 19)

(Structural Unit 20)

(Structural Unit 21)

(Structural Unit 2_2)

(Structural Unit 2_3)

(Structural Unit 2_4)

(Structural Unit 2 8)

(Structural Unit 2 9)

(Structural Unit 3 0)

(Structural Unit 3_1)

(Structural Unit 3_2)

(Structural Unit 3_3)

(Structural Unit 3_4)

(Structural Unit 3_5)

(Structural Unit 3_6)

(Structural Unit 4_0)

(Structural Unit 4_1)

(Structural Unit 4_2)

(Structural Unit 4 3)

(Structural Unit 4 4)

(Structural Unit 4 5)

(Structural Unit 4 6)

(Structural Unit 4 7)

(Structural Unit 4 8)

(Structural Unit 4 9)

(Structural Unit 5 0)

(Structural Unit 5 1)

(Structural Unit 5_5)

(Structural Unit 5_6)

(Structural Unit 5_7)

Fig. 21
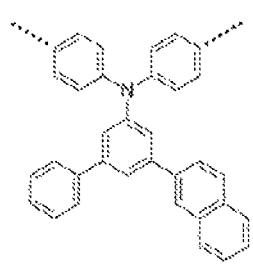
(Structural Unit 6_1)
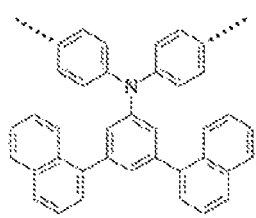
(Structural Unit 6_2)
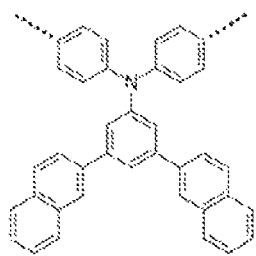
(Structural Unit 6_3)

(Structural Unit 6_4)

(Structural Unit 6_5)

(Structural Unit 6_6)

(Structural Unit 6 7)

(Structural Unit 6 8)

(Structural Unit 6 9)

Fig. 24
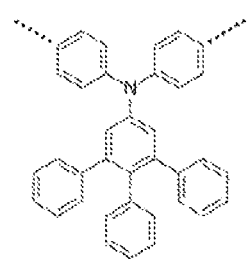
(Structural Unit 70)
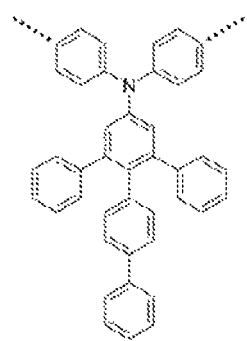
(Structural Unit 71)
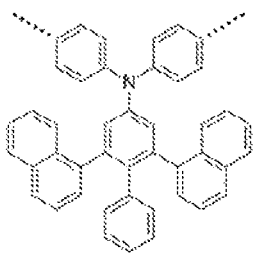
(Structural Unit 72)

Fig.25
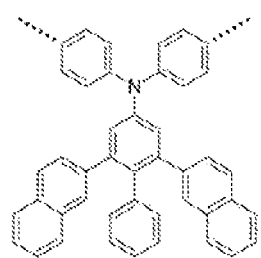
(Structural Unit 7_3)
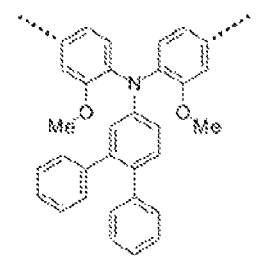
(Structural Unit 7_4)
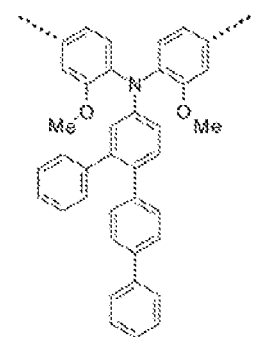
(Structural Unit 7_5)

Fig.27
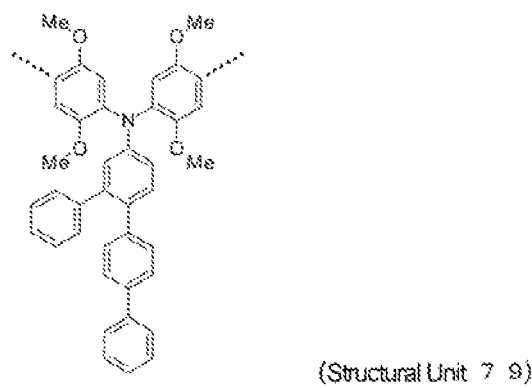
(Structural Unit 7 9)
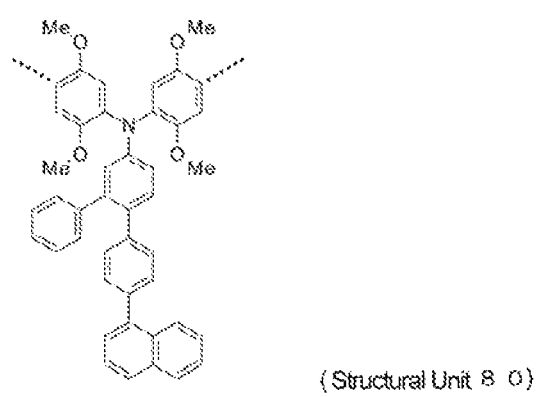
(Structural Unit 8 0)
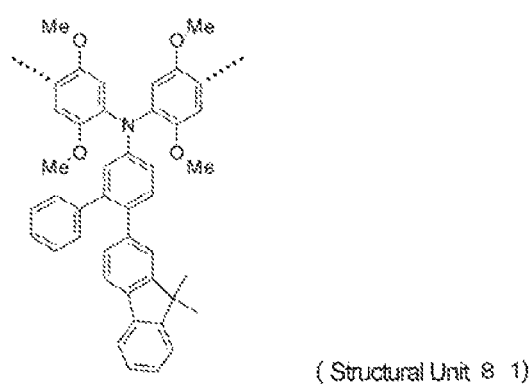
(Structural Unit 8 1)

(Structural Unit 8_2)

(Structural Unit 8_3)

(Structural Unit 8_4)

(Structural Unit 8 5)

(Structural Unit 8 6)

(Structural Unit 8 7)

(Structural Unit 8 8)

(Structural Unit 8 9)

(Structural Unit 9 0)

(Structural Unit 9 1)

(Structural Unit 9 2)

(Structural Unit 9 3)

(Structural Unit 94)

(Structural Unit 95)

(Structural Unit 96)

(Structural Unit 9 7)

(Structural Unit 9 8)

(Structural Unit 9 9)

(Structural Unit 1 0 0)

(Structural Unit 1 0 1)

(Structural Unit 1 0 2)

(Structural Unit 103)

(Structural Unit 104)

(Structural Unit 105)

(Structural Unit 106)

(Structural Unit 107)

(Structural Unit 108)

(Structural Unit 109)

(Structural Unit 110)

(Structural Unit 111)

(Structural Unit 1 1 2)

(Structural Unit 1 1 3)

(Structural Unit 1 1 4)

(Structural Unit 1-1-5)

(Structural Unit 1-1-6)

(Structural Unit 1-1-7)

(Structural Unit 118)

(Structural Unit 119)

(Structural Unit 120)

(Structural Unit 1 2 1)

(Structural Unit 1 2 2)

(Structural Unit 1 2 3)

(Structural Unit 1 2 4)

(Structural Unit 1 2 5)

(Structural Unit 1 2 6)

(Structural Unit 1 2 7)

(Structural Unit 1 2 8)

(Structural Unit 1 2 9)

(Structural Unit 130)

(Structural Unit 131)

(Structural Unit 132)

(Structural Unit 1 3 3)

(Structural Unit 1 3 4)

(Structural Unit 1 3 5)

Fig.58
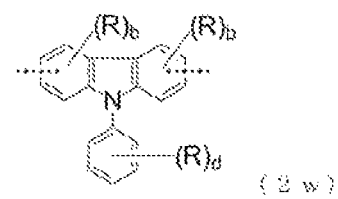
(2 w)
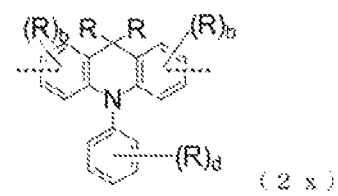
(2 x)

HIGH-MOLECULAR-WEIGHT COMPOUND HAVING SUBSTITUTED TRIARYLAMINE SKELETON

TECHNICAL FIELD

The present invention relates to a high molecular weight compound that is suitable for use in an organic electroluminescent element (organic EL element) that is a self-emissive element that is preferably used in various types of display apparatuses, and the organic electroluminescent element.

BACKGROUND ART

Active studies have been carried out on organic EL elements that are self-emissive elements and thus are brighter than liquid crystal elements, have excellent display viewability, and can provide a clear display.

An organic EL element has a configuration in which a thin film (organic layer) made of an organic compound is interposed between an anode and a cathode. The method for forming the thin film can be roughly classified into a vacuum deposition method and a coating method. The vacuum deposition method is a method in which a thin film is formed on a substrate in vacuum using mainly a low molecular weight material, and is a technique that is already in practical use. On the other hand, the coating method is a method in which a thin film is formed on a substrate through inkjet printing or printing using a solution composed mainly of a high molecular weight material. This method is a technique that is essential for future large area organic EL displays because it has high material usage efficiency and is suitable for larger area and higher resolution displays.

The vacuum deposition method in which a low molecular weight material is used has very low material usage efficiency. Accordingly, if the vacuum deposition method is used to produce a large display, there may be significant warping of a shadow mask, which makes it difficult to deposit a uniform thin film on a large substrate. There is also the issue of the production cost being high.

On the other hand, with a polymer material, a uniform film can be formed even on a large substrate by applying a solution prepared by dissolving the polymer material in an organic solvent. Thus, a coating method as typified by an inkjet printing method or a printing method can be used. Accordingly, the material usage efficiency can be increased, and thus the cost of producing elements can be reduced significantly.

Various studies have been conducted on organic EL elements in which a polymer material is used. However, there is still a problem in that the element characteristics such as light emission efficiency and lifespan are not necessarily sufficient (see, for example, Patent Literatures 1 to 5).

Also, a fluorene polymer called TFB is known as a typical hole transport material that has been used in polymer organic EL elements (see Patent Literatures 6 and 7). However, TFB has insufficient hole transportability and insufficient electron blockability. Accordingly, there is a problem in that some electrons pass through a light emitting layer, and thus an improvement in light emission efficiency cannot be expected. There is also another problem in that TFB has low film adhesion to adjacent layers, and thus an increase in the lifespan of elements cannot be expected.

CITATION LIST

Patent Literature

Patent Literature 1: JP 2005-272834A
Patent Literature 2: JP 2007-119763A
Patent Literature 3: JP 2007-162009A
Patent Literature 4: JP 2007-177225A
Patent Literature 5: WO 2005/049546
Patent Literature 6: Japanese Patent No. 4375820
Patent Literature 7: WO 2005/059951

SUMMARY OF INVENTION

Problems to be Solved by the Invention

It is an object according to the present invention to provide a polymer material that has excellent hole injection and transport performance, is capable of blocking electrons, and is highly stable as a thin film.

It is another object according to the present invention to provide an organic EL element that includes an organic layer (thin film) made of the above-described polymer material, wherein the organic EL element has high light emission efficiency and a long lifespan.

Means for Solving the Problems

The inventors according to the present invention noticed that a substituted triarylamine structure has high hole injection/transport capability, and conducted studies by synthesizing high molecular weight compounds having various types of substituted triarylamine structures. As a result, they found a high molecular weight compound with a novel structure that has, in addition to the hole injection/transport capability, heat resistance and thin film stability. The present invention has thereby been accomplished.

The present invention provides a high molecular weight compound including a substituted triarylamine structural unit represented by a general formula (1) below,

[Chem. 1]

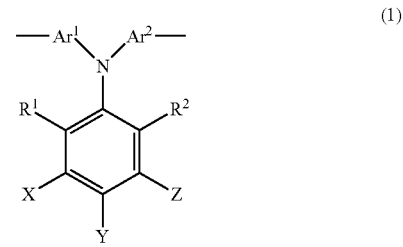

where $Ar^1$ and $Ar^2$ are each a divalent aromatic hydrocarbon group or a divalent aromatic heterocyclic group, $R^1$ and $R^2$ each represent a hydrogen atom, a heavy hydrogen atom, a fluorine atom, a chlorine atom, a cyano group, a nitro group, an alkyl group with 1 to 8 carbon atoms, a cycloalkyl group with 5 to 10 carbon atoms, an alkenyl group with 2 to 6 carbon atoms, an alkyloxy group with 1 to 6 carbon atoms, or a cycloalkyloxy group with 5 to 10 carbon atoms, and X, Y and Z are, on the condition that at least one of them is an aryl group or a heteroaryl group, an aryl group, a heteroaryl group, or a group similar to the groups represented by $R^1$ and $R^2$ above.

In the high molecular weight compound according to the present invention, it is preferable that:

(1) the high molecular weight compound is a polymer including the structural unit above-mentioned as a repeating unit, and has a weight average molecular weight of 10,000 or more and less than 1,000,000 on a polystyrene conversion basis;

(2) in the general formula (1) above, X and Y are an aryl group or a heteroaryl group, these groups desirably have no substituent group, and these groups are more desirably a phenyl group, a biphenylyl group, a terphenyl group, a naphthyl group, a phenanthrenyl group, a fluorenyl group, a naphthyl phenyl group, or a triphenylenyl group;

(3) in the general formula (1) above, $R^1$, $R^2$ and Z are a hydrogen atom or a heavy hydrogen atom;

(4) in the general formula (1) above, X and Z are an aryl group or a heteroaryl group, these groups desirably have no substituent group, and these groups are more desirably a phenyl group, a biphenylyl group, a terphenyl group, a naphthyl group, a phenanthrenyl group, a fluorenyl group, a naphthyl phenyl group, or a triphenylenyl group;

(5) in the general formula (1) above, $R^1$, $R^2$ and Y are a hydrogen atom or a heavy hydrogen atom;

(6) in the general formula (1) above, all of X, Y and Z are an aryl group or a heteroaryl group, these groups desirably have no substituent group, and these groups are more desirably a phenyl group, a biphenylyl group, a terphenyl group, a naphthyl group, a phenanthrenyl group, a fluorenyl group, a naphthyl phenyl group, or a triphenylenyl group;

(7) in the general formula (1) above, $R^1$ and $R^2$ are a hydrogen atom or a heavy hydrogen atom; and (8) the high molecular weight compound includes a structural unit that has a group having at least one aromatic hydrocarbon ring, or a structural unit that has a triarylamine skeleton, in addition to the unit represented by the general formula (1) above.

The present invention further provides an organic EL element including: a pair of electrodes; and at least one organic layer interposed between the pair of electrodes, wherein the organic layer contains the above-described high molecular weight compound.

In the organic EL element according to the present invention, it is preferable that the organic layer is a hole transport layer, an electron blocking layer, a hole injection layer, or a light emitting layer.

Advantageous Effects of Invention

The high molecular weight compound according to the present invention that includes a substituted triarylamine structural unit (divalent group) represented by the general formula (1) given above is, for example, a polymer that includes the structural unit as a repeating unit, and preferably has a weight average molecular weight on a polystyrene conversion basis measured using GPC (gel permeation chromatography) of 10,000 or more and less than 1,000,000.

The high molecular weight compound has the following characteristics:

(1) good hole injectionability;
(2) high hole mobility;
(3) excellent electron blocking capability;
(4) good thin film stability; and
(5) excellent heat resistance.

An organic EL element in which an organic layer made of the high molecular weight compound described above such as, for example, a hole transport layer, an electron blocking layer, a hole injection layer, or a light emitting layer is formed between a pair of electrodes has the following advantages:

(1) high light emission efficiency and high power efficiency;
(2) a low actual driving voltage; and
(3) a long lifespan.

BRIEF DESCRIPTION OF DRAWINGS

FIG. 10 The diagram showing the chemical structures of structural units 28 to 30 preferably used as the substituted triarylamine structural unit included in the high molecular weight compound according to the present invention.

FIG. 20 The diagram showing the chemical structures of structural units 58 to 60 preferably used as the substituted triarylamine structural unit included in the high molecular weight compound according to the present invention.

FIG. 21 The diagram showing the chemical structures of structural units 61 to 63 preferably used as the substituted triarylamine structural unit included in the high molecular weight compound according to the present invention.

FIG. 24 The diagram showing the chemical structures of structural units 70 to 72 preferably used as the substituted triarylamine structural unit included in the high molecular weight compound according to the present invention.

FIG. 25 The diagram showing the chemical structures of structural units 73 to 75 preferably used as the substituted triarylamine structural unit included in the high molecular weight compound according to the present invention.

FIG. 27 The diagram showing the chemical structures of structural units 79 to 81 preferably used as the substituted triarylamine structural unit included in the high molecular weight compound according to the present invention.

FIG. 50 The diagram showing the chemical structures of structural units (2w) to (2x) introduced to improve the solubility in an organic solvent.

DESCRIPTION OF EMBODIMENTS

<Substituted Triarylamine Structural Unit>

Figure 1:
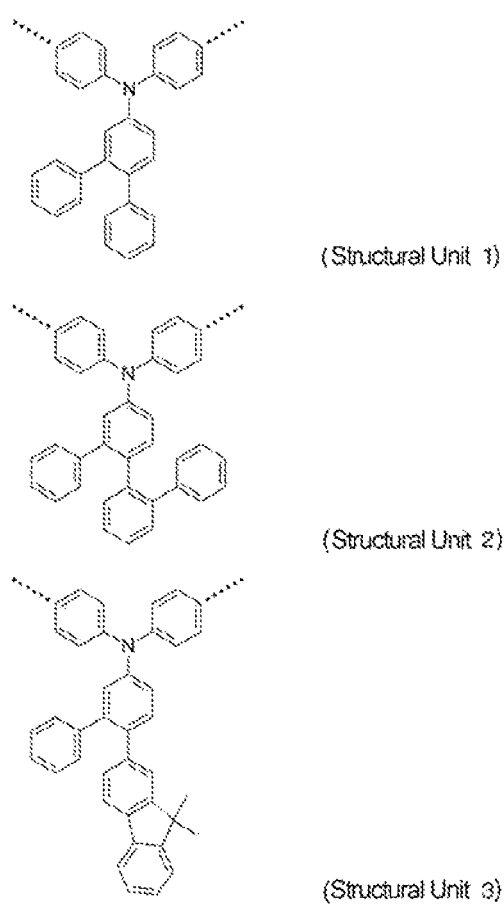
FIG. 1 The diagram showing the chemical structures of structural units 1 to 3 preferably used as a substituted triarylamine structural unit included in the high molecular weight compound according to the present invention.
Figure 2:
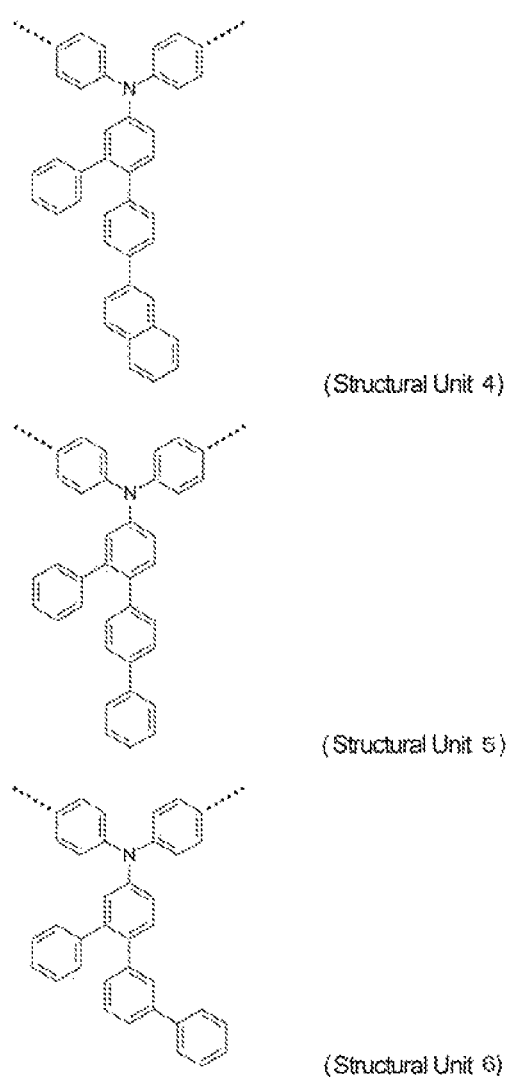
FIG. 2 The diagram showing the chemical structures of structural units 4 to 6 preferably used as the substituted triarylamine structural unit included in the high molecular weight compound according to the present invention.
Figure 3:
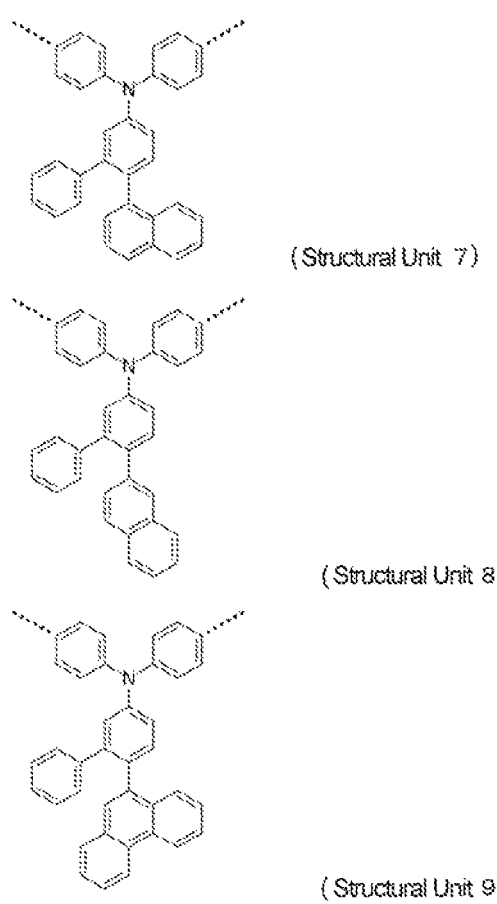
FIG. 3 The diagram showing the chemical structures of structural units 7 to 9 preferably used as the substituted triarylamine structural unit included in the high molecular weight compound according to the present invention.
Figure 4:
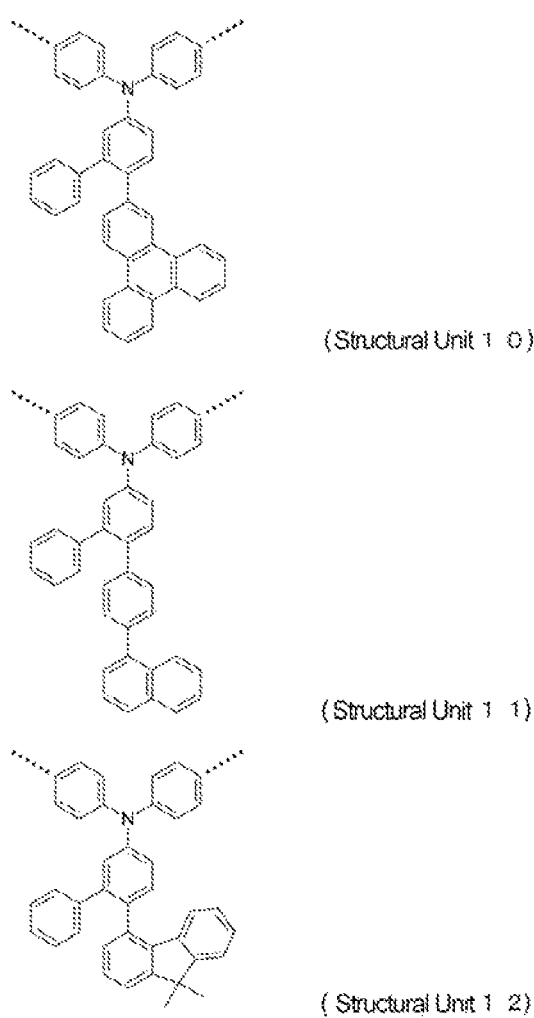
FIG. 4 The diagram showing the chemical structures of structural units 10 to 12 preferably used as the substituted triarylamine structural unit included in the high molecular weight compound according to the present invention.
Figure 5:
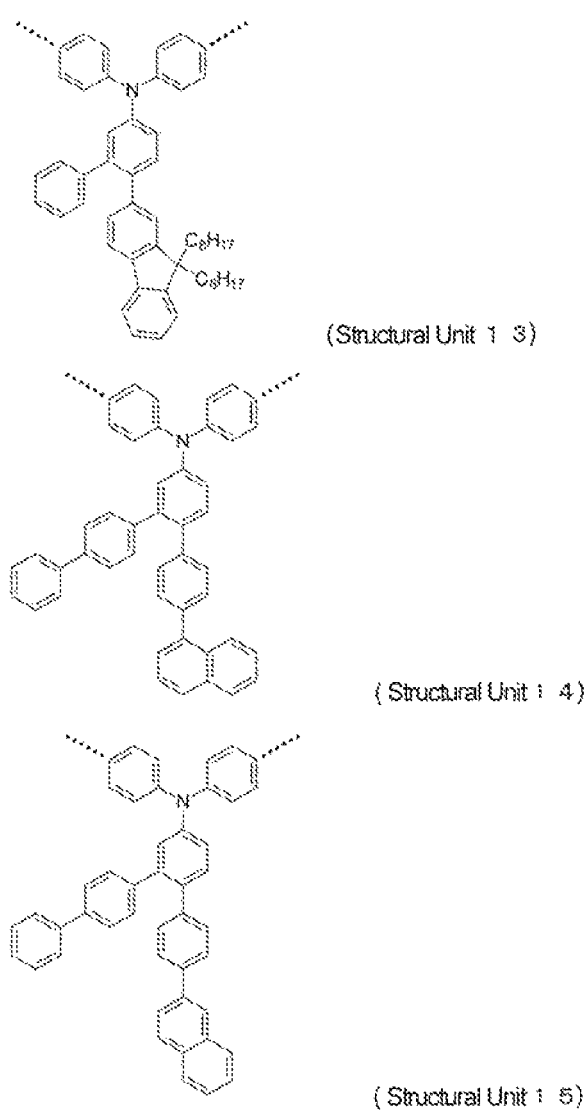
FIG. 5 The diagram showing the chemical structures of structural units 13 to 15 preferably used as the substituted triarylamine structural unit included in the high molecular weight compound according to the present invention.
Figure 6:
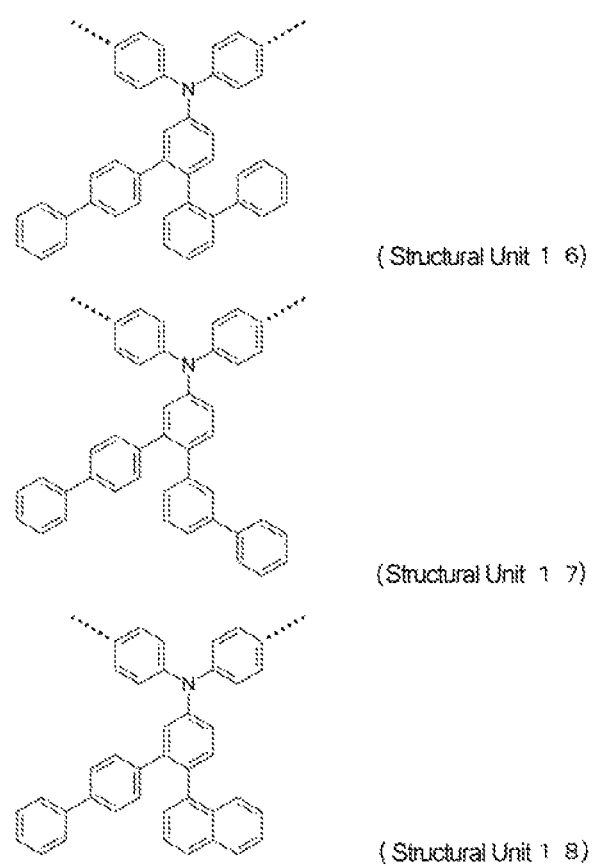
FIG. 6 The diagram showing the chemical structures of structural units 16 to 18 preferably used as the substituted triarylamine structural unit included in the high molecular weight compound according to the present invention.
Figure 7:
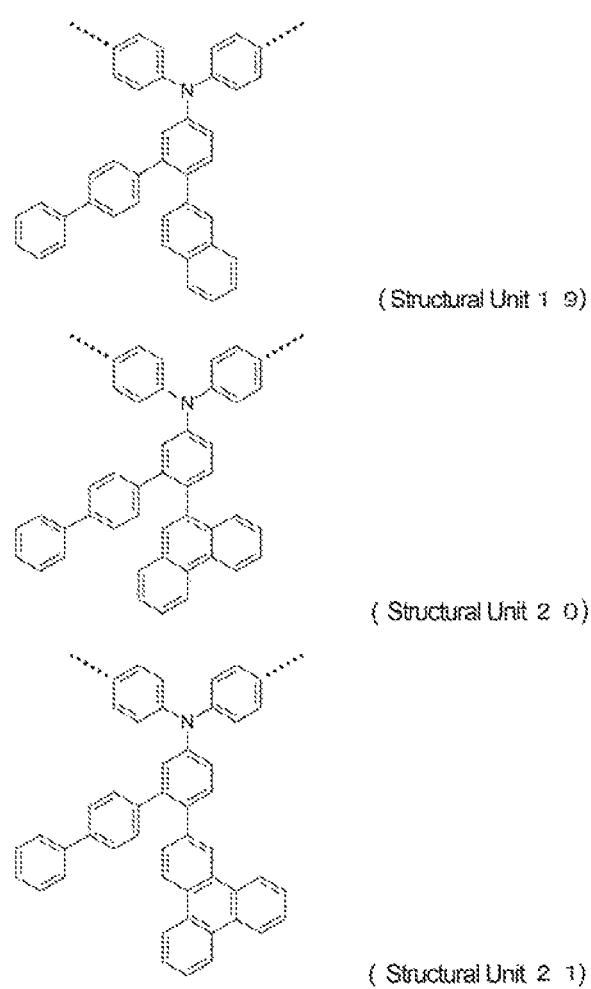
FIG. 7 The diagram showing the chemical structures of structural units 19 to 21 preferably used as the substituted triarylamine structural unit included in the high molecular weight compound according to the present invention.
Figure 8:
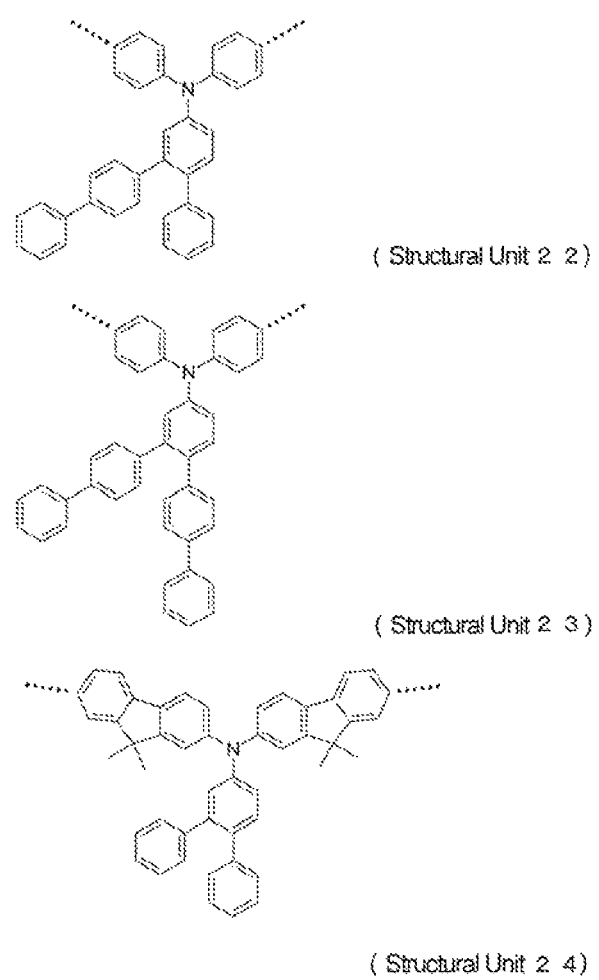
FIG. 8 The diagram showing the chemical structures of structural units 22 to 24 preferably used as the substituted triarylamine structural unit included in the high molecular weight compound according to the present invention.
Figure 9:
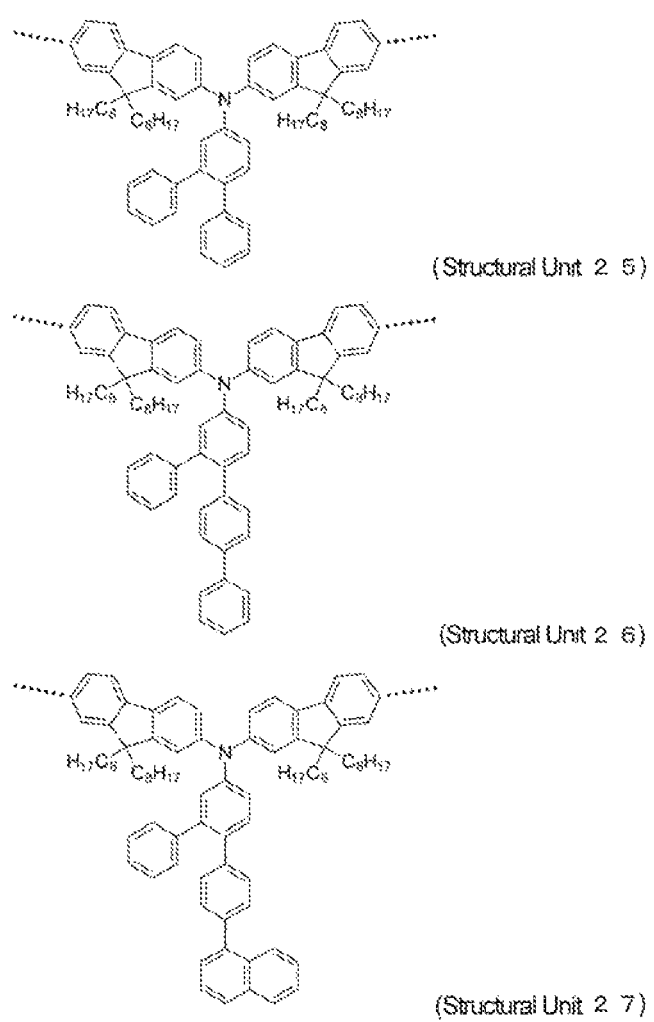
FIG. 9 The diagram showing the chemical structures of structural units 25 to 27 preferably used as the substituted triarylamine structural unit included in the high molecular weight compound according to the present invention.
Figure 18:
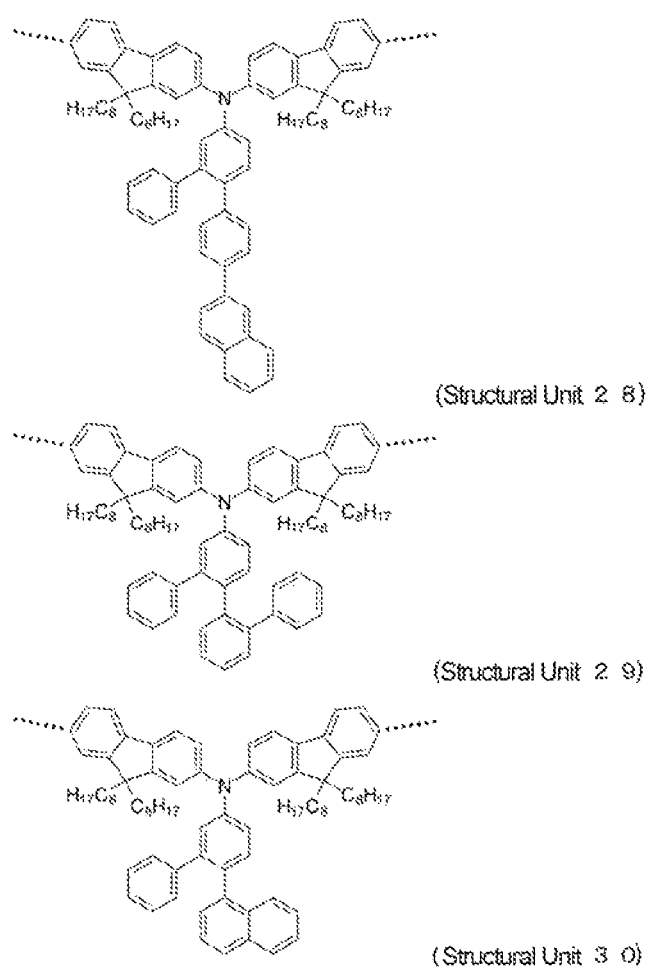
FIG. 18 The diagram showing the chemical structures of structural units 52 to 54 preferably used as the substituted triarylamine structural unit included in the high molecular weight compound according to the present invention.
Figure 11:
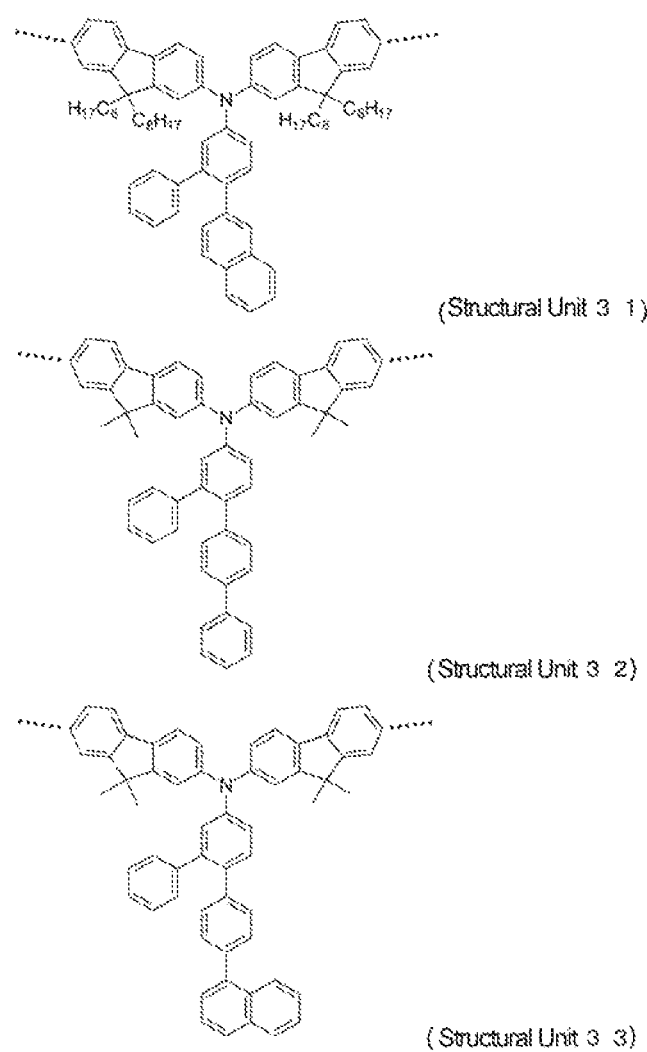
FIG. 11 The diagram showing the chemical structures of structural units 31 to 33 preferably used as the substituted triarylamine structural unit included in the high molecular weight compound according to the present invention.
Figure 12:
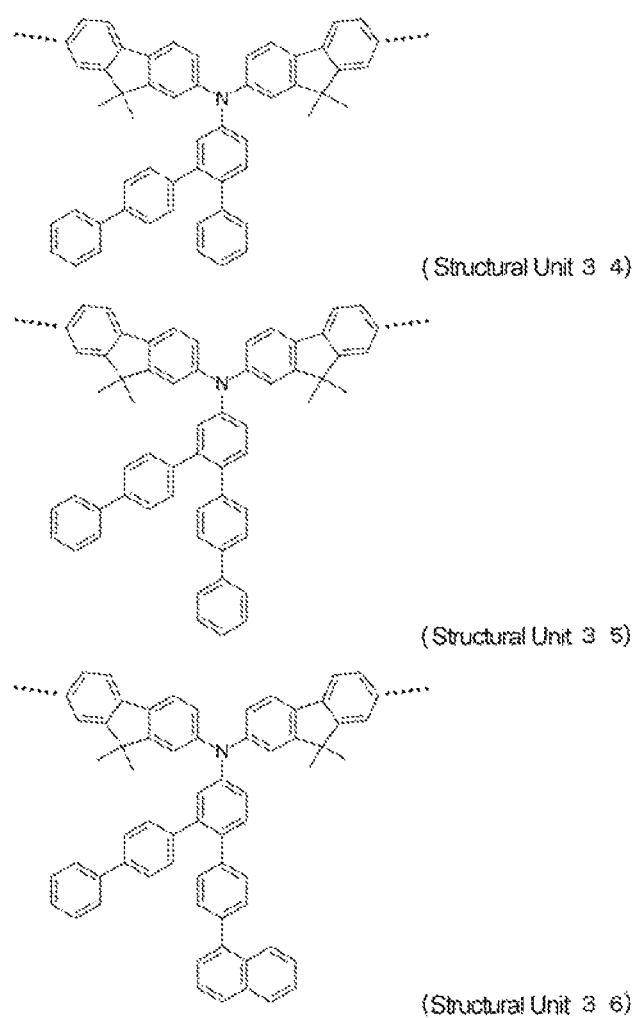
FIG. 12 The diagram showing the chemical structures of structural units 34 to 36 preferably used as the substituted triarylamine structural unit included in the high molecular weight compound according to the present invention.
Figure 13:
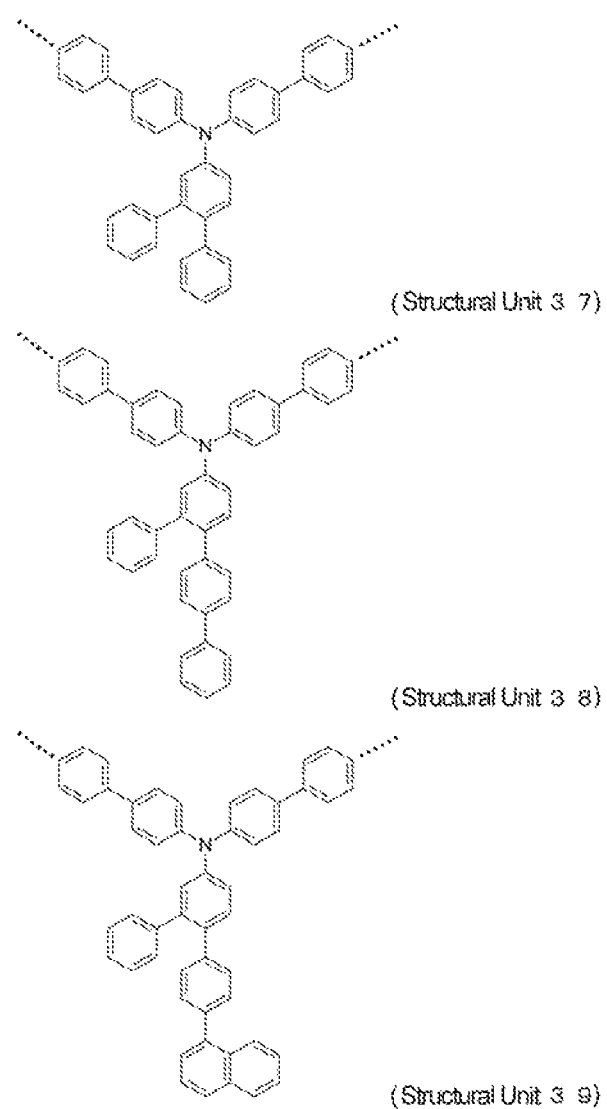
FIG. 13 The diagram showing the chemical structures of structural units 37 to 39 preferably used as the substituted triarylamine structural unit included in the high molecular weight compound according to the present invention.
Figure 14:
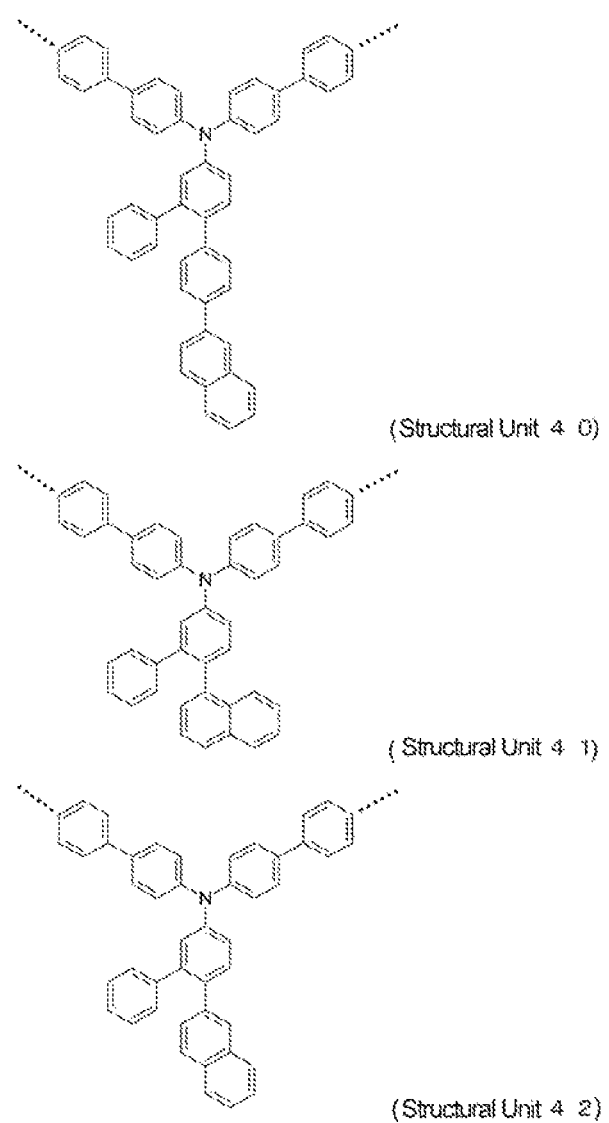
FIG. 14 The diagram showing the chemical structures of structural units 40 to 42 preferably used as the substituted triarylamine structural unit included in the high molecular weight compound according to the present invention.
Figure 15:
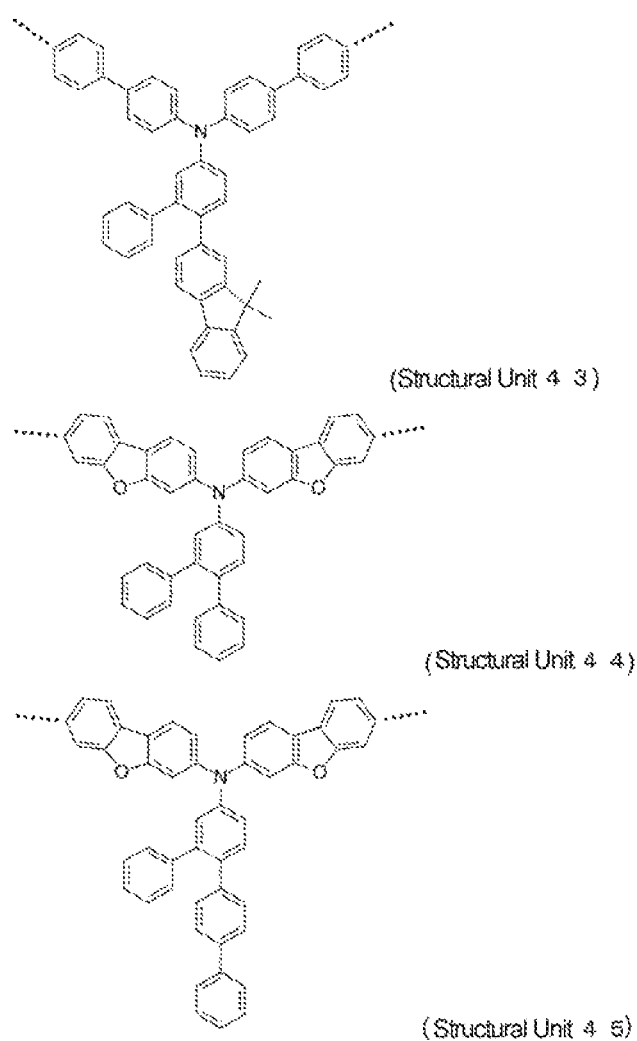
FIG. 15 The diagram showing the chemical structures of structural units 43 to 45 preferably used as the substituted triarylamine structural unit included in the high molecular weight compound according to the present invention.
Figure 16:
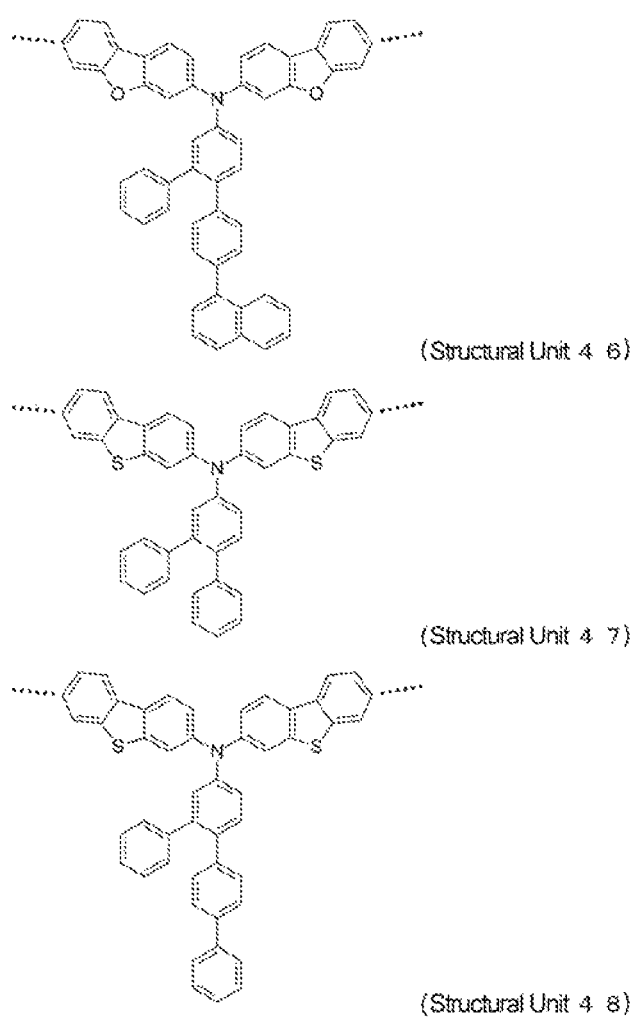
FIG. 16 The diagram showing the chemical structures of structural units 46 to 48 preferably used as the substituted triarylamine structural unit included in the high molecular weight compound according to the present invention.
Figure 17:
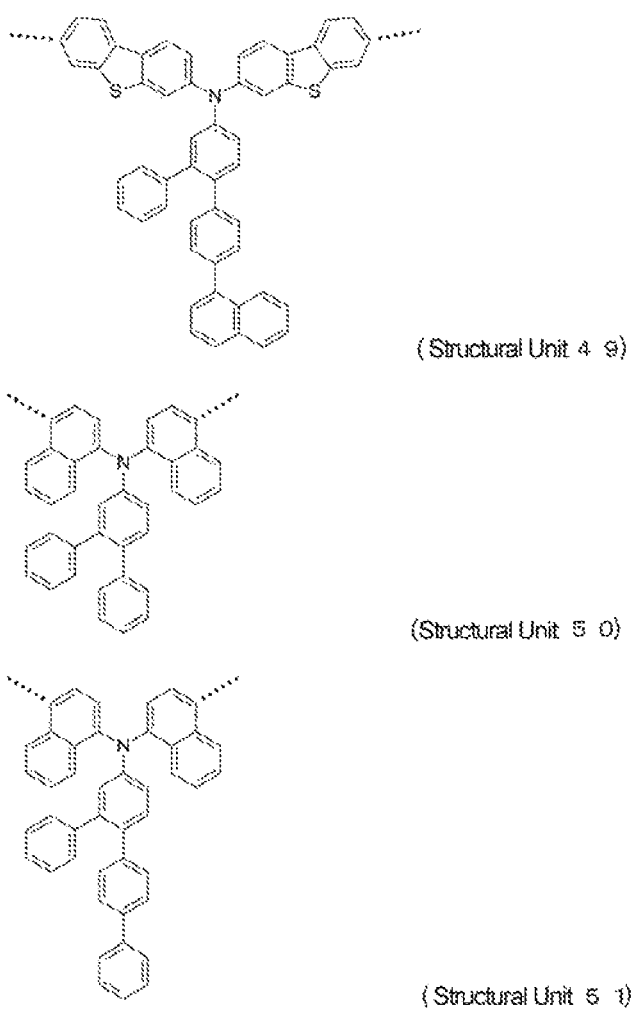
FIG. 17 The diagram showing the chemical structures of structural units 49 to 51 preferably used as the substituted triarylamine structural unit included in the high molecular weight compound according to the present invention.
Figure 18:
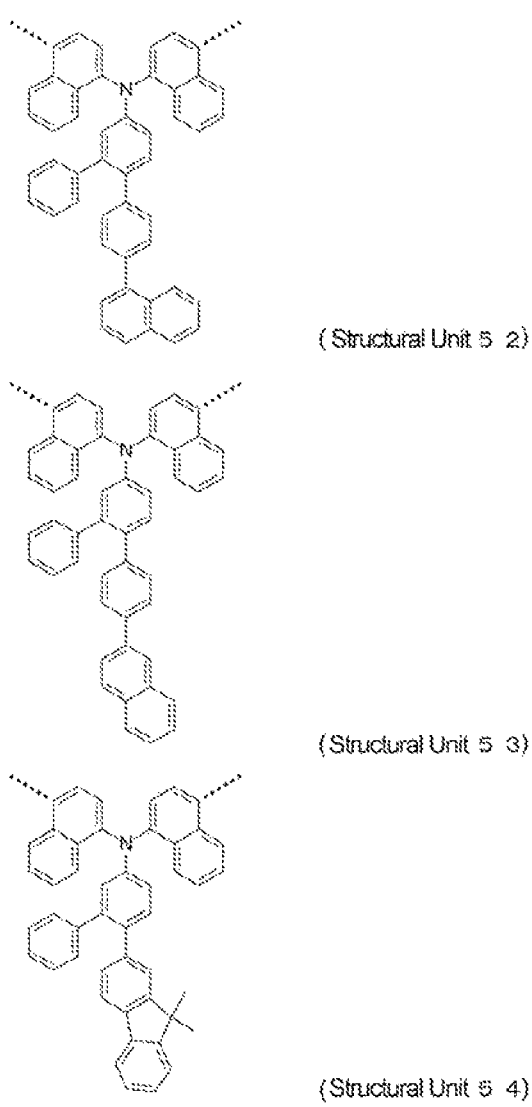
Figure 19:
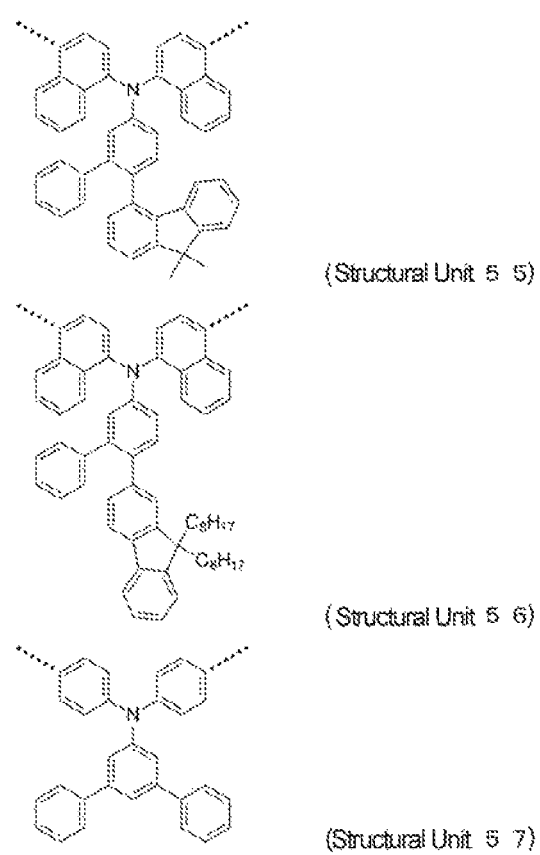
FIG. 19 The diagram showing the chemical structures of structural units 55 to 57 preferably used as the substituted triarylamine structural unit included in the high molecular weight compound according to the present invention.
Figure 29:
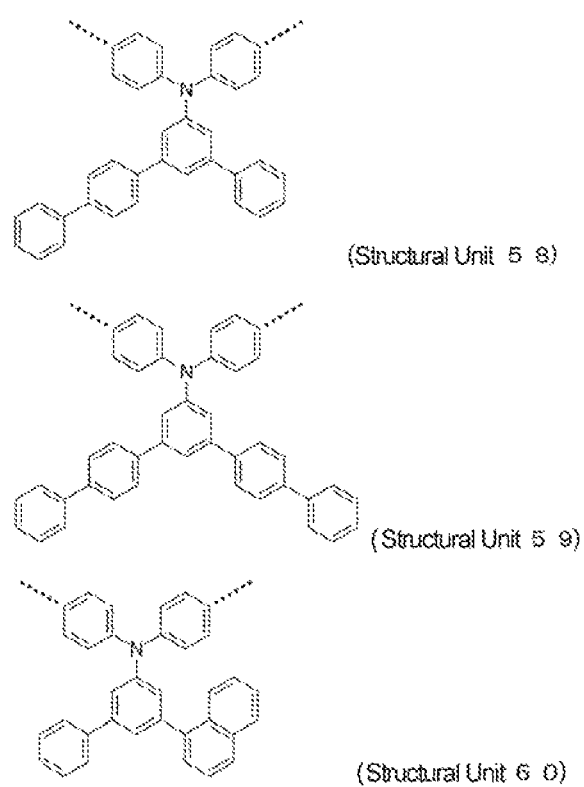
FIG. 29 The diagram showing the chemical structures of structural units 85 to 87 preferably used as the substituted triarylamine structural unit included in the high molecular weight compound according to the present invention.
Figure 22:
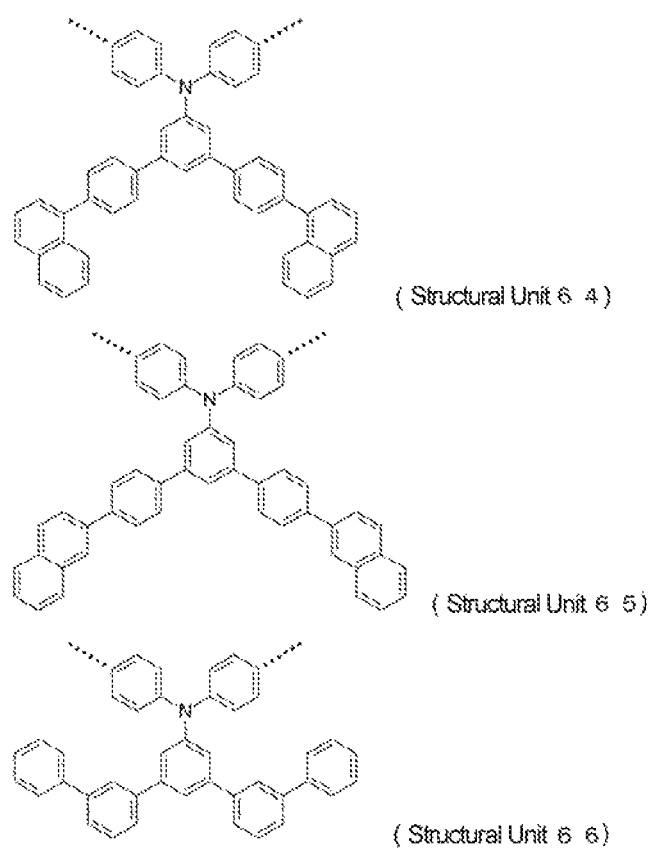
FIG. 22 The diagram showing the chemical structures of structural units 64 to 66 preferably used as the substituted triarylamine structural unit included in the high molecular weight compound according to the present invention.
Figure 23:
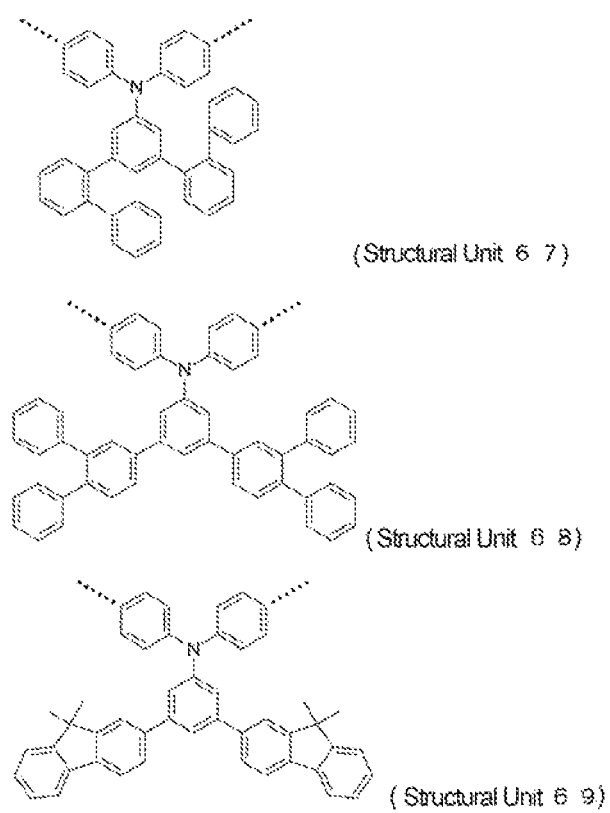
FIG. 23 The diagram showing the chemical structures of structural units 67 to 69 preferably used as the substituted triarylamine structural unit included in the high molecular weight compound according to the present invention.
Figure 26:
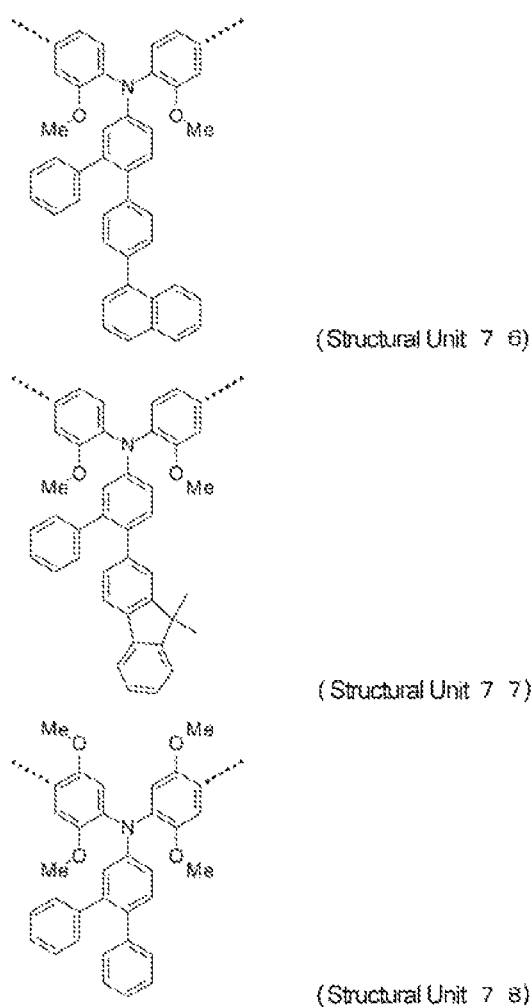
FIG. 26 The diagram showing the chemical structures of structural units 76 to 78 preferably used as the substituted triarylamine structural unit included in the high molecular weight compound according to the present invention.
Figure 28:
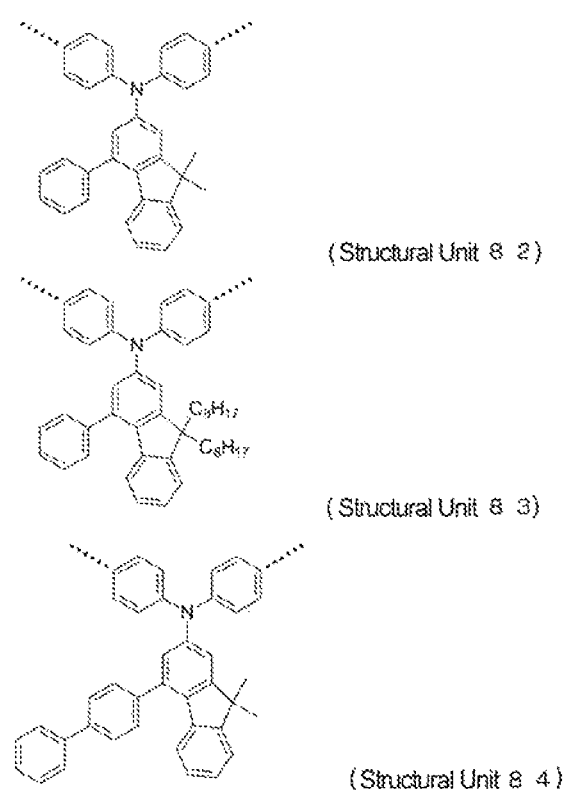
FIG. 28 The diagram showing the chemical structures of structural units 82 to 84 preferably used as the substituted triarylamine structural unit included in the high molecular weight compound according to the present invention.
Figure 29:
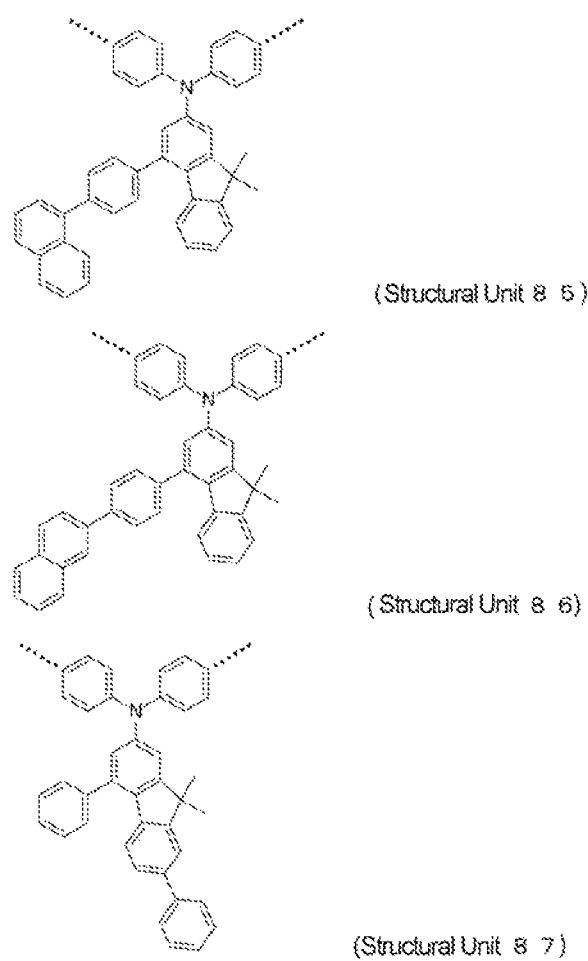
Figure 30:
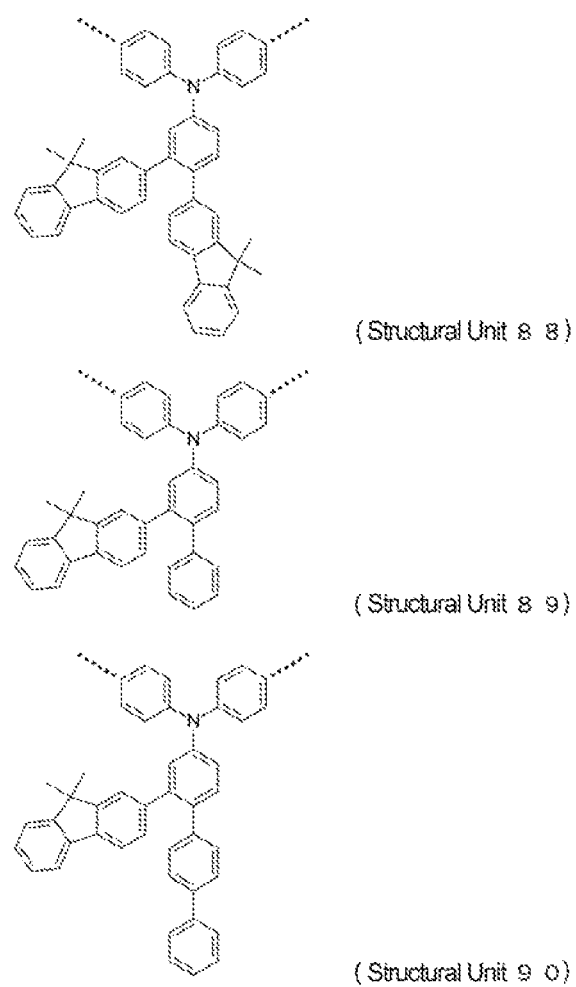
FIG. 30 The diagram showing the chemical structures of structural units 88 to 90 preferably used as the substituted triarylamine structural unit included in the high molecular weight compound according to the present invention.
Figure 31:
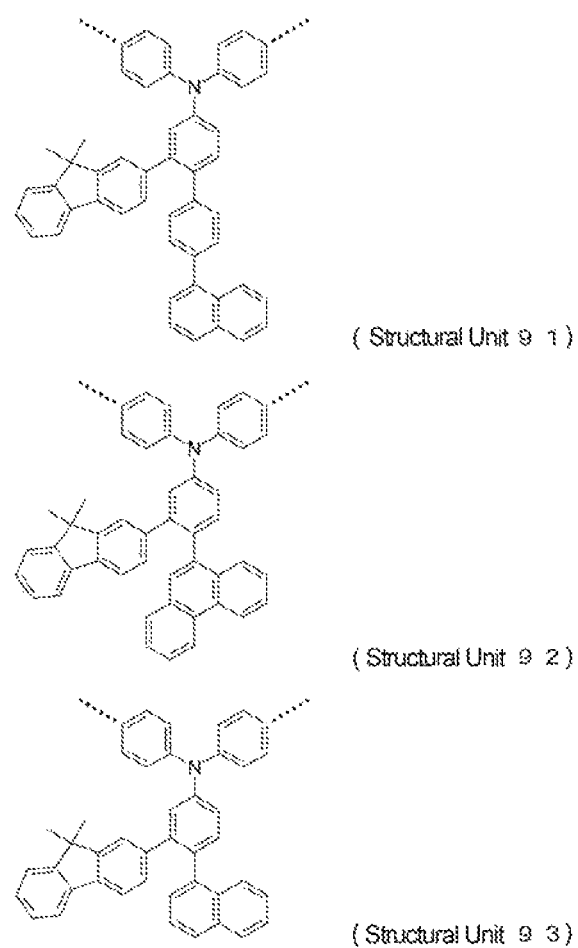
FIG. 31 The diagram showing the chemical structures of structural units 91 to 93 preferably used as the substituted triarylamine structural unit included in the high molecular weight compound according to the present invention.
Figure 32:
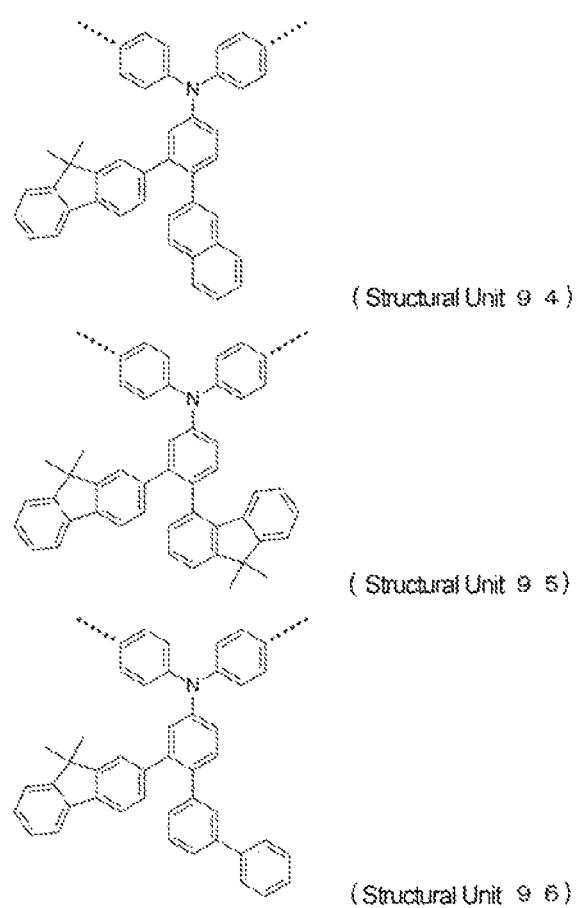
FIG. 32 The diagram showing the chemical structures of structural units 94 to 96 preferably used as the substituted triarylamine structural unit included in the high molecular weight compound according to the present invention.
Figure 33:
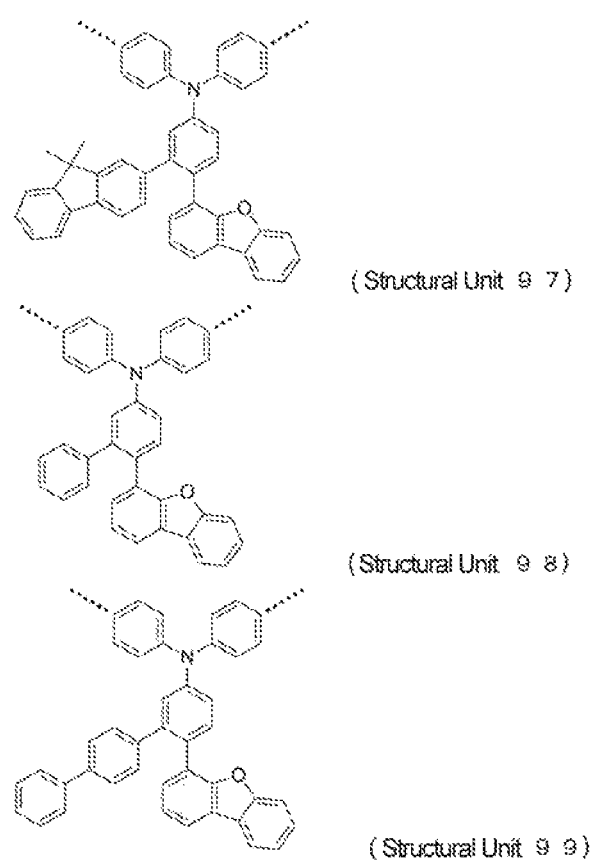
FIG. 33 The diagram showing the chemical structures of structural units 97 to 99 preferably used as the substituted triarylamine structural unit included in the high molecular weight compound according to the present invention.
Figure 34:
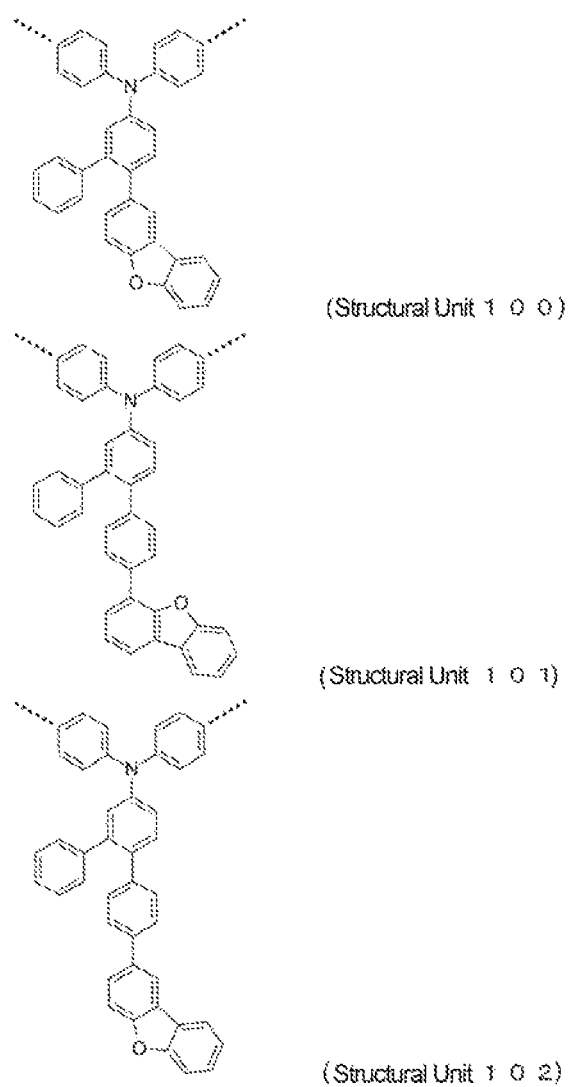
FIG. 34 The diagram showing the chemical structures of structural units 100 to 102 preferably used as the substituted triarylamine structural unit included in the high molecular weight compound according to the present invention.
Figure 35:
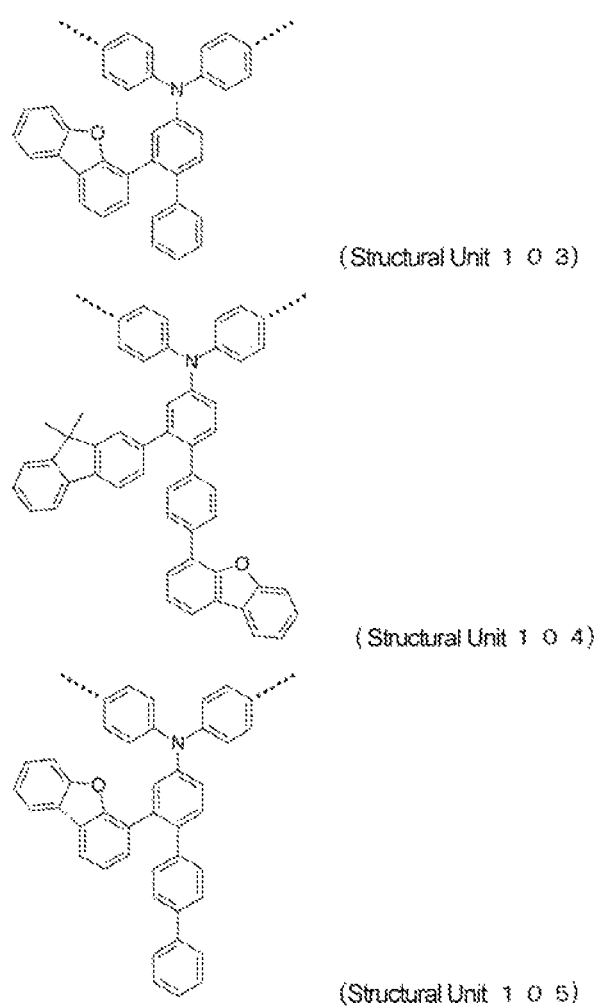
FIG. 35 The diagram showing the chemical structures of structural units 103 to 105 preferably used as the substituted triarylamine structural unit included in the high molecular weight compound according to the present invention.
Figure 36:
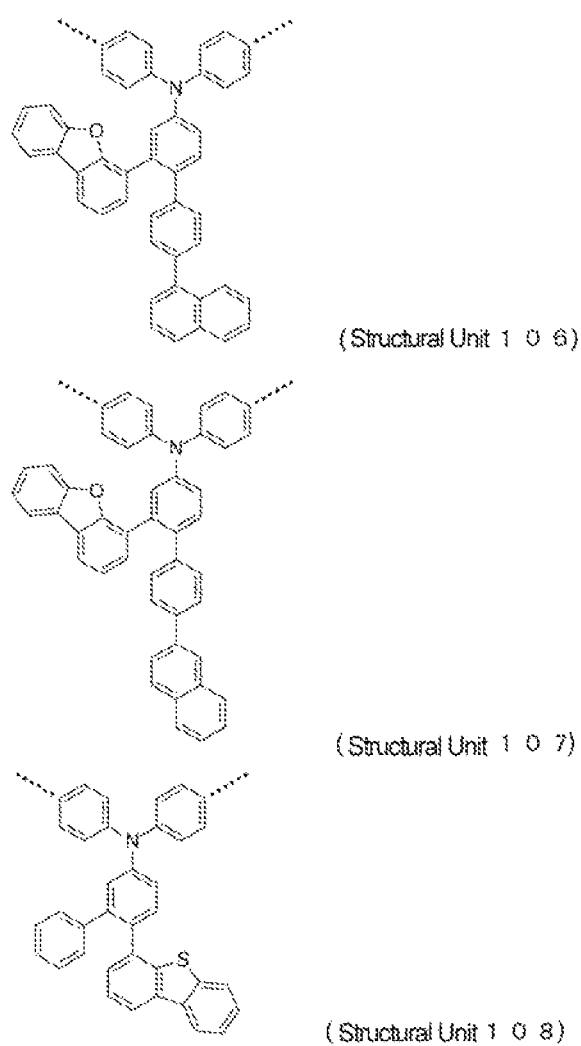
FIG. 36 The diagram showing the chemical structures of structural units 106 to 108 preferably used as the substituted triarylamine structural unit included in the high molecular weight compound according to the present invention.
Figure 37:
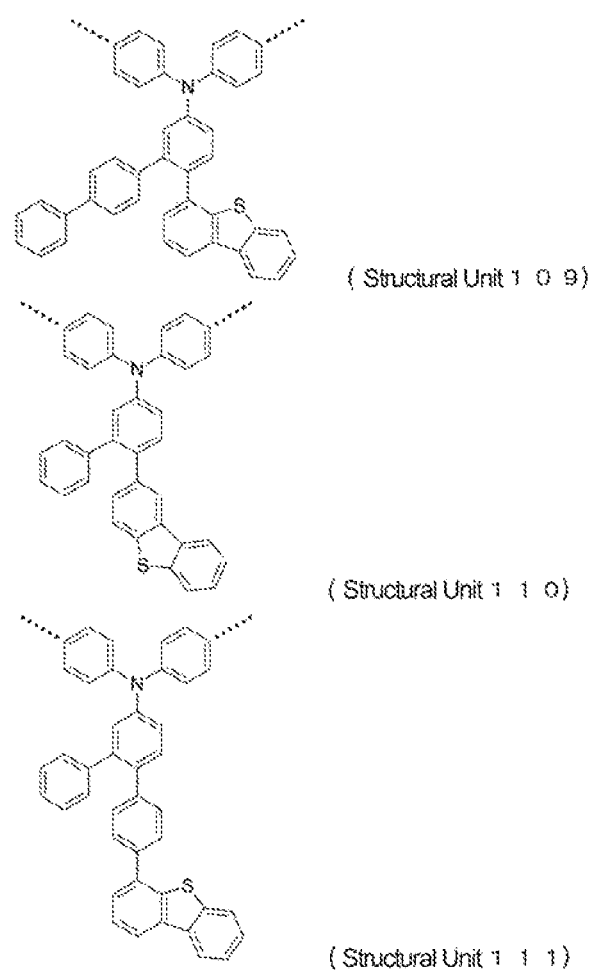
FIG. 37 The diagram showing the chemical structures of structural units 109 to 111 preferably used as the substituted triarylamine structural unit included in the high molecular weight compound according to the present invention.
Figure 38:
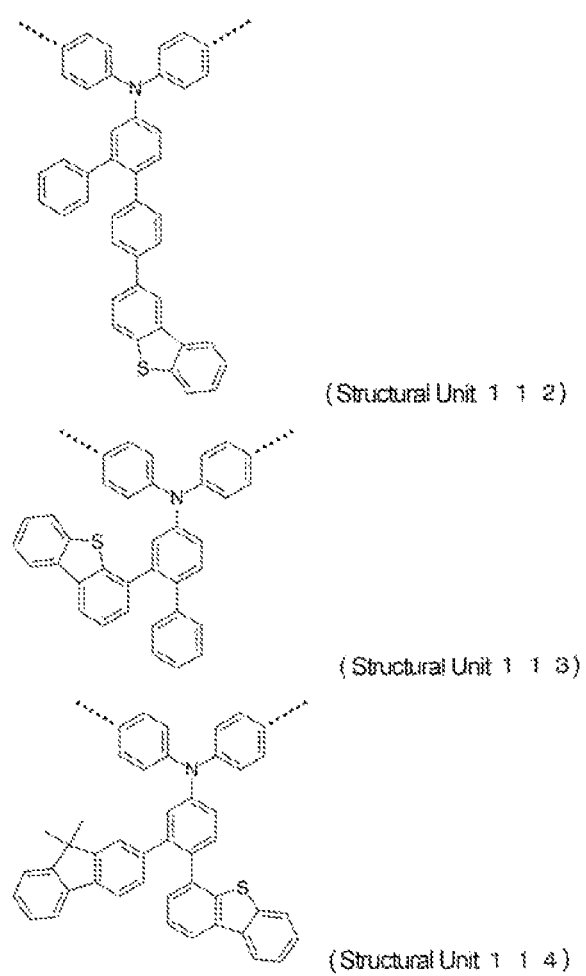
FIG. 38 The diagram showing the chemical structures of structural units 112 to 114 preferably used as the substituted triarylamine structural unit included in the high molecular weight compound according to the present invention.
Figure 39:
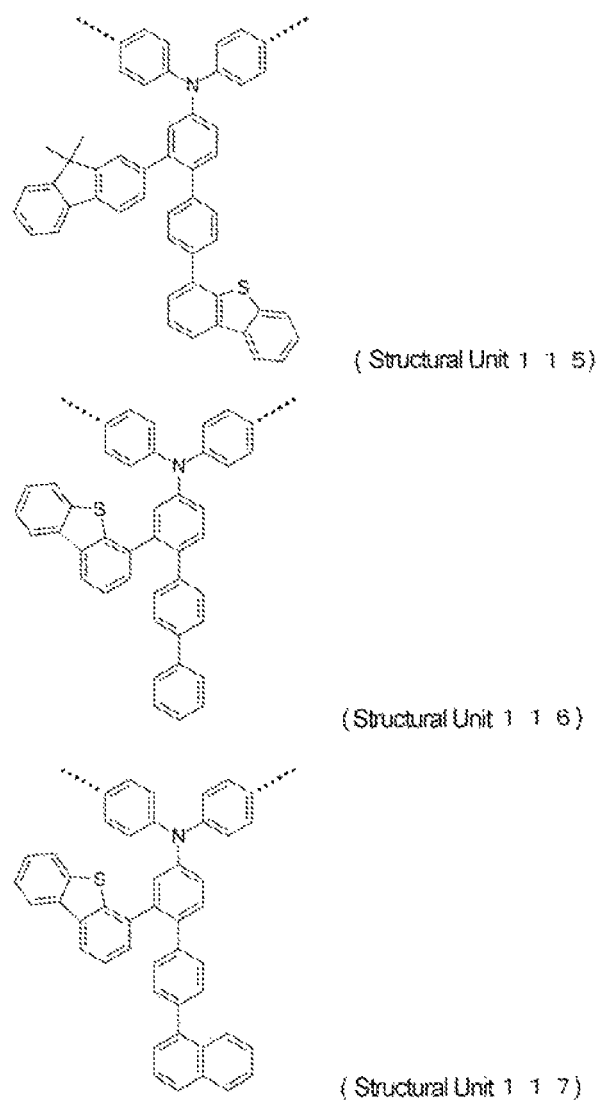
FIG. 39 The diagram showing the chemical structures of structural units 115 to 117 preferably used as the substituted triarylamine structural unit included in the high molecular weight compound according to the present invention.
Figure 40:
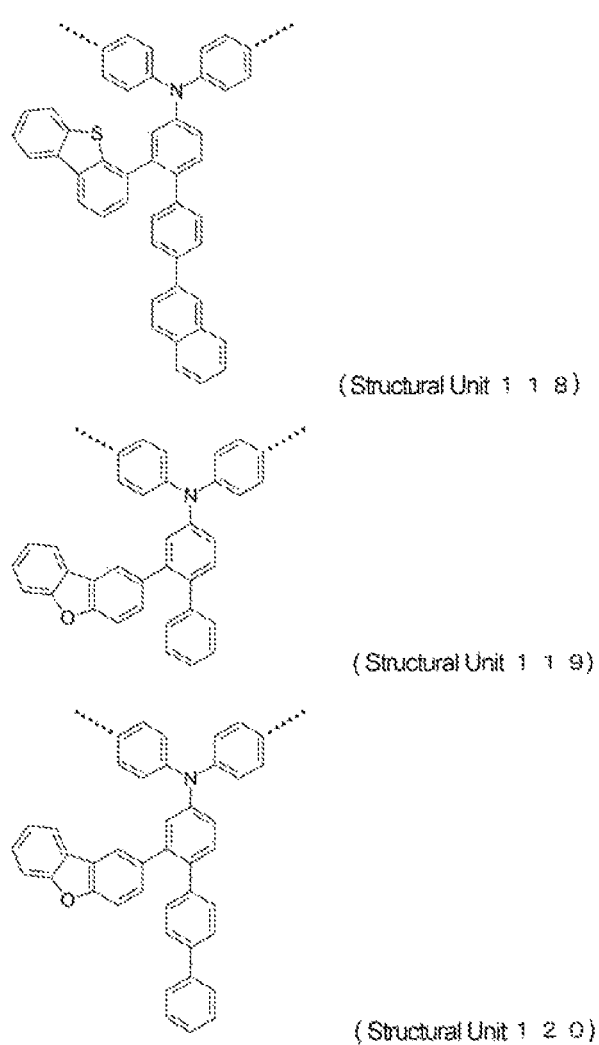
FIG. 40 The diagram showing the chemical structures of structural units 118 to 120 preferably used as the substituted triarylamine structural unit included in the high molecular weight compound according to the present invention.
Figure 41:
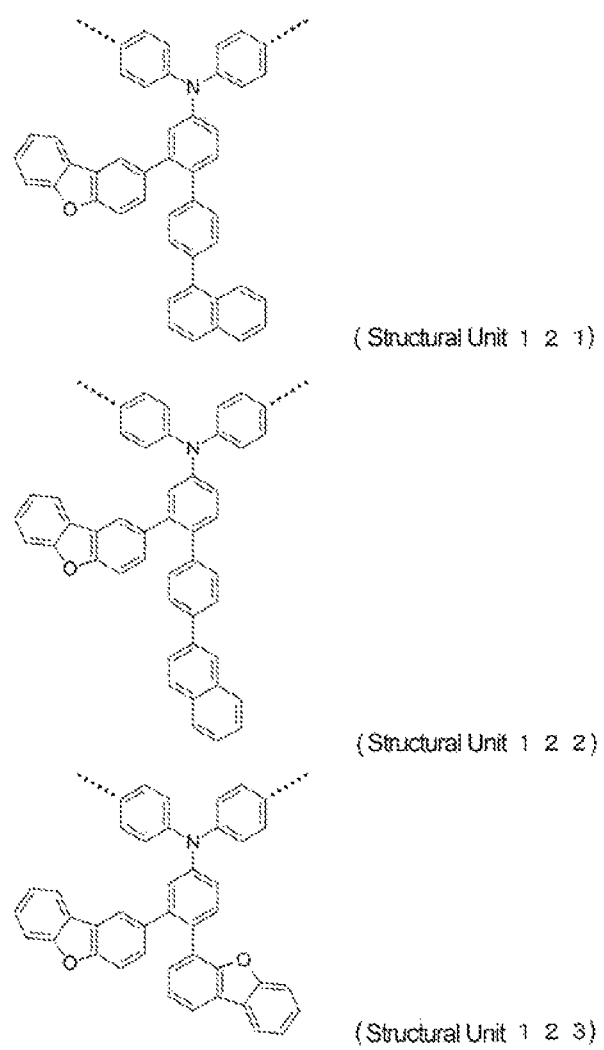
FIG. 41 The diagram showing the chemical structures of structural units 121 to 123 preferably used as the substituted triarylamine structural unit included in the high molecular weight compound according to the present invention.
Figure 42:
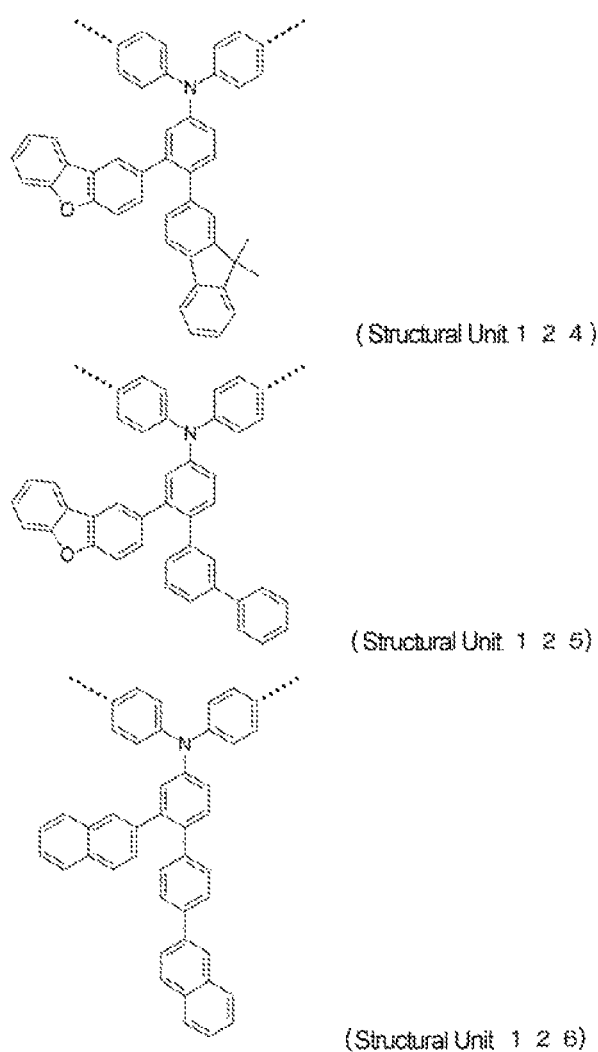
FIG. 42 The diagram showing the chemical structures of structural units 124 to 126 preferably used as the substituted triarylamine structural unit included in the high molecular weight compound according to the present invention.
Figure 43:
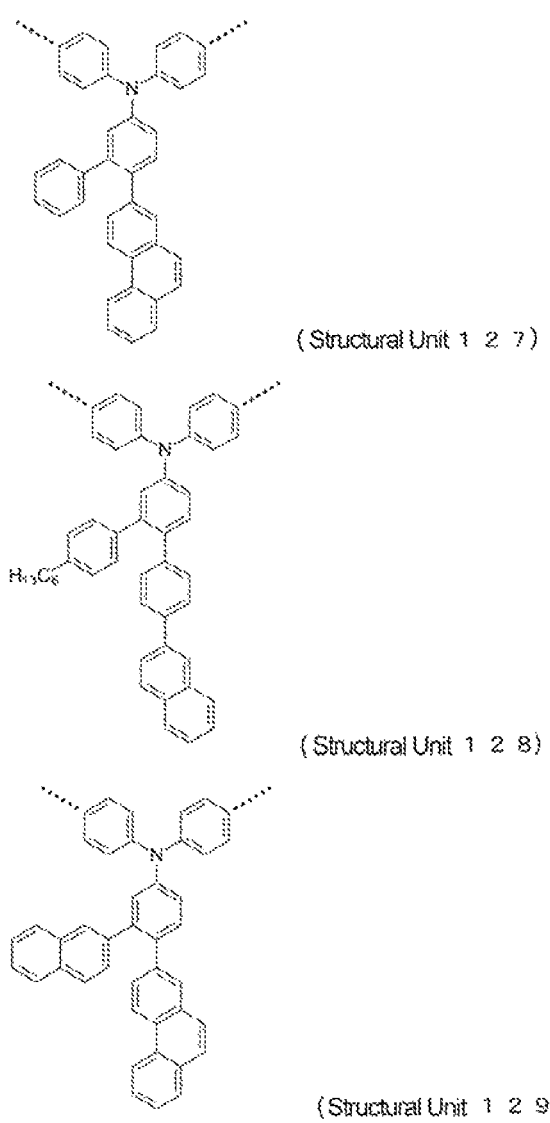
FIG. 43 The diagram showing the chemical structures of structural units 127 to 129 preferably used as the substituted triarylamine structural unit included in the high molecular weight compound according to the present invention.
Figure 44:
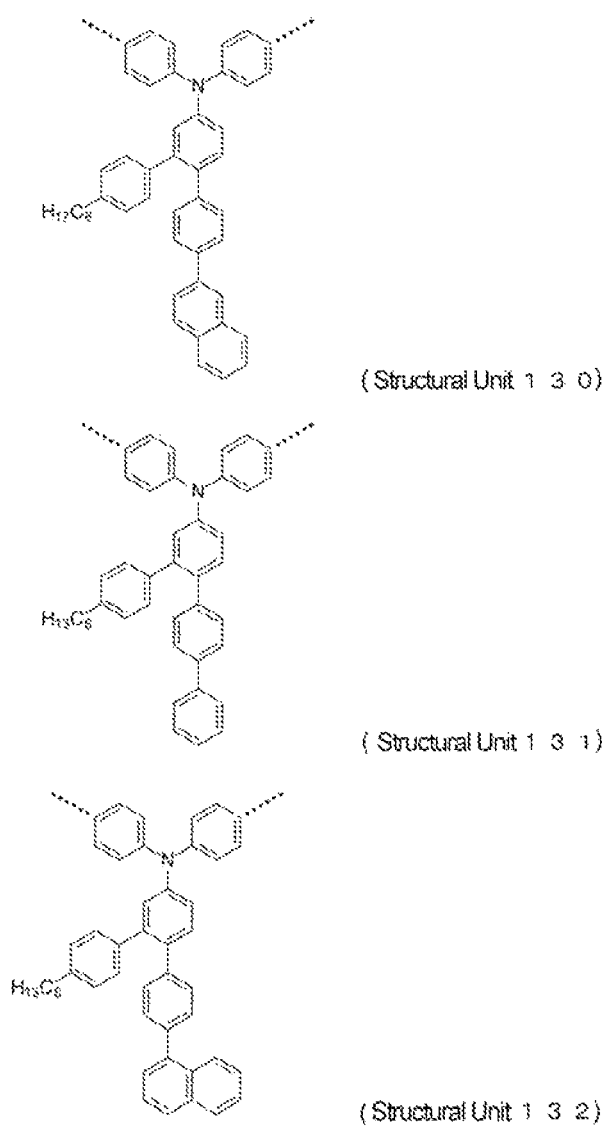
FIG. 44 The diagram showing the chemical structures of structural units 130 to 132 preferably used as the substituted triarylamine structural unit included in the high molecular weight compound according to the present invention.
Figure 45:
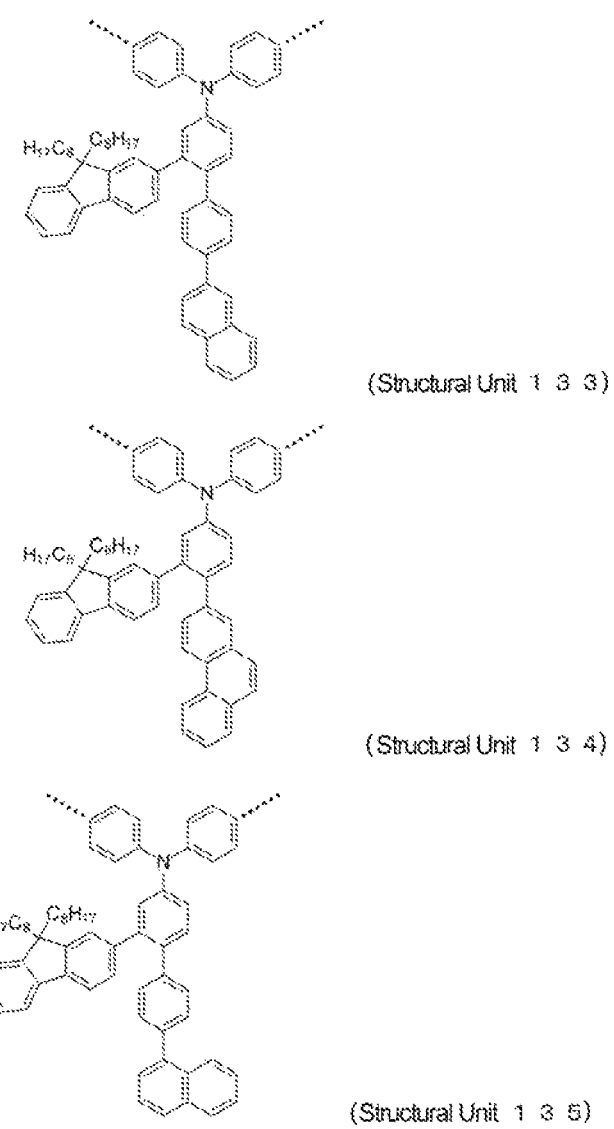
FIG. 45 The diagram showing the chemical structures of structural units 133 to 135 preferably used as the substituted triarylamine structural unit included in the high molecular weight compound according to the present invention.
Figure 46:
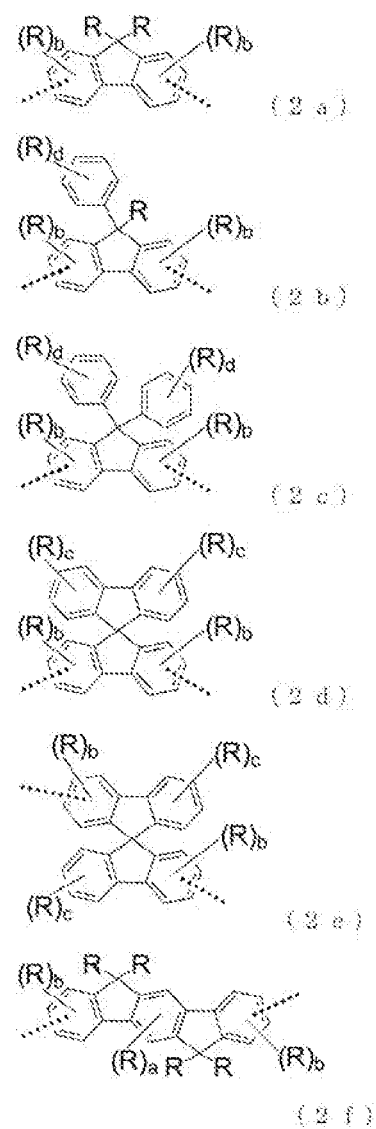
FIG. 46 The diagram showing the chemical structures of structural units (2a) to (2f) introduced to improve the solubility in an organic solvent.
Figure 47:
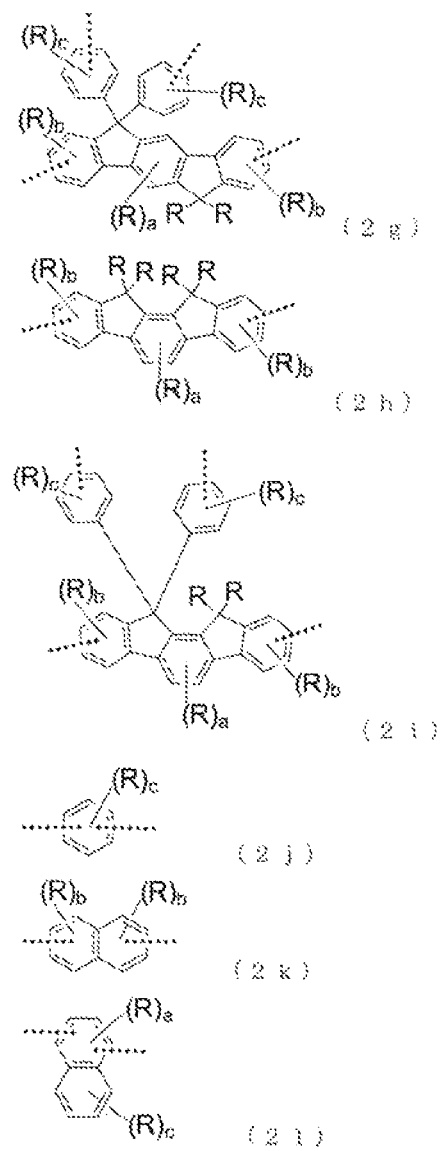
FIG. 47 The diagram showing the chemical structures of structural units (2g) to (2l) introduced to improve the solubility in an organic solvent.
Figure 48:
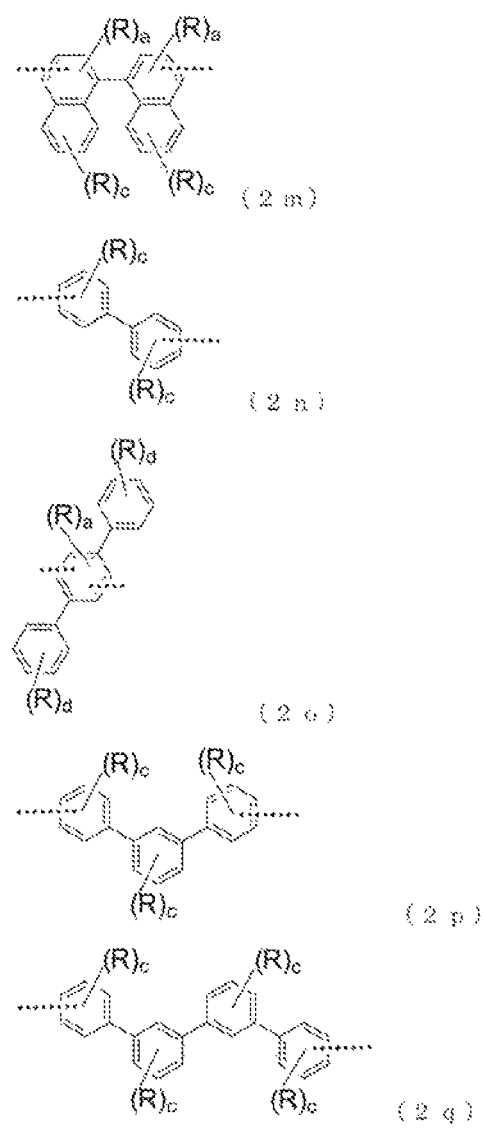
FIG. 48 The diagram showing the chemical structures of structural units (2m) to (2q) introduced to improve the solubility in an organic solvent.
Figure 49:
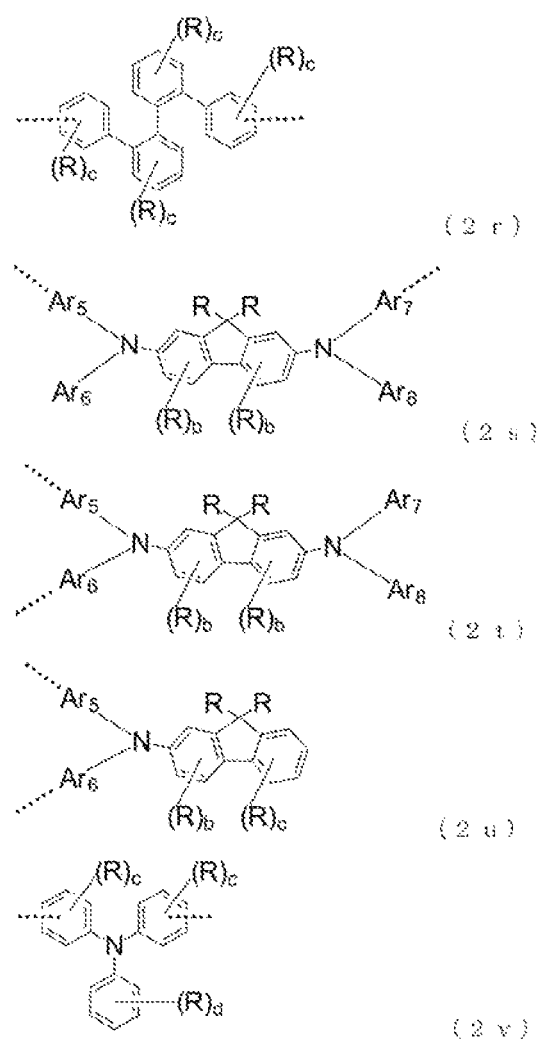
FIG. 49 The diagram showing the chemical structures of structural units (2r) to (2v) introduced to improve the solubility in an organic solvent.
Figure 51:
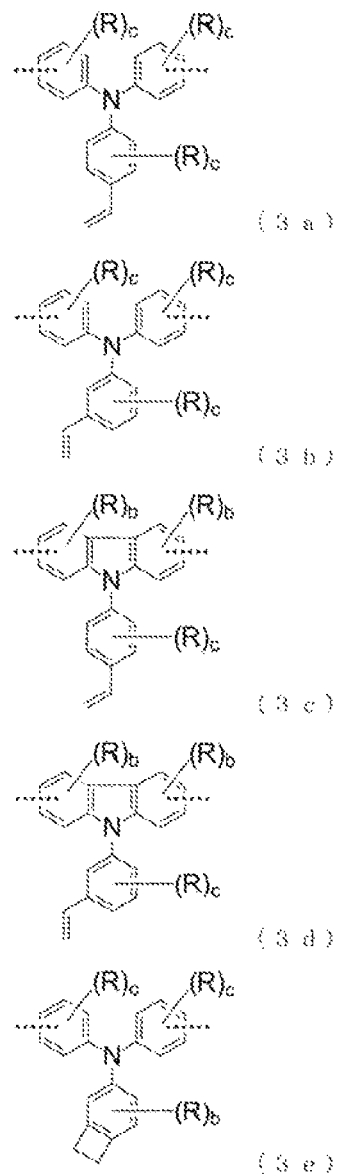
FIG. 51 The diagram showing the chemical structures of structural units (3a) to (3e) introduced to improve thermal crosslinkability.
Figure 52:
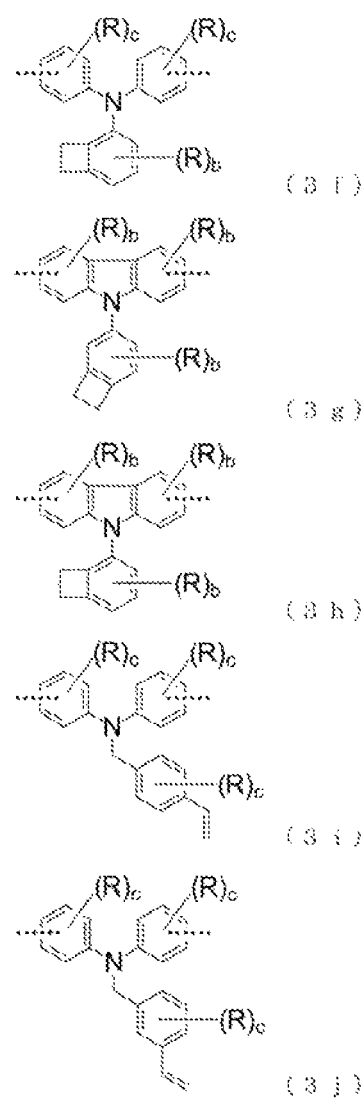
FIG. 52 The diagram showing the chemical structures of structural units (3f) to (3j) introduced to improve thermal crosslinkability.
Figure 53:
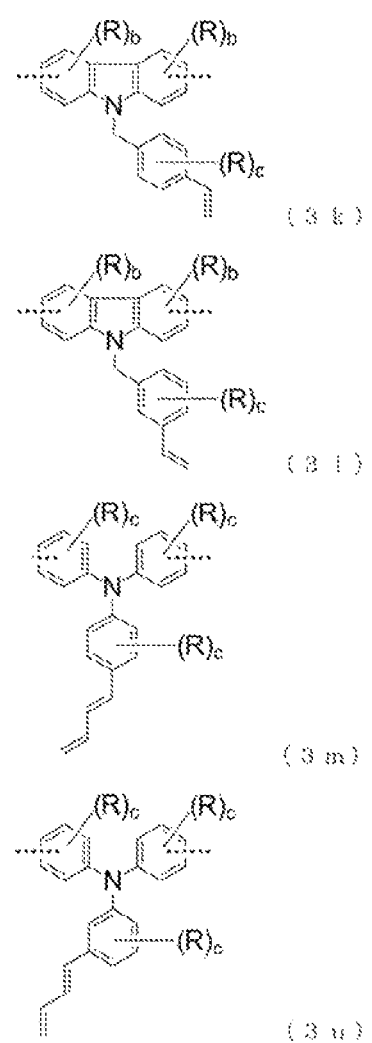
FIG. 53 The diagram showing the chemical structures of structural units (3k) to (3n) introduced to improve thermal crosslinkability.
Figure 54:
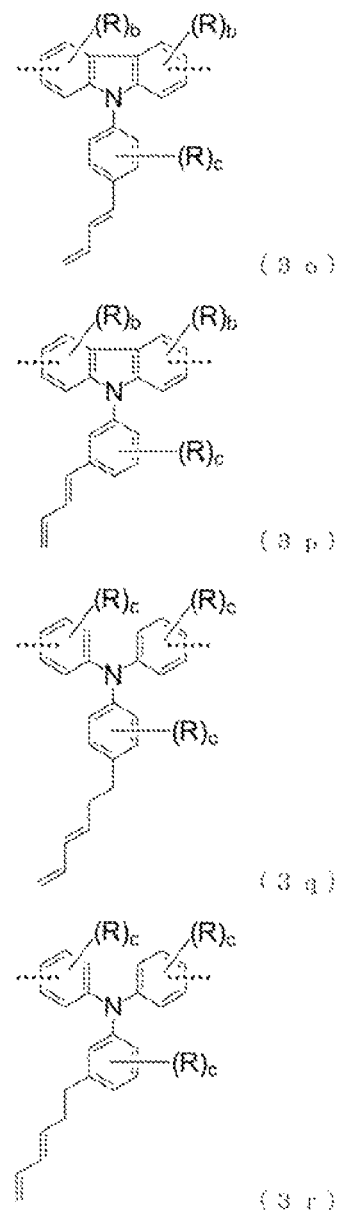
FIG. 54 The diagram showing the chemical structures of structural units (3o) to (3r) introduced to improve thermal crosslinkability.
Figure 55:
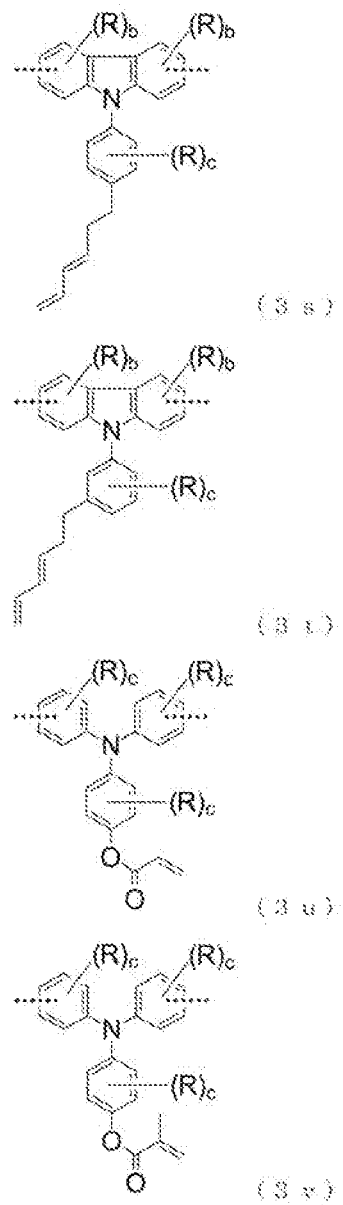
FIG. 55 The diagram showing the chemical structures of structural units (3s) to (3v) introduced to improve thermal crosslinkability.
Figure 56:
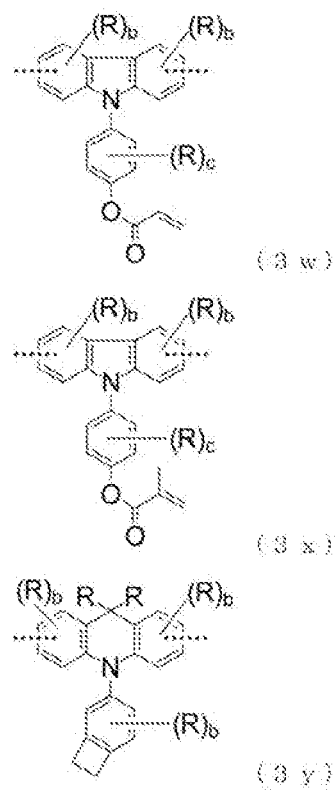
FIG. 56 The diagram showing the chemical structures of structural units (3w) and (3y) introduced to improve thermal crosslinkability.

A substituted triarylamine structural unit included in a high molecular weight compound according to the present invention is a divalent group, and is represented by the following general formula (1),

[Chem. 2]

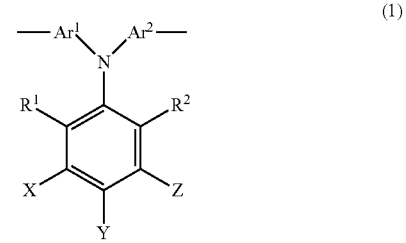

In the general formula (1) above, $Ar^1$ and $Ar^2$ may be each a divalent aromatic hydrocarbon group or a divalent aromatic heterocyclic group, and $Ar^1$ and $Ar^2$ may represent the same group.

The aromatic ring of the divalent aromatic hydrocarbon group may be a monocyclic ring or a condensed ring. Examples of the aromatic ring include a benzene ring, a naphthalene ring, an anthracene ring, a phenanthrene ring, a fluorene ring, an indene ring, a pyrene ring, a perylene ring, and a fluoran ring. These aromatic rings may have a substituent group.

Likewise, the heterocyclic ring of the divalent aromatic heterocyclic group may be a monocyclic ring or a condensed ring. Examples of the heterocyclic ring include a pyridine ring, a pyrimidine ring, a triazine ring, a quinoline ring, an isoquinoline ring, a benzofuran ring, a benzothiophene ring, an indole ring, a carbazole ring, a benzoxazole ring, a benzothiazole ring, a dibenzofuran ring, a quinoxaline ring, a benzimidazole ring, a pyrazoline ring, a dibenzofuran ring, a dibenzothiophene ring, a naphthyridine ring, a phenanthroline ring, an acridine ring, and a carboline ring. These aromatic heterocyclic rings may also have a substituent group.

The substituent group that may be included in the aromatic ring and the aromatic heterocyclic ring described above may be a heavy hydrogen atom, a cyano group, a nitro group, or the like. Other examples include the following:

halogen atoms, for example, a fluorine atom, a chlorine atom, a bromine atom, and an iodine atom;

alkyl groups, in particular, an alkyl group with 1 to 8 carbon atoms, for example, a methyl group, an ethyl group, an n-propyl group, an isopropyl group, an n-butyl group, an isobutyl group, a tert-butyl group, an n-pentyl group, an isopentyl group, a neopentyl group, an n-hexyl group, an isohexyl group, a neohexyl group, an n-heptyl group, an isoheptyl group, a neoheptyl group, an n-octyl group, an isooctyl group, and a neooctyl group;

alkyloxy groups, in particular, an alkyloxy group with 1 to 8 carbon atoms, for example, a methyloxy group, an ethyloxy group, and a propyloxy group;

alkenyl groups, for example, a vinyl group, and an allyl group;

aryloxy groups, for example, a phenyloxy group, and a tolyloxy group;

aryl groups, for example, a phenyl group, a biphenylyl group, a terphenylyl group, a naphthyl group, an anthracenyl group, a phenanthrenyl group, a fluorenyl group, an indenyl group, a pyrenyl group, a perylenyl group, a fluoranthenyl group, and a triphenylenyl group;

heteroaryl groups, for example, a pyridyl group, a pyrimidinyl group, a triazinyl group, a thienyl group, a furyl group, a pyrrolyl group, a quinolyl group, an isoquinolyl group, a benzofuranyl group, a benzothienyl group, an indolyl group, a carbazolyl group, a benzooxazolyl group, a benzothiazolyl group, a quinoxalinyl group, a benzimidazolyl group, a pyrazolyl group, a dibenzofuranyl group, a dibenzothienyl group, and a carbolinyl group;

aryl vinyl groups, for example, a styryl group, and a naphthyl vinyl group; and acyl groups, for example, an acetyl group, and a benzoyl group.

The substituent groups listed above may further have any of the substituent groups listed above.

Furthermore, it is preferable that these substituent groups are each independently present. However, these substituent groups may be bonded to each other to form a ring via a single bond, a methylene group that may have a substituent group, an oxygen atom, or a sulfur atom.

In the present invention, $Ar^1$ and $Ar^2$ described above preferably represent a carbazolyl group, a dibenzofuranyl group, a dibenzothienyl group, a naphthyl group, a phenanthrenyl group, a phenyl group, or a fluorenyl group that has a substituent group.

The substituent group of the fluorenyl group is preferably a methyl group, an ethyl group, an n-propyl group, an n-butyl group, an n-pentyl group, an n-hexyl group, an n-heptyl group, an n-octyl group, or a phenyl group.

In the general formula (1) above, $R^1$ and $R^2$ may be the same, and represent a hydrogen atom, a heavy hydrogen atom, a fluorine atom, a chlorine atom, a cyano group, a nitro group, an alkyl group or an alkyloxy group with 1 to 6 carbon atoms, a cycloalkyl group or a cycloalkyloxy group with 5 to 10 carbon atoms, an alkenyl group with 2 to 6 carbon atoms, or an aryloxy group.

In $R^1$ and $R^2$ described above, examples of the alkyl group, the alkyloxy group, the cycloalkyl group, the cycloalkyloxy group, the alkenyl group, and the aryloxy group are as follows.

Examples of the alkyl group ($C_1$ to $C_6$) include a methyl group, an ethyl group, an n-propyl group, an isopropyl group, an n-butyl group, an isobutyl group, a tert-butyl group, an n-pentyl group, an isopentyl group, a neopentyl group, an n-hexyl group, and the like.

Examples of the alkyloxy group ($C_1$ to $C_6$) include a methyloxy group, an ethyloxy group, an n-propyloxy group, an isopropyloxy group, an n-butyloxy group, a tert-butyloxy group, an n-pentyloxy group, an n-hexyloxy group, and the like.

Examples of the cycloalkyl group ($C_5$ to $C_{10}$) include a cyclopentyl group, a cyclohexyl group, a 1-adamantyl group, a 2-adamantyl group, and the like.

Examples of the cycloalkyloxy group ($C_5$ to $C_{10}$) include a cyclopentyloxy group, a cyclohexyloxy group, a cycloheptyloxy group, a cyclooctyloxy group, a 1-adamantyloxy group, a 2-adamantyloxy group, and the like.

Examples of the alkenyl group ($C_2$ to $C_6$) include a vinyl group, an allyl group, an isopropenyl group, a 2-butenyl group, and the like.

Examples of the aryloxy group include a phenyloxy group, a tolyloxy group, and the like.

Furthermore, the groups $R^1$ and $R^2$ described above may have a substituent group. These substituent groups are groups similar to the substituent groups that may be included in the divalent groups $Ar^1$ and $Ar^2$. Also, as with the substituent groups that may be included in $Ar^1$ and $Ar^2$, these substituent groups may further have a substituent group. Furthermore, it is desirable that the groups $R^1$ and $R^2$, and various substituent groups are each independently present. However, as with the substituent groups that may be included in $Ar^1$ and $Ar^2$, these substituent groups may be bonded to each other to form a ring.

In the high molecular weight compound according to the present invention, the groups $R^1$ and $R^2$ described above are preferably a hydrogen atom and a heavy hydrogen atom, and more preferably a hydrogen atom in view of synthesizing.

In the general formula (1) above, X, Y, and Z may be the same, and, on the condition that at least one of X to Z is an aryl group or a heteroaryl group, X, Y, and Z are an aryl group, a heteroaryl group, or a group similar to the groups represented by $R^1$ and $R^2$ above.

Examples of the groups represented by $R^1$ and $R^2$ are as described above. Examples of the aryl group and the heteroaryl group described above are as follows.

Examples of the aryl group (monovalent aromatic hydrocarbon group) include a phenyl group, a naphthyl group, an anthracenyl group, a phenanthrenyl group, a fluorenyl group, an indenyl group, a pyrenyl group, a perylenyl group, a fluoranthenyl group, and the like.

Also, examples of the heteroaryl group (monovalent aromatic heterocyclic group) include a pyridyl group, a pyrimidinyl group, a triazinyl group, a furyl group, a pyrrolyl group, a thienyl group, a quinolyl group, an isoquinolyl group, a benzofuranyl group, a benzothienyl group, an indolyl group, a carbazolyl group, a benzooxazolyl group, a benzothiazolyl group, a quinoxalinyl group, a benzimidazolyl group, a pyrazolyl group, a dibenzofuranyl group, a dibenzothienyl group, a naphthyridinyl group, a phenanthrolinyl group, an acridinyl group, a carbolinyl group, and the like.

The aryl group and the heteroaryl group described above may have a substituent group. These substituent groups are groups similar to the substituent groups that may be included in the divalent groups $Ar^1$ and $Ar^2$. Also, as with the substituent groups that may be included in $Ar^1$ and $Ar^2$, these substituent groups may further have a substituent group.

For example, the aryl group and the heteroaryl group described above may have a phenyl group as the substituent group. The phenyl group may further have a phenyl group as a substituent group. That is, in the case of an aryl group, the aryl group may be a biphenylyl group, a terphenylyl group, or a triphenylenyl group.

Furthermore, it is desirable that the aryl group and the heteroaryl group described above as well as various types of substituent groups are each independently present. However, as with the substituent groups that may be included in $Ar^1$ and $Ar^2$, these substituent groups may be bonded to each other to form a ring.

In the present invention, a combination of the groups represented by X to Z may be in the following patterns (a) to (c).

Pattern (a) is a pattern in which X and Y are an aryl group or a heteroaryl group, and Z is another group (a group similar to the groups represented by $R^1$ and $R^2$).

Pattern (b) is a pattern in which X and Z are an aryl group or a heteroaryl group, and Y is another group (a group similar to the groups represented by $R^1$ and $R^2$).

Pattern (c) is a pattern in which X, Y and Z are an aryl group or a heteroaryl group.

In the patterns described above, it is preferable that the aryl group and the heteroaryl group have no substituent group, and it is more preferable that they are a phenyl group, a biphenylyl group, a terphenyl group, a naphthyl group, a phenanthrenyl group, a fluorenyl group, a naphthyl phenyl group, or a triphenylenyl group.

Furthermore, in the patterns (a) and (b) described above, it is preferable that Z or Y that is a group other than the aryl group and the heteroaryl group is a hydrogen atom or a heavy hydrogen atom.

Specific examples of the substituted triarylamine structural unit represented by the above-described general formula (1) of the present invention are shown as structural units 1 to 135 in FIGS. 1 to 45.

In the chemical formulas shown in FIGS. 1 to 45, each broken line indicates a bond to an adjacent structural unit, and for each solid line that extends from a ring and has a free end, unlike the general formula (1), the free end indicates a methyl group.

<High Molecular Weight Compound>

As already described above, the high molecular weight compound according to the present invention that includes a structural unit represented by the general formula (1) given above has excellent characteristics such as hole injection characteristics, hole mobility, electron blocking capability, thin film stability, and heat resistance. From the viewpoint of enhancing the characteristics and ensuring film formability, the high molecular weight compound according to the present invention is preferably a polymer that includes the above-described structural unit as a repeating unit, and has, for example, a weight average molecular weight on a polystyrene conversion basis measured using GPC preferably in a range of 10,000 or more and less than 1,000,000, more preferably in a range of 10,000 or more and less than 500,000, and even more preferably in a range of 10,000 or more and less than 200,000.

Also, the high molecular weight compound according to the present invention may be a homopolymer that includes the above-described structural unit. However, in order to ensure coatability, adhesion to other layers, and durability when the high molecular weight compound according to the present invention is used to form, for example, an organic layer in an organic EL element through coating, the high molecular weight compound according to the present invention is preferably a copolymer of the above-described structural unit and another structural unit.

The other structural unit may be, for example, a structural unit for enhancing the solubility in an organic solvent, or a structural unit for enhancing the thermal crosslinkability of polymers.

The structural unit for enhancing the solubility in an organic solvent may have at least one aromatic hydrocarbon ring, and specific examples are shown as formulas (2a) to (2x) in FIGS. 46 to 50.

In the formulas (2a) to (2x), each broken line indicates a bond to an adjacent structural unit, and for each solid line that extends from a ring and has a free end, the free end indicates a methyl group.

Also, in the formulas, the subscripts a to d represent the following numbers.
a=0, 1, or 2
b=0, 1, 2, or 3
c=0, 1, 2, 3, or 4
d=0, 1, 2, 3, 4, or 5
Also, in the formulas (2a) to (2x),
R represents:
a hydrogen atom, a heavy hydrogen atom, a cyano group, a nitro group;
a halogen atom such as a fluorine atom, a chlorine atom, a bromine atom, or an iodine atom; or
an alkyl group, a cycloalkyl group, an alkoxy group, or a thioalkoxy group with 40 carbon atoms or less (particularly 3 to 40 carbon atoms).

Furthermore, $Ar^5$ to $Ar^8$ may be the same or different from each other, and represent a monovalent or divalent aromatic hydrocarbon group, or a monovalent or divalent aromatic heterocyclic group. Examples of the monovalent aromatic hydrocarbon group or aromatic heterocyclic group may be the same as those listed as examples of the aryl group and the heteroaryl group represented by the groups X to Z in the general formula (1). Also, examples of the divalent aromatic hydrocarbon group and the divalent aromatic heterocyclic group are the same as those listed as examples of the groups represented by the groups $Ar^1$ and $Ar^2$ in the general formula (1). It will be appreciated that all of these groups may have a substituent group.

The structural unit for enhancing thermal crosslinkability may be a structural unit that has a triarylamine skeleton that is different from the structural unit represented by the general formula (1), and specific examples are shown as formulas (3a) to (3y) in FIGS. 51 to 56.

In the formulas, all of the broken lines, the group R, and the subscripts a to d represent the same as those of the formulas (2a) to (2x) described above.

In the high molecular weight compound according to the present invention, where the structural unit 1 represented by the general formula (1) is denoted by A, the structural unit for enhancing the solubility in an organic solvent is denoted by B, and the structural unit for enhancing thermal crosslinkability is denoted by C, the amount of structural unit A is preferably 1 mol % or more, and more preferably 5 mol % or more. On the condition that the high molecular weight compound according to the present invention includes the structural unit A in the above-described amount, the high molecular weight compound includes the structural unit B in an amount of preferably 1 mol % or more, and more preferably 30 to 90 mol %, and the structural unit C in an amount of preferably 1 mol % or more, and more preferably 5 to 20 mol %. From the viewpoint of forming an organic layer in the organic EL element, it is even more preferable that the high molecular weight compound according to the present invention is a terpolymer that includes the structural units A, B, and C so as to satisfy the above conditions.

The high molecular weight compound according to the present invention described above can be synthesized by forming C—C bonds or C—N bonds through a Suzuki polymerization reaction or a HARTWIG-BUCHWALD polymerization reaction so as to connect the structural units.

Specifically, the high molecular weight compound according to the present invention can be synthesized by preparing unit compounds that respectively have the above-described structural units, and subjecting the unit compounds to borate esterification or halogenation as appropriate and then to a polycondensation reaction using an appropriate catalyst.

For example, as the compound for introducing the structural unit represented by the general formula (1), a triarylamine derivative represented by the following general formula (1a) can be used.

[Chem. 3]

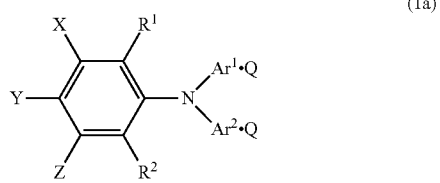

(1a)

where Q represents a hydrogen atom or a halogen atom (particularly Br), and all of $Ar^1$, $Ar^2$, X, Y, Z, and $R^1$, $R^2$ represent the same as those of the general formula (1).

That is, in the general formula (1a) given above, in the case where Q is a hydrogen atom, the unit compound for introducing the structural unit represented by the general formula (1) is obtained. In the case where Q is a halogen atom, a halide used to synthesize a polymer is obtained.

The high molecular weight compound according to the present invention described above is dissolved in an aromatic organic solvent such as benzene, toluene, xylene, or anisole so as to prepare a coating solution, and the coating solution is applied to a predetermined substrate to form a coating, and then the coating is heated and dried. In this way, a thin film that has excellent characteristics such as hole injectionability, hole transportability, and electron blockability can be formed. The thin film also has good heat resistance and good adhesion to other layers.

For example, the high molecular weight compound described above can be used as a constituent material of a hole injection layer and/or a hole transport layer included in an organic EL element. The hole injection layer or the hole transport layer formed using the high molecular weight compound described above has higher hole injectionability, greater mobility, and higher electron blockability than the hole injection layer or the hole transport layer formed using a conventional material. Furthermore, the hole injection layer or the hole transport layer formed using the high molecular weight compound described above can confine excitons generated in a light emitting layer, improve the probability of recombination of holes and electrons, and provide high light emission efficiency, and at the same time, achieve advantages of reducing the driving voltage and improving the durability of the organic EL element.

Also, the high molecular weight compound according to the present invention that has the electrical characteristics described above can also be preferably used to form an electron blocking layer or a light emitting layer.

<Organic EL Element>

An organic EL element that includes an organic layer formed using the high molecular weight compound according to the present invention described above has, for example, a structure shown in FIG. 57.

Specifically, a transparent anode 2, a hole injection layer 3, a hole transport layer 4, a light emitting layer 5, an electron transport layer 6, and a cathode 7 are formed on a glass substrate 1 (which may be a transparent substrate such as a transparent resin substrate).

Of course, the layer structure of the organic EL element to which the high molecular weight compound according to the present invention is applied is not limited to that described above. A hole blocking layer may be formed between the light emitting layer 5 and the electron transport layer 6. Also, an electron blocking layer or the like may be formed between the hole transport layer 4 and the light emitting layer 5. Furthermore, an electron injection layer may be formed between the cathode 7 and the electron transport layer 6. Furthermore, some layers may be omitted. For example, the organic EL element may have a simple layer structure in which a positive electrode 2, a hole transport layer 4, a light emitting layer 5, an electron transport layer 6, and a cathode 7 are formed on a substrate 1. A double-layer structure may be used in which layers having the same function are overlaid.

Taking advantage of characteristics such as hole injectionability and hole transportability, the high molecular weight compound according to the present invention is preferably used as a material for forming an organic layer (for example, a hole injection layer 3, a hole transport layer 4, a light emitting layer 5, or an unshown hole blocking layer) that is formed between the anode 2 and the cathode 7.

In the organic EL element described above, the transparent anode 2 may be made of an electrode material that is known per se, and is formed by depositing an electrode material that has a large work function, such as ITO or gold, on a substrate 1 (a transparent substrate such as a glass substrate).

Also, the hole injection layer 3 formed on the transparent anode 2 can be formed using a coating solution prepared by dissolving the high molecular weight compound according to the present invention in, for example, an aromatic organic solvent such as toluene, xylene, or anisole. That is, the hole injection layer 3 can be formed by applying the coating solution to the transparent anode 2 through spin coating, inkjet printing, or the like so as to form a coating.

The hole injection layer 3 can also be formed using a conventionally known material, without using the high molecular weight compound according to the present invention. Examples of the conventionally known material include:

a porphyrin compound as typified by copper phthalocyanine;

a star burst triphenylamine derivative;

an arylamine having a structure in which molecules are connected via a single bond or a divalent group that does not have a hetero atom (for example, a triphenylamine trimer or tetramer);

an acceptor-like heterocyclic ring compound such as hexacyanoazatriphenylene; and a coating polymer material such as, for example, poly(3,4-ethylenedioxythiophene) (PEDOT), or poly(styrenesulfonate) (PSS).

A layer (thin film) made of any of the materials listed above can be formed through coating using a deposition method, a spin-coating method, an inkjet printing method, or the like. The same applies to other layers. Film-forming is performed using a deposition method or a coating method according to the type of film-forming material.

As with the hole injection layer 3, the hole transport layer 4 formed on the hole injection layer 3 can also be formed through coating such as spin-coating or inkjet printing using the high molecular weight compound according to the present invention.

Alternatively, the hole transport layer 4 can also be formed using a conventionally known hole transport material. Typical examples of the hole transport material include:

benzidine derivatives such as N,N'-diphenyl-N,N'-di(m-tolyl)benzidine (hereinafter referred to simply as TPD), N,N'-diphenyl-N,N'-di(α-naphthyl)benzidine (hereinafter referred to simply as NPD), and N,N,N',N'-tetrabiphenylyl benzidine;

amine derivatives such as 1,1-bis[4-(di-4-tolylamino)phenyl]cyclohexane (hereinafter referred to simply as TAPC);
various types of triphenylamine trimers and tetramer; and
coating polymer materials that are also used to form a hole injection layer.

The compounds for forming a hole transport layer, including the high molecular weight compound according to the present invention, may be used alone or in combination of two or more to form a hole transport layer. Alternatively, a multi-layer film in which a plurality of layers formed using one or more of the compounds listed above are stacked may be used as the hole transport layer.

Alternatively, the hole injection layer 3 and the hole transport layer 4 may be combined into one layer. Such a hole injection/transport layer can be formed through coating using a polymer material such as PEDOT.

In the hole transport layer 4 (the same applies to the hole injection layer 3), a material obtained by p-doping a material usually used to form the layer with trisbromophenylamine-hexachloroantimony, a radialene derivative (see, for example, WO 2014/009310), or the like can also be used. The hole transport layer 4 (or the hole injection layer 3) can also be formed using a high molecular weight compound that has a TPD base skeleton, or the like.

Furthermore, the unshown electron blocking layer (which can be formed between the hole transport layer 4 and the light emitting layer 5) can also be formed using a known electron blocking compound that has an electron blocking function such as, for example, a carbazole derivative or a compound that has a triphenylsilyl group and a triarylamine structure. Specific examples of the carbazole derivative and the compound that has a triarylamine structure are as follows.

Examples of the carbazole derivative include:
4,4',4''-tri(N-carbazolyl)triphenylamine (hereinafter referred to simply as TCTA);
9,9-bis[4-(carbazole-9-yl)phenyl]fluorene;
1,3-bis(carbazole-9-yl)benzene (hereinafter referred to simply as mCP); and
2,2-bis(4-carbazole-9-ylphenyl)adamantane (hereinafter referred to simply as Ad-Cz).

Examples of the compound that has a triarylamine structure include 9-[4-(carbazole-9-yl)phenyl]-9-[4-(triphenylsilyl)phenyl]-9H-fluorene.

The electron blocking layer is formed using one or more of the known electron blocking materials listed above. However, a multi-layer film in which a plurality of layers are formed using one or more of the electron blocking materials are stacked may be used as the electron blocking layer.

The light emitting layer 5 of the organic EL element can be formed using a light emitting material such as a metal complex of a quinolinol derivative such as $Alq_3$. Other examples of the light emitting material include various types of metal complexes of zinc, beryllium, aluminum and the like, an anthracene derivative, a bisstyrylbenzene derivative, a pyrene derivative, an oxazole derivative, and a poly (p-phenylene vinylene) derivative.

Also, the light emitting layer 5 can also be formed using a host material and a dopant material.

In this case, as the host material, in addition to the light emitting materials listed above, a thiazole derivative, a benzimidazole derivative, a polydialkylfluorene derivative, and the like can be used. Furthermore, the high molecular weight compound according to the present invention described above can also be used.

As the dopant material, quinacridone, coumalin, rubrene, perylene, and derivatives thereof, a benzopyran derivative, a rhodamine derivative, an aminostyryl derivative, and the like can be used.

The light emitting layer 5 described above may have a single-layer structure in which one or more of the light emitting materials listed above is used, or a multi-layer structure in which a plurality of layers are stacked.

Furthermore, the light emitting layer 5 can also be formed using a phosphorescent light emitting material as the light emitting material.

As the phosphorescent light emitting material, a phosphorescent emitter of a metal complex of iridium, platinum, or the like can be used. For example, a green phosphorescent emitter such as $Ir(ppy)_3$, a blue phosphorescent emitter such as FIrpic or $FIr_6$, a red phosphorescent emitter such as $Btp_2Ir$ (acac), or the like can be used. The phosphorescent light emitting material is used by being doped into a host material that has hole injectionability/transportability or a host material that has electron transportability.

As the host material that has hole injectionability/transportability, a carbazole derivative such as 4,4'-di(N-carbazolyl)biphenyl (hereinafter referred to simply as CBP), TCTA, or mCP, or the like can be used. Furthermore, the high molecular weight compound according to the present invention can also be used.

Also, as the host material that has electron transportability, p-bis(triphenylsilyl)benzene (hereinafter referred to simply as UGH2), 2,2',2''-(1,3,5-phenylene)-tris(1-phenyl-1H-benzimidazole) (hereinafter referred to simply as TPBI), or the like can be used.

In order to avoid concentration quenching, it is preferable to dope the host material with the phosphorescent light emitting material through co-deposition in an amount of 1 to 30 wt % relative to the entire light emitting layer.

Also, as the light emitting material, a material that emits delayed fluorescence such as a CDCB derivative, specifically, PIC-TRZ, CC2TA, PXZ-TRZ, 4CzIPN, or the like can also be used (see Appl. Phys. Let., 98, 083302 (2011)).

The light emitting layer 5 may be formed by causing the high molecular weight compound according to the present invention to carry a fluorescent emitter or a phosphorescent emitter that is called a dopant, or a material that emits delayed fluorescence. In this way, an organic EL element that has a low driving voltage and improved light emission efficiency can be achieved.

The hole blocking layer (not shown in the diagram) formed between the light emitting layer 5 and the electron transport layer 6 can be formed using a hole blocking compound that is known per se.

Examples of the known hole blocking compound include:
a phenanthroline derivative such as bathocuproine (hereinafter referred to simply as BCP);
a metal complex of a quinolinol derivative such as aluminum(III)bis(2-methyl-8-quinolinate)-4-phenylphenolate (hereinafter referred to simply as BAlq);
various types of rare-earth complexes;
a triazole derivative;
a triazine derivative; and
an oxadiazole derivative.

These materials can also be used to form an electron transport layer 6, which will be described below. Furthermore, the hole blocking layer may also be used as the electron transport layer 6.

The hole blocking layer may also have a single or multi-layer stack structure in which each layer is formed using one or more of the hole blocking compounds listed above and the high molecular weight compound according to the present invention.

The electron transport layer 6 is formed using, in addition to the naphthotriazole derivative of the present invention, an electron transport compound that is known per se. Examples of the known electron transport compound include metal complexes of quinolinol derivatives such as $Alq_3$ and BAlq, various types of metal complexes, a triazole derivative, a triazine derivative, an oxadiazole derivative, a thiadiazole derivative, a carbodiimide derivative, a quinoxaline derivative, a phenanthroline derivative, a silole derivative, and the like.

The electron transport layer 6 may also have a single or multi-layer stack structure in which each layer is formed using one or more of the electron transport compounds listed above.

Furthermore, the electron injection layer formed optionally (not shown in the diagram) can also be formed using a material that is known per se. Examples of the known material include: alkali metal salts such as lithium fluoride and cesium fluoride; alkaline earth metal salts such as magnesium fluoride; metal oxides such as aluminum oxide; and the like.

The cathode 7 of the organic EL element is formed using an electrode material that has a low work function such as aluminum, or an alloy that has an even lower work function such as a magnesium-silver alloy, a magnesium-indium alloy, or an aluminum-magnesium alloy is used as the electrode material.

In the present invention, at least one of the hole injection layer 3, the hole transport layer 4, the light emitting layer 5, and the unshown electron blocking layer is formed using the high molecular weight compound that includes a substituted triarylamine structure represented by the general formula (1) given above. As a result, an organic EL element that has high light emission efficiency, high power efficiency, a low actual driving voltage, a low light-emission start voltage, and outstanding durability can be obtained. In particular, the organic EL element has a low driving voltage, improved current tolerance, and improved maximum light emission luminance while having high light emission efficiency.

EXAMPLES

Hereinafter, the present invention will be described by way of examples given below.

In the description given below, the structural unit represented by the general formula (1) included in the high molecular weight compound according to the present invention will be referred to as "structural unit A", the structural unit introduced to enhance the solubility in an organic solvent will be referred to as "structural unit B", and the structural unit introduced to enhance thermal crosslinkability will be referred to as "structural unit C".

Also, purification of a synthesized compound was performed through column chromatography or crystallization using a solvent, and identification of the compound was performed through NMR analysis.

In order to produce high molecular weight compounds according to the present invention, the following intermediates 1 to 41 were synthesized.

<Synthesis of Intermediate 1>

[Chem. 4]

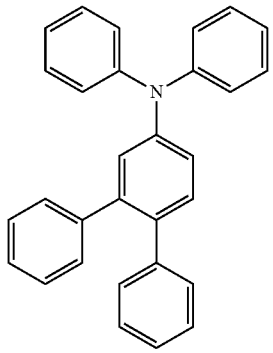

Intermediate 1

The intermediate 1 is an intermediate compound used to introduce the structural unit A included in the high molecular weight compound according to the present invention.

The following components were placed in a reaction vessel whose internal air was replaced with nitrogen:
 5.0 g of 1,1': 2',1''-terphenyl-4'-amine;
 9.2 g of iodobenzene;
 5.9 g of sodium-t-butoxide; and
 25 ml of xylene.

Then, 0.4 g of copper(I) iodide and 0.4 g of N,N'-dimethylethylenediamine were added, and the mixture was heated and stirred at 125° C. for 8 hours.

After the mixture was cooled down to room temperature, 100 ml of toluene was added, and the mixture was stirred for 1 hour and filtered. The filtrate was concentrated under reduced pressure to obtain a crude product. The crude product was purified through column chromatography (toluene/n-hexane=1/10), and 6.6 g (with a yield of 81%) of a pale yellow powder of intermediate 1 was thereby obtained.

<Synthesis of Intermediate 2>

[Chem. 5]

Intermediate 2

The intermediate 2 is a compound obtained by dibromizing the intermediate 1, and is used to polymerize the intermediate 1 that is a unit compound for introducing the structural unit A.

First, 6.4 g of intermediate 1 synthesized above and 120 ml of tetrahydrofuran were placed in a reaction vessel whose internal air was replaced with nitrogen. Then, at room temperature, 5.7 g of N-bromosuccinimide was added, and the mixture was stirred for 4 hours.

Then, 180 ml of water was added, and the mixture was filtered to extract a precipitated solid. The obtained solid was washed with methanol, and 8.3 g (with a yield of 93%) of a white powder of intermediate 2 was thereby obtained.

<Synthesis of Intermediate 3>

[Chem. 6]

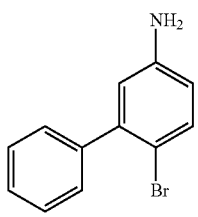

Intermediate 3

The intermediate 3 is an intermediate compound used to introduce the structural unit A included in the high molecular weight compound according to the present invention.

First, 49.3 g of 3-aminobiphenyl and 300 ml of N,N-dimethylformamide were placed in a reaction vessel whose internal air was replaced with nitrogen. Then, at room temperature, 54.4 g of N-bromosuccinimide was added, and the mixture was stirred for 5.5 hours.

Then, water and toluene were added, and a separation operation was performed to extract an organic layer. The organic layer was dehydrated using magnesium sulfate anhydrous, and then concentrated under reduced pressure to obtain a crude product. The crude product was purified through column chromatography (toluene/n-hexane=1/1), and 69.6 g (with a yield of 96%) of an orange oil of intermediate 3 was thereby obtained.

<Synthesis of Intermediate 4>

[Chem. 7]

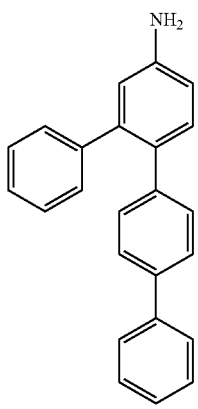

Intermediate 4

The intermediate 4 is an intermediate compound used to introduce the structural unit A included in the high molecular weight compound according to the present invention.

The following components were placed in a reaction vessel whose internal air was replaced with nitrogen, and nitrogen gas was passed through the reaction vessel for 30 minutes:

3.6 g of intermediate 3;

3.2 g of 4-biphenylboronic acid;

36 ml of toluene;

9 ml of ethanol; and 11 ml of aqueous solution of 2M-potassium carbonate.

Then, 0.50 g of tetrakis(triphenylphosphine)palladium(0) was added, and the mixture was heated and stirred at 75° C. for 4 hours.

After the mixture was cooled down to room temperature, a saturated saline solution and toluene were added, and a separation operation was performed to extract an organic layer. The organic layer was dehydrated using magnesium sulfate anhydrous, and then concentrated under reduced pressure to obtain a crude product. The crude product was crystallized and purified with chloroform/methanol, and 2.6 g (with a yield of 55%) of a whitish powder of intermediate 4 was thereby obtained.

<Synthesis of Intermediate 5>

[Chem. 8]

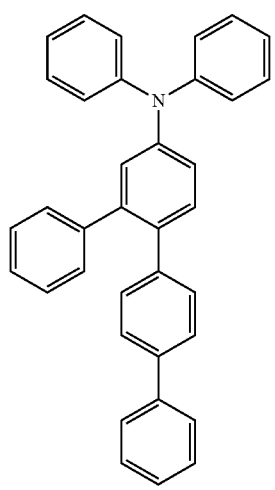

Intermediate 5

The intermediate 5 is an intermediate compound used to introduce the structural unit A included in the high molecular weight compound according to the present invention.

The following components were placed in a reaction vessel whose internal air was replaced with nitrogen:

2.5 g of intermediate 4;

3.5 g of iodobenzene;

2.2 g of sodium-t-butoxide; and 15 ml of xylene.

Then, 0.2 g of copper(I) iodide and 0.1 g of N,N'-dimethylethylenediamine were added, and the mixture was heated and stirred at 125° C. for 12 hours.

After the mixture was cooled down to room temperature, 150 ml of toluene was added, and the mixture was stirred for 1 hour and filtered. The filtrate was concentrated under reduced pressure to obtain a crude product. The crude product was purified through column chromatography (toluene/n-hexane=1/10), and 2.4 g (with a yield of 65%) of a white powder of intermediate 5 was thereby obtained.

<Synthesis of Intermediate 6>

[Chem. 9]

Intermediate 6

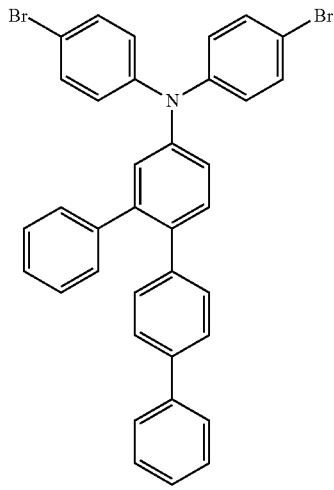

The intermediate 6 is a compound obtained by dibromizing the intermediate 5, and is used to polymerize the intermediate 5 that is a unit compound for introducing the structural unit A.

First, 2.4 g of intermediate 5 synthesized above and 50 ml of tetrahydrofuran were placed in a reaction vessel whose internal air was replaced with nitrogen. Then, at room temperature, 1.8 g of N-bromosuccinimide was added, and the mixture was stirred for 4 hours.

Then, 100 ml of water was added, and the mixture was filtered to extract a precipitated solid. The obtained solid was washed with methanol, and 3.1 g (with a yield of 97%) of a white powder of intermediate 6 was thereby obtained.

<Synthesis of Intermediate 7>

[Chem. 10]

Intermediate 7

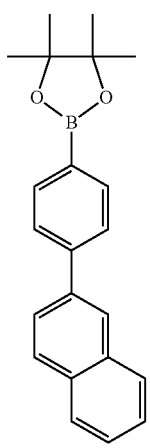

The intermediate 7 is an intermediate compound used to introduce the structural unit A included in the high molecular weight compound according to the present invention.

The following components were placed in a reaction vessel whose internal air was replaced with nitrogen, and nitrogen gas was passed through the reaction vessel for 30 minutes:

10 g of 1-bromo-4-(naphthyl-2-yl)-benzene;

9.9 g of bis(pinacolato)diboron;

5.2 g of potassium acetate; and 100 ml of 1,4-dioxane.

Then, 0.87 g of {1,1'-bis(diphenylphosphino)ferrocene}palladium(II)dichloride dichloromethane adduct was added, and the mixture was heated and stirred at 90° C. for 11.5 hours.

After the mixture was cooled down to room temperature, a saturated saline solution and toluene were added, and a separation operation was performed to extract an organic layer. The organic layer was dehydrated using magnesium sulfate anhydrous, and then concentrated under reduced pressure to obtain a crude product. The crude product was recrystallized with n-hexane, and 7.6 g (with a yield of 66%) of a whitish powder of intermediate 7 was thereby obtained.

<Synthesis of Intermediate 8>

[Chem. 11]

Intermediate 8

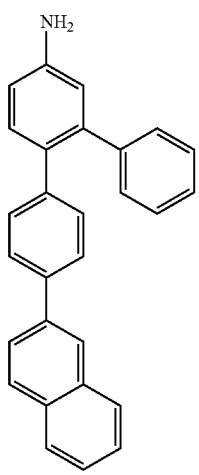

The intermediate 8 is an intermediate compound used to introduce the structural unit A included in the high molecular weight compound according to the present invention.

The following components were placed in a reaction vessel whose internal air was replaced with nitrogen, and nitrogen gas was passed through the reaction vessel for 30 minutes:

7.3 g of intermediate 7;

5.0 g of intermediate 3;

48 ml of toluene;

12 ml of ethanol; and 16 ml of aqueous solution of 2M-potassium carbonate.

Then, 0.70 g of tetrakis(triphenylphosphine)palladium(0) was added, and the mixture was heated and stirred at 75° C. for 8 hours.

After the mixture was cooled down to room temperature, water and toluene were added, and a separation operation was performed to extract an organic layer. The organic layer was dehydrated using magnesium sulfate anhydrous, and then concentrated under reduced pressure to obtain a crude product. The crude product was recrystallized with methanol, and 4.1 g (with a yield of 55%) of a whitish powder of intermediate 8 was thereby obtained.

<Synthesis of Intermediate 9>

[Chem. 12]

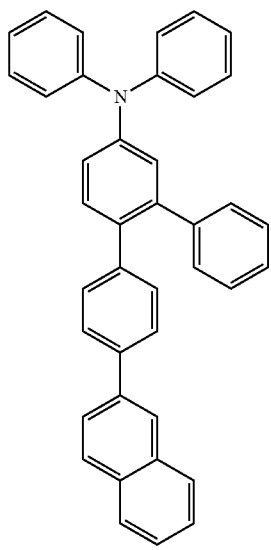

Intermediate 9

The intermediate 9 is an intermediate compound used to introduce the structural unit A included in the high molecular weight compound according to the present invention.

The following components were placed in a reaction vessel whose internal air was replaced with nitrogen:

4.0 g of intermediate 8;

5.3 g of iodobenzene;

3.1 g of sodium-t-butoxide; and 20 ml of xylene.

Then, 0.2 g of copper(I) iodide and 0.2 g of N,N'-dimethylethylenediamine were added, and the mixture was heated and stirred at 125° C. for 10.5 hours.

After the mixture was cooled down to room temperature, 150 ml of toluene was added, and the mixture was stirred for 1 hour and filtered. The filtrate was concentrated under reduced pressure to obtain a crude product. The crude product was purified through column chromatography (toluene/n-hexane=1/9), and 4.5 g (with a yield of 79%) of a white powder of intermediate 9 was thereby obtained.

<Synthesis of Intermediate 10>

[Chem. 13]

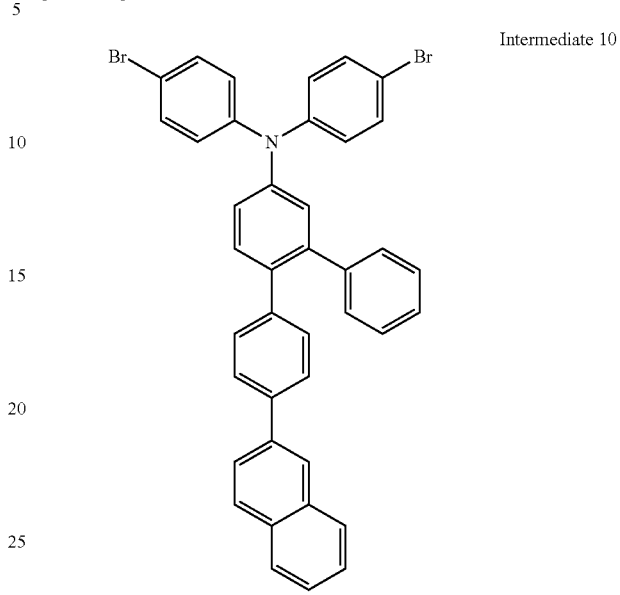

Intermediate 10

The intermediate 10 is a compound obtained by dibromizing the intermediate 9, and is used to polymerize the intermediate 9 that is a unit compound for introducing the structural unit A.

First, 4.4 g of intermediate 9 synthesized above and 60 ml of tetrahydrofuran were placed in a reaction vessel whose internal air was replaced with nitrogen. Then, at room temperature, 3.0 g of N-bromosuccinimide was added, and the mixture was stirred for 6.5 hours.

Then, 120 ml of water was added, and the mixture was filtered to extract a precipitated solid. The obtained solid was washed with methanol, and 5.7 g (with a yield of 99%) of a white powder of intermediate 10 was thereby obtained.

<Synthesis of Intermediate 11>

[Chem. 14]

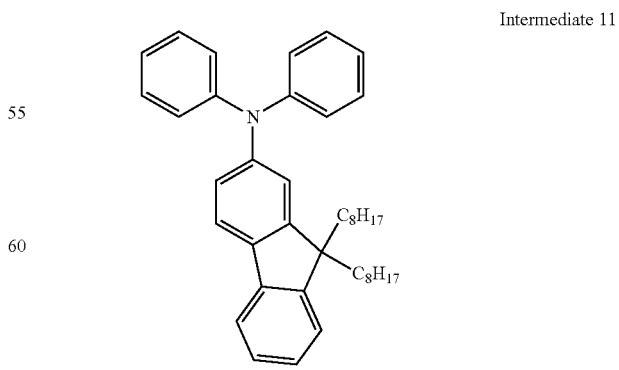

Intermediate 11

The intermediate 11 is an intermediate compound used to introduce the structural unit B included in the high molecular weight compound according to the present invention.

The following components were placed in a reaction vessel whose internal air was replaced with nitrogen:

12.9 g of 2-amino-9,9-n-dioctylfluorene;

14.3 g of iodobenzene;

9.2 g of sodium-t-butoxide; and 20 ml of xylene.

Then, 0.61 g of copper(I) iodide and 0.57 g of N,N'-dimethylethylenediamine were added, and the mixture was heated and stirred at 125° C. for 18 hours.

After the mixture was cooled down to room temperature, 150 ml of toluene was added, and the mixture was stirred for 1 hour and filtered. The filtrate was concentrated under reduced pressure to obtain a crude product. The crude product was purified through column chromatography (n-hexane), and 14.5 g (with a yield of 82%) of a yellow oil of intermediate 11 was thereby obtained.

<Synthesis of Intermediate 12>

[Chem. 15]

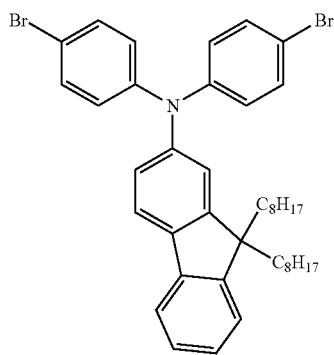

Intermediate 12

The intermediate 12 is an intermediate compound used to introduce the structural unit B included in the high molecular weight compound according to the present invention.

First, 13.2 g of intermediate 11 synthesized above and 250 ml of tetrahydrofuran were placed in a reaction vessel whose internal air was replaced with nitrogen. Then, at room temperature, 8.2 g of N-bromosuccinimide was added, and the mixture was stirred for 3 hours.

Then, 500 ml of water and 500 ml of toluene were added, and a separation operation was performed to extract an organic layer. The organic layer was dehydrated using magnesium sulfate anhydrous, and then concentrated under reduced pressure to obtain a crude product. The crude product was purified through column chromatography (n-hexane), and 17.0 g (with a yield of 94%) of a yellow oil of intermediate 12 was thereby obtained.

<Synthesis of Intermediate 13>

[Chem. 16]

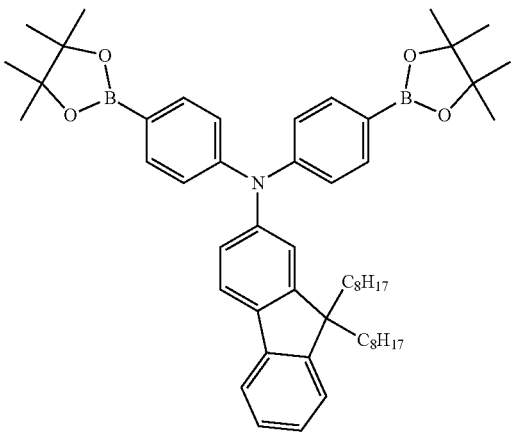

Intermediate 13

The intermediate 13 is a compound obtained by diborating the intermediate 12, and is used to polymerize the intermediate 11 that is a unit compound for introducing the structural unit B.

The following components were placed in a reaction vessel whose internal air was replaced with nitrogen, and nitrogen gas was passed through the reaction vessel for 30 minutes:

16.7 g of intermediate 12;

11.9 g of bis(pinacolato)diboron;

5.7 g of potassium acetate; and 170 ml of 1,4-dioxane.

Then, 0.19 g of {1,1'-bis(diphenylphosphino)ferrocene}palladium(II)dichloride dichloromethane adduct was added, and the mixture was heated and stirred at 100° C. for 7 hours.

After the mixture was cooled down to room temperature, water and toluene were added, and a separation operation was performed to extract an organic layer. The organic layer was dehydrated using magnesium sulfate anhydrous, and then concentrated under reduced pressure to obtain a crude product. The crude product was purified through column chromatography (ethyl acetate/n-hexane=1/20), and 7.6 g (with a yield of 40%) of a white powder of intermediate 13 was thereby obtained.

<Synthesis of Intermediate 14>

[Chem. 17]

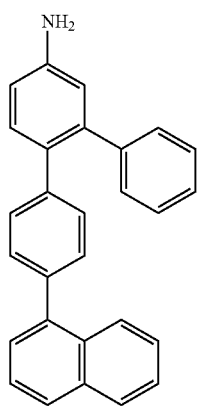

Intermediate 14

The intermediate 14 is an intermediate compound used to introduce the structural unit A included in the high molecular weight compound according to the present invention.

The following components were placed in a reaction vessel whose internal air was replaced with nitrogen, and nitrogen gas was passed through the reaction vessel for 30 minutes:

3.2 g of 4-(naphthyl-1-yl)-phenylboronic acid;
2.9 g of intermediate 3;
28 ml of toluene;
7 ml of ethanol; and
9 ml of aqueous solution of 2M-potassium carbonate.

Then, 0.41 g of tetrakis(triphenylphosphine)palladium(0) was added, and the mixture was heated and stirred at 75° C. for 6 hours.

After the mixture was cooled down to room temperature, a saturated saline solution and toluene were added, and a separation operation was performed to extract an organic layer. The organic layer was dehydrated using magnesium sulfate anhydrous, and then concentrated under reduced pressure to obtain a crude product. The crude product was purified through column chromatography (chloroform/n-hexane=1/1), and 3.3 g (with a yield of 76%) of a colorless transparent oil of intermediate 14 was thereby obtained.

<Synthesis of Intermediate 15>

[Chem. 18]

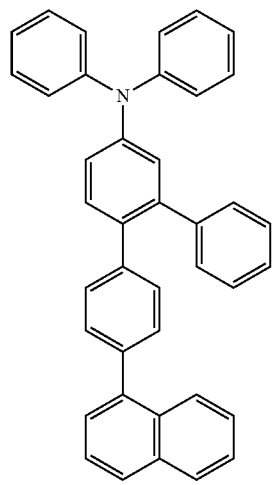

Intermediate 15

The intermediate 15 is an intermediate compound used to introduce the structural unit A included in the high molecular weight compound according to the present invention.

The following components were placed in a reaction vessel whose internal air was replaced with nitrogen:

3.1 g of intermediate 14;
3.7 g of iodobenzene;
2.4 g of sodium-t-butoxide; and
15 ml of xylene.

Then, 0.16 g of copper(I) iodide and 0.15 g of N,N'-dimethylethylenediamine were added, and the mixture was heated and stirred at 125° C. for 14.5 hours.

After the mixture was cooled down to room temperature, 150 ml of toluene was added, and the mixture was stirred for 1 hour and filtered. The filtrate was concentrated under reduced pressure to obtain a crude product. The crude product was purified through column chromatography (toluene/n-hexane=1/9), and 3.3 g (with a yield of 76%) of a white powder of intermediate 15 was thereby obtained.

<Synthesis of Intermediate 16>

[Chem. 19]

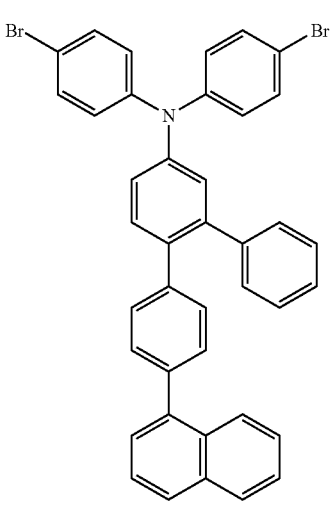

Intermediate 16

The intermediate 16 is a compound obtained by dibromizing the intermediate 15, and is used to polymerize the intermediate 15 that is a unit compound for introducing the structural unit A.

First, 3.2 g of intermediate 15 synthesized above and 50 ml of tetrahydrofuran were placed in a reaction vessel whose internal air was replaced with nitrogen. Then, at room temperature, 2.2 g of N-bromosuccinimide was added, and the mixture was stirred for 6 hours.

Then, 100 ml of water and 300 ml of toluene were added, and a separation operation was performed to extract an organic layer. The organic layer was dehydrated using magnesium sulfate anhydrous, and then concentrated under reduced pressure to obtain a crude product. The crude product was recrystallized with ethyl acetate/n-hexane=1/10, and 3.6 g (with a yield of 87%) of a white powder of intermediate 16 was thereby obtained.

<Synthesis of Intermediate 17>

[Chem. 20]

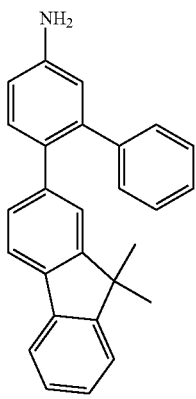

Intermediate 17

The intermediate 17 is an intermediate compound used to introduce the structural unit A included in the high molecular weight compound according to the present invention.

The following components were placed in a reaction vessel whose internal air was replaced with nitrogen, and nitrogen gas was passed through the reaction vessel for 30 minutes:

5.7 g of 2-(4,4,5,5-tetramethyl-1,3,2-dioxaborolane-2-yl)-9,9-dimethylfluorene;

4.0 g of intermediate 3;

40 ml of toluene;

10 ml of ethanol; and 12 ml of aqueous solution of 2M-potassium carbonate.

Then, 0.56 g of tetrakis(triphenylphosphine)palladium(0) was added, and the mixture was heated and stirred at 75° C. for 11 hours.

After the mixture was cooled down to room temperature, a saturated saline solution and toluene were added, and a separation operation was performed to extract an organic layer. The organic layer was dehydrated using magnesium sulfate anhydrous, and then concentrated under reduced pressure to obtain a crude product. The crude product was purified through column chromatography (chloroform/n-hexane=1/1), and 4.0 g (with a yield of 69%) of a pale yellow powder of intermediate 17 was thereby obtained.

<Synthesis of Intermediate 18>

[Chem. 21]

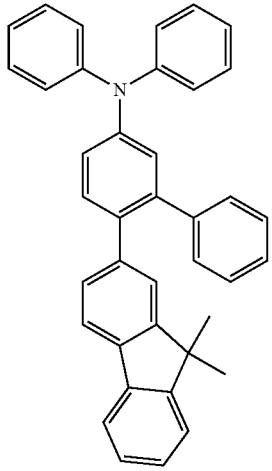

Intermediate 18

The intermediate 18 is an intermediate compound used to introduce the structural unit A included in the high molecular weight compound according to the present invention.

The following components were placed in a reaction vessel whose internal air was replaced with nitrogen:

3.9 g of intermediate 17;

4.8 g of iodobenzene;

3.1 g of sodium-t-butoxide; and 20 ml of xylene.

Then, 0.21 g of copper(I) iodide and 0.19 g of N,N'-dimethylethylenediamine were added, and the mixture was heated and stirred at 125° C. for 16 hours.

After the mixture was cooled down to room temperature, 120 ml of toluene was added, and the mixture was stirred for 1 hour and filtered. The filtrate was concentrated under reduced pressure to obtain a crude product. The crude product was purified through column chromatography (toluene/n-hexane=1/9), and 4.5 g (with a yield of 81%) of a white powder of intermediate 18 was thereby obtained.

<Synthesis of Intermediate 19>

[Chem. 22]

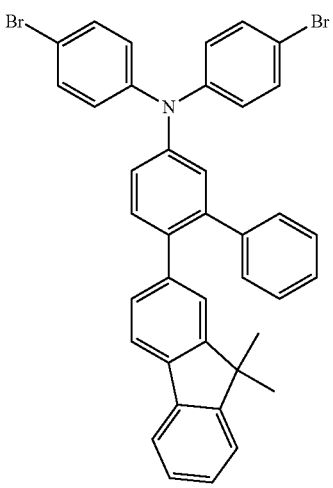

Intermediate 19

The intermediate 19 is a compound obtained by dibromizing the intermediate 18, and is used to polymerize the intermediate 18 that is a unit compound for introducing the structural unit A.

First, 4.4 g of intermediate 18 synthesized above and 60 ml of tetrahydrofuran were placed in a reaction vessel whose internal air was replaced with nitrogen. Then, at room temperature, 3.1 g of N-bromosuccinimide was added, and the mixture was stirred for 5 hours.

Then, 120 ml of water was added, and the mixture was filtered to extract a precipitated solid. The obtained solid was washed with methanol, and 5.6 g (with a yield of 97%) of a white powder of intermediate 19 was thereby obtained.

<Synthesis of Intermediate 20>

[Chem. 23]

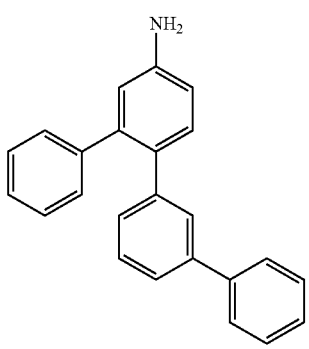

Intermediate 20

The intermediate 20 is an intermediate compound used to introduce the structural unit A included in the high molecular weight compound according to the present invention.

The following components were placed in a reaction vessel whose internal air was replaced with nitrogen, and nitrogen gas was passed through the reaction vessel for 30 minutes:

6.2 g of 3-biphenylboronic acid;
7.0 g of intermediate 3;
72 ml of toluene;
18 ml of ethanol; and
22 ml of aqueous solution of 2M-potassium carbonate.

Then, 1.0 g of tetrakis(triphenylphosphine)palladium(0) was added, and the mixture was heated and stirred at 75° C. for 5 hours.

After the mixture was cooled down to room temperature, a saturated saline solution and toluene were added, and a separation operation was performed to extract an organic layer. The organic layer was dehydrated using magnesium sulfate anhydrous, and then concentrated under reduced pressure to obtain a crude product. The obtained crude product was washed with methanol, and 6.5 g (with a yield of 72%) of a whitish solid of intermediate 20 was thereby obtained.

<Synthesis of Intermediate 21>

[Chem. 24]

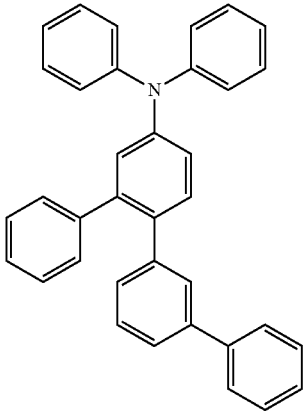

Intermediate 21

The intermediate 21 is an intermediate compound used to introduce the structural unit A included in the high molecular weight compound according to the present invention.

The following components were placed in a reaction vessel whose internal air was replaced with nitrogen:

6.4 g of intermediate 20;
9.0 g of iodobenzene;
5.7 g of sodium-t-butoxide; and
33 ml of xylene.

Then, 0.4 g of copper(I) iodide and 0.4 g of N,N'-dimethylethylenediamine were added, and the mixture was heated and stirred at 125° C. for 15 hours.

After the mixture was cooled down to room temperature, 240 ml of toluene was added, and the mixture was stirred for 1 hour and filtered. The filtrate was concentrated under reduced pressure to obtain a crude product. The obtained crude product was purified through column chromatography (toluene/n-hexane=1/9), and 8.3 g (with a yield of 88%) of a whitish solid of intermediate 21 was thereby obtained.

<Synthesis of Intermediate 22>

[Chem. 25]

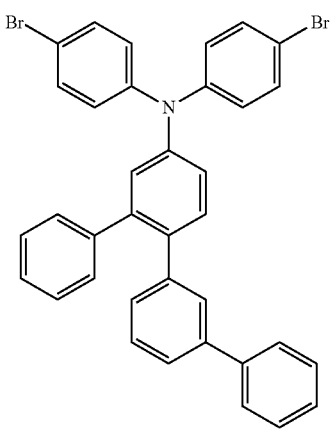

Intermediate 22

The intermediate 22 is a compound obtained by dibromizing the intermediate 21, and is used to polymerize the intermediate 21 that is a unit compound for introducing the structural unit A.

First, 8.2 g of intermediate 21 synthesized above and 125 ml of tetrahydrofuran were placed in a reaction vessel whose internal air was replaced with nitrogen. Then, at room temperature, 6.2 g of N-bromosuccinimide was added, and the mixture was stirred for 4 hours.

Then, 250 ml of water was added, and the mixture was filtered to extract a precipitated solid. The obtained solid was washed with methanol, and 10.6 g (with a yield of 97%) of a white solid of intermediate 22 was thereby obtained.

<Synthesis of Intermediate 23>

[Chem. 26]

Intermediate 23

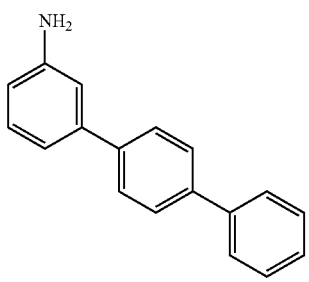

The intermediate 23 is an intermediate compound used to introduce the structural unit A included in the high molecular weight compound according to the present invention.

The following components were placed in a reaction vessel whose internal air was replaced with nitrogen, and nitrogen gas was passed through the reaction vessel for 30 minutes:

19.0 g of 4-biphenylboronic acid;
15.0 g of 3-bromoaniline;
144 ml of toluene;
36 ml of ethanol; and
67 ml of aqueous solution of 2M-potassium carbonate.

Then, 3.0 g of tetrakis(triphenylphosphine)palladium(0) was added, and the mixture was heated and stirred at 75° C. for 5 hours.

After the mixture was cooled down to room temperature, the mixture was filtered to extract a precipitated solid. The obtained solid was washed with methanol. The obtained crude product was purified through column chromatography (toluene), and 13.1 g (with a yield of 61%) of a whitish solid of intermediate 23 was thereby obtained.

<Synthesis of Intermediate 24>

[Chem. 27]

Intermediate 24

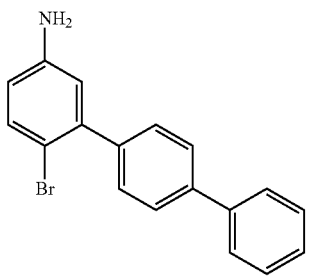

The intermediate 24 is an intermediate compound used to introduce the structural unit A included in the high molecular weight compound according to the present invention.

First, 11.0 g of intermediate 23 and 170 ml of N,N-dimethylformamide were placed in a reaction vessel whose internal air was replaced with nitrogen. Then, at room temperature, 8.0 g of N-bromosuccinimide was added, and the mixture was stirred for 2 hours.

Then, water and toluene were added, and a separation operation was performed to extract an organic layer. The organic layer was dehydrated using magnesium sulfate anhydrous, and then concentrated under reduced pressure to obtain a crude product. The obtained crude product was purified through column chromatography (chloroform/n-hexane=1/1), and 8.1 g (with a yield of 59%) of a whitish solid of intermediate 24 was thereby obtained.

<Synthesis of Intermediate 25>

[Chem. 28]

Intermediate 25

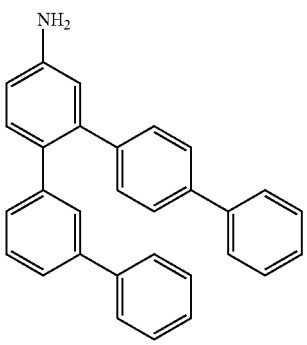

The intermediate 25 is an intermediate compound used to introduce the structural unit A included in the high molecular weight compound according to the present invention.

The following components were placed in a reaction vessel whose internal air was replaced with nitrogen, and nitrogen gas was passed through the reaction vessel for 30 minutes:

2.2 g of 3-biphenylboronic acid;
3.3 g of intermediate 24;
34 ml of toluene;
9 ml of ethanol; and
8 ml of aqueous solution of 2M-potassium carbonate.

Then, 0.4 g of tetrakis(triphenylphosphine)palladium(0) was added, and the mixture was heated and stirred at 71° C. for 10 hours.

After the mixture was cooled down to room temperature, a saturated saline solution and toluene were added, and a separation operation was performed to extract an organic layer. The organic layer was dehydrated using magnesium sulfate anhydrous, and then concentrated under reduced pressure to obtain a crude product. The obtained crude product was purified through column chromatography (toluene), and 2.9 g (with a yield of 71%) of a pale yellow amorphous solid of intermediate 25 was thereby obtained.

<Synthesis of Intermediate 26>

[Chem. 29]

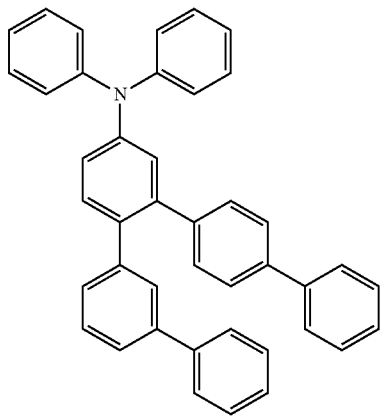

Intermediate 26

The intermediate 26 is an intermediate compound used to introduce the structural unit A included in the high molecular weight compound according to the present invention.

The following components were placed in a reaction vessel whose internal air was replaced with nitrogen:

2.8 g of intermediate 25;

3.2 g of iodobenzene;

2.0 g of sodium-t-butoxide; and 14 ml of xylene.

Then, 0.1 g of copper(I) iodide and 0.1 g of N,N'-dimethylethylenediamine were added, and the mixture was heated and stirred at 125° C. for 14 hours.

After the mixture was cooled down to room temperature, 100 ml of toluene was added, and the mixture was stirred for 1 hour and filtered. The filtrate was concentrated under reduced pressure to obtain a crude product. The obtained crude product was purified through column chromatography (toluene/n-hexane=1/9), and 3.1 g (with a yield of 80%) of a whitish solid of intermediate 26 was thereby obtained.

<Synthesis of Intermediate 27>

[Chem. 30]

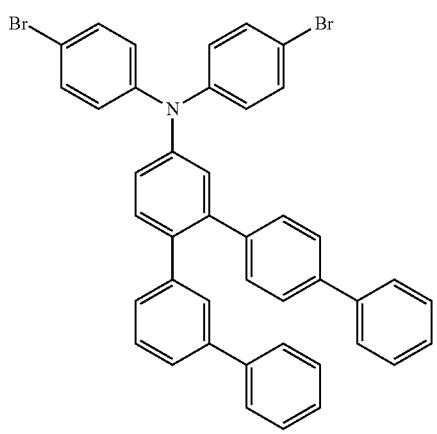

Intermediate 27

The intermediate 27 is a compound obtained by dibromizing the intermediate 26, and is used to polymerize the intermediate 26 that is a unit compound for introducing the structural unit A.

First, 3.0 g of intermediate 26 synthesized above and 45 ml of tetrahydrofuran were placed in a reaction vessel whose internal air was replaced with nitrogen. Then, at room temperature, 2.0 g of N-bromosuccinimide was added, and the mixture was stirred for 4 hours.

Then, 90 ml of water was added, and the mixture was filtered to extract a precipitated solid. The obtained solid was washed with methanol, and 3.6 g (with a yield of 92%) of a white solid of intermediate 27 was thereby obtained.

<Synthesis of Intermediate 28>

[Chem. 31]

Intermediate 28

The intermediate 28 is an intermediate compound used to introduce the structural unit A included in the high molecular weight compound according to the present invention.

The following components were placed in a reaction vessel whose internal air was replaced with nitrogen, and nitrogen gas was passed through the reaction vessel for 30 minutes:

38.1 g of 9,9-dimethylfluorene-2-boronic acid;

25.0 g of 3-bromoaniline;

240 ml of toluene;

60 ml of ethanol; and 111 ml of aqueous solution of 2M-potassium carbonate.

Then, 5.0 g of tetrakis(triphenylphosphine)palladium(0) was added, and the mixture was heated and stirred at 75° C. for 7 hours.

After the mixture was cooled down to room temperature, a saturated saline solution and toluene were added, and a separation operation was performed to extract an organic layer. The organic layer was dehydrated using magnesium sulfate anhydrous, and then concentrated under reduced pressure to obtain a crude product. The obtained crude product was washed with methanol, and 22.4 g (with a yield of 54%) of a whitish solid of intermediate 28 was thereby obtained.

<Synthesis of Intermediate 29>

[Chem. 32]

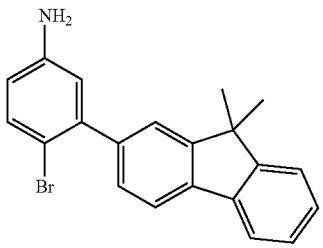

Intermediate 29

The intermediate 29 is an intermediate compound used to introduce the structural unit A included in the high molecular weight compound according to the present invention.

First, 22.3 g of intermediate 28 and 340 ml of N,N-dimethylformamide were placed in a reaction vessel whose internal air was replaced with nitrogen. Then, at room temperature, 13.9 g of N-bromosuccinimide was added, and the mixture was stirred for 3 hours.

Then, water and chloroform were added, and a separation operation was performed to extract an organic layer. The organic layer was dehydrated using magnesium sulfate anhydrous, and then concentrated under reduced pressure to obtain a crude product. The obtained crude product was purified through column chromatography (toluene), and 24.6 g (with a yield of 87%) of a whitish solid of intermediate 29 was thereby obtained.

<Synthesis of Intermediate 30>

[Chem. 33]

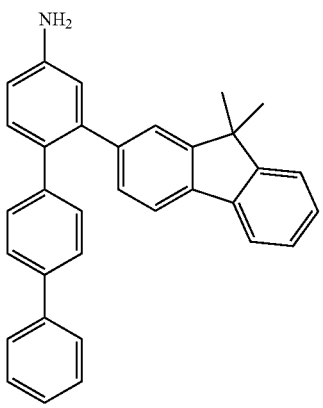

Intermediate 30

The intermediate 30 is an intermediate compound used to introduce the structural unit A included in the high molecular weight compound according to the present invention.

The following components were placed in a reaction vessel whose internal air was replaced with nitrogen, and nitrogen gas was passed through the reaction vessel for 30 minutes:
 4.8 g of 4-biphenylboronic acid;
 8.0 g of intermediate 29;
 84 ml of toluene;
 21 ml of ethanol; and
 17 ml of aqueous solution of 2M-potassium carbonate.

Then, 0.5 g of tetrakis(triphenylphosphine)palladium(0) was added, and the mixture was heated and stirred at 73° C. for 5 hours.

After the mixture was cooled down to room temperature, a saturated saline solution and toluene were added, and a separation operation was performed to extract an organic layer. The organic layer was dehydrated using magnesium sulfate anhydrous, and then concentrated under reduced pressure to obtain a crude product. The obtained crude product was purified through column chromatography (chloroform/n-hexane=1/4), and 8.3 g (with a yield of 77%) of a brown amorphous solid of intermediate 30 was thereby obtained.

<Synthesis of Intermediate 31>

[Chem. 34]

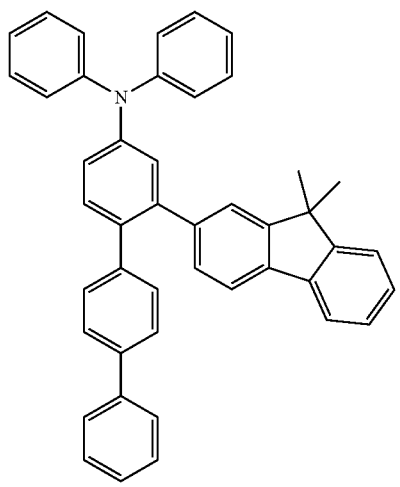

Intermediate 31

The intermediate 31 is an intermediate compound used to introduce the structural unit A included in the high molecular weight compound according to the present invention.

The following components were placed in a reaction vessel whose internal air was replaced with nitrogen:
 8.2 g of intermediate 30;
 8.4 g of iodobenzene;
 5.4 g of sodium-t-butoxide; and
 40 ml of xylene.

Then, 0.4 g of copper(I) iodide and 0.3 g of N,N'-dimethylethylenediamine were added, and the mixture was heated and stirred at 125° C. for 18 hours.

After the mixture was cooled down to room temperature, 250 ml of toluene was added, and the mixture was stirred for 1 hour and filtered. The filtrate was concentrated under reduced pressure to obtain a crude product. The obtained crude product was purified through column chromatography (toluene/n-hexane=1/4), and 4.6 g (with a yield of 41%) of a white amorphous solid of intermediate 31 was thereby obtained.

<Synthesis of Intermediate 32>

[Chem. 35]

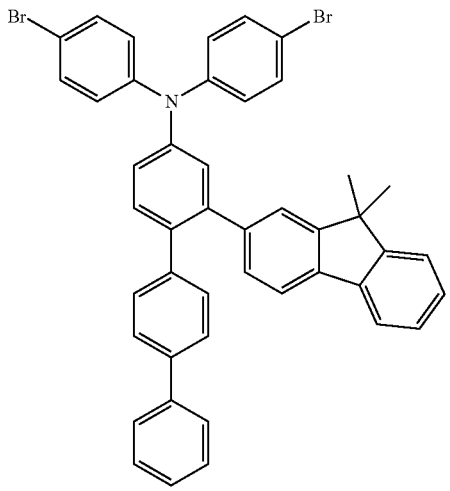

Intermediate 32

The intermediate 32 is a compound obtained by dibromizing the intermediate 31, and is used to polymerize the intermediate 31 that is a unit compound for introducing the structural unit A.

First, 4.4 g of intermediate 31 synthesized above and 65 ml of tetrahydrofuran were placed in a reaction vessel whose internal air was replaced with nitrogen. Then, at room temperature, 2.7 g of N-bromosuccinimide was added, and the mixture was stirred for 5 hours.

Then, 130 ml of water was added, and the mixture was filtered to extract a precipitated solid. The obtained solid was washed with methanol, and 3.9 g (with a yield of 70%) of a white solid of intermediate 32 was thereby obtained.

<Synthesis of Intermediate 33>

[Chem. 36]

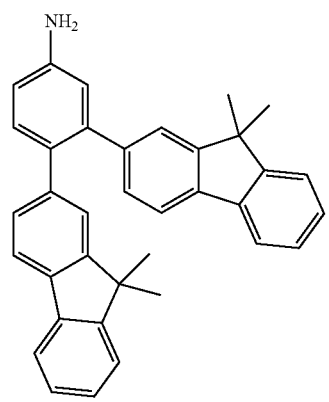

Intermediate 33

The intermediate 33 is an intermediate compound used to introduce the structural unit A included in the high molecular weight compound according to the present invention.

The following components were placed in a reaction vessel whose internal air was replaced with nitrogen, and nitrogen gas was passed through the reaction vessel for 30 minutes:

4.9 g of 9,9-dimethylfluorene-2-boronic acid;

7.7 g of intermediate 29;

84 ml of toluene;

21 ml of ethanol; and 16 ml of aqueous solution of 2M-potassium carbonate.

Then, 0.5 g of tetrakis(triphenylphosphine)palladium(0) was added, and the mixture was heated and stirred at 73° C. for 6 hours.

After the mixture was cooled down to room temperature, a saturated saline solution and toluene were added, and a separation operation was performed to extract an organic layer. The organic layer was dehydrated using magnesium sulfate anhydrous, and then concentrated under reduced pressure to obtain a crude product. The obtained crude product was purified through column chromatography (ethyl acetate/n-hexane=1/4), and 7.7 g (with a yield of 70%) of a pale yellow solid of intermediate 33 was thereby obtained.

<Synthesis of Intermediate 34>

[Chem. 37]

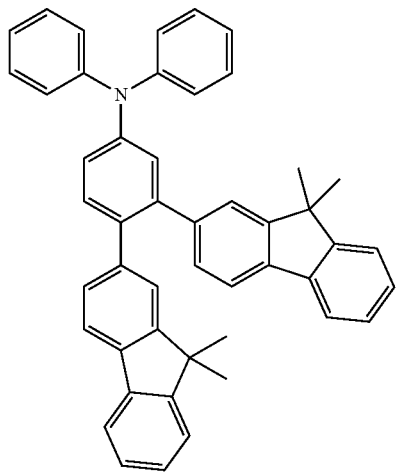

Intermediate 34

The intermediate 34 is an intermediate compound used to introduce the structural unit A included in the high molecular weight compound according to the present invention.

The following components were placed in a reaction vessel whose internal air was replaced with nitrogen:

7.6 g of intermediate 33;

7.1 g of iodobenzene;

4.6 g of sodium-t-butoxide; and 38 ml of xylene.

Then, 0.3 g of copper(I) iodide and 0.3 g of N,N'-dimethylethylenediamine were added, and the mixture was heated and stirred at 125° C. for 28 hours.

After the mixture was cooled down to room temperature, 250 ml of toluene was added, and the mixture was stirred for 1 hour and filtered. The filtrate was concentrated under reduced pressure to obtain a crude product. The obtained crude product was purified through column chromatography (toluene/n-hexane=1/9), and 2.9 g (with a yield of 29%) of a whitish solid of intermediate 34 was thereby obtained.

<Synthesis of Intermediate 35>

[Chem. 38]

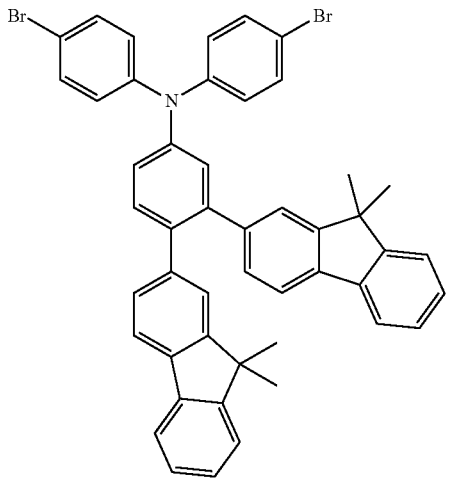

Intermediate 35

The intermediate 35 is a compound obtained by dibromizing the intermediate 34, and is used to polymerize the intermediate 34 that is a unit compound for introducing the structural unit A.

First, 2.7 g of intermediate 34 synthesized above and 60 ml of tetrahydrofuran were placed in a reaction vessel whose internal air was replaced with nitrogen. Then, at room temperature, 1.6 g of N-bromosuccinimide was added, and the mixture was stirred for 5 hours.

Then, water and toluene were added, and a separation operation was performed to extract an organic layer. The organic layer was dehydrated using magnesium sulfate anhydrous, and then concentrated under reduced pressure to obtain a crude product. The obtained crude product was dispersed in and washed with methanol, and 3.1 g (with a yield of 99%) of a white solid of intermediate 35 was thereby obtained.

<Synthesis of Intermediate 36>

[Chem. 39]

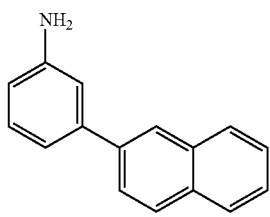

Intermediate 36

The intermediate 36 is an intermediate compound used to introduce the structural unit A included in the high molecular weight compound according to the present invention.

The following components were placed in a reaction vessel whose internal air was replaced with nitrogen, and nitrogen gas was passed through the reaction vessel for 30 minutes:
  55.0 g of naphthalene-2-boronic acid;
  50.0 g of 3-bromoaniline;
  480 ml of toluene;
  120 ml of ethanol; and
  223 ml of aqueous solution of 2M-potassium carbonate.

Then, 1.7 g of tetrakis(triphenylphosphine)palladium(0) was added, and the mixture was heated and stirred at 75° C. for 7 hours.

After the mixture was cooled down to room temperature, a saturated saline solution and toluene were added, and a separation operation was performed to extract an organic layer. The organic layer was dehydrated using magnesium sulfate anhydrous, and then concentrated under reduced pressure to obtain a crude product. The obtained crude product was washed with hexane, and 55.5 g (with a yield of 87%) of a whitish solid of intermediate 36 was thereby obtained.

<Synthesis of Intermediate 37>

[Chem. 40]

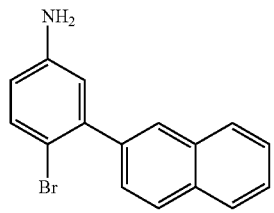

Intermediate 37

The intermediate 37 is an intermediate compound used to introduce the structural unit A included in the high molecular weight compound according to the present invention.

First, 55.4 g of intermediate 36 and 554 ml of N,N-dimethylformamide were placed in a reaction vessel whose internal air was replaced with nitrogen. Then, at room temperature, 45.0 g of N-bromosuccinimide was added, and the mixture was stirred for 4 hours.

Then, water and toluene were added, and a separation operation was performed to extract an organic layer. The organic layer was dehydrated using magnesium sulfate anhydrous, and then concentrated under reduced pressure to obtain a crude product. The obtained crude product was purified through column chromatography (toluene), and 51.1 g (with a yield of 66%) of a red-brown oil of intermediate 37 was thereby obtained.

<Synthesis of Intermediate 38>

[Chem. 41]

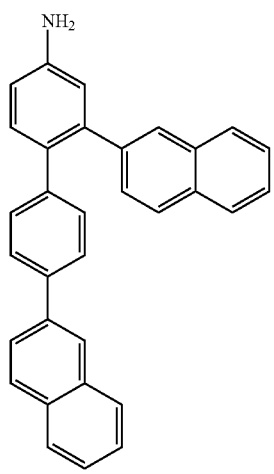

Intermediate 38

The intermediate 38 is an intermediate compound used to introduce the structural unit A included in the high molecular weight compound according to the present invention.

The following components were placed in a reaction vessel whose internal air was replaced with nitrogen, and nitrogen gas was passed through the reaction vessel for 30 minutes:
- 6.4 g of intermediate 37;
- 7.6 g of intermediate 7;
- 55 ml of toluene;
- 14 ml of ethanol; and
- 16 ml of aqueous solution of 2M-potassium carbonate.

Then, 0.2 g of tetrakis(triphenylphosphine)palladium(0) was added, and the mixture was heated and stirred at 73° C. for 10 hours.

After the mixture was cooled down to room temperature, a saturated saline solution and toluene were added, and a separation operation was performed to extract an organic layer. The organic layer was dehydrated using magnesium sulfate anhydrous, and then concentrated under reduced pressure, 6.0 g (with a yield of 69%) of an orange solid of intermediate 38 was thereby obtained.

<Synthesis of Intermediate 39>

[Chem. 42]

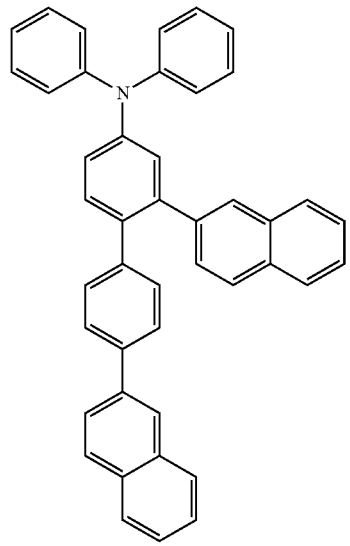

Intermediate 39

The intermediate 39 is an intermediate compound used to introduce the structural unit A included in the high molecular weight compound according to the present invention.

The following components were placed in a reaction vessel whose internal air was replaced with nitrogen:
- 6.0 g of intermediate 38;
- 6.3 g of iodobenzene;
- 4.1 g of sodium-t-butoxide; and
- 30 ml of xylene.

Then, 0.3 g of copper(I) iodide and 0.3 g of N,N'-dimethylethylenediamine were added, and the mixture was heated and stirred at 125° C. for 17 hours.

After the mixture was cooled down to room temperature, 190 ml of toluene was added, and the mixture was stirred for 1 hour and filtered. The filtrate was concentrated under reduced pressure to obtain a crude product. The obtained crude product was purified through column chromatography (toluene/n-hexane=1/9), and 4.4 g (with a yield of 54%) of a white solid of intermediate 39 was thereby obtained.

<Synthesis of Intermediate 40>

[Chem. 43]

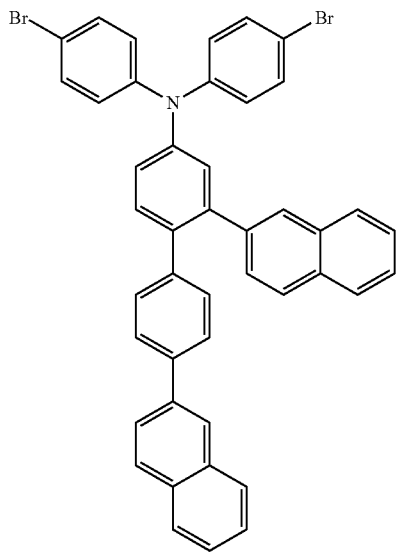

Intermediate 40

The intermediate 40 is a compound obtained by dibromizing the intermediate 39, and is used to polymerize the intermediate 39 that is a unit compound for introducing the structural unit A.

First, 4.3 g of intermediate 39 synthesized above and 100 ml of tetrahydrofuran were placed in a reaction vessel whose internal air was replaced with nitrogen. Then, at room temperature, 2.6 g of N-bromosuccinimide was added, and the mixture was stirred for 8 hours.

Then, water and toluene were added, and a separation operation was performed to extract an organic layer. The organic layer was dehydrated using magnesium sulfate anhydrous, and then concentrated under reduced pressure to obtain a crude product. The obtained crude product was washed with methanol, and 4.8 g (with a yield of 89%) of a white solid of intermediate 40 was thereby obtained.

<Synthesis of Intermediate 41>

[Chem. 44]

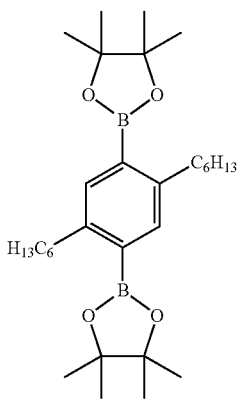

Intermediate 41

The intermediate 41 is an intermediate compound for introducing the structural unit B.

The following components were placed in a reaction vessel whose internal air was replaced with nitrogen, and nitrogen gas was passed through the reaction vessel for 30 minutes:

10.0 g of 1,4-dibromo-2,5-bis(n-hexyl)benzene;
13.8 g of bis(pinacolato)diboron;
7.3 g of potassium acetate; and
100 ml of 1,4-dioxane.

Then, 0.4 g of {1,1'-bis(diphenylphosphino)ferrocene}palladium(II)dichloride dichloromethane adduct was added, and the mixture was heated and stirred at 90° C. for 10 hours.

After the mixture was cooled down to room temperature, a saturated saline solution and toluene were added, and a separation operation was performed to extract an organic layer. The organic layer was dehydrated using magnesium sulfate anhydrous, and then concentrated under reduced pressure to obtain a crude product. The obtained crude product was washed with methanol, and 10.7 g (with a yield of 99%) of a whitish solid of intermediate 41 was thereby obtained.

Example 1

Synthesis of High Molecular Weight Compound A

The following components were placed in a reaction vessel whose internal air was replaced with nitrogen, and nitrogen gas was passed through the reaction vessel for 30 minutes:

2.9 g of 2,7-bis(4,4,5,5-tetramethyl-1,3,2-dioxaborolane-2-yl)-9,9-di-n-octylfluorene;

2.0 g of intermediate 2;
0.4 g of N,N-bis(4-bromophenyl)-N-(benzocyclobutene-4-yl)-amine;
4.0 g of tripotassium phosphate;
9 ml of toluene;
5 ml of water; and
27 ml of 1,4-dioxane.

Then, 3.3 mg of palladium(II) acetate and 26.7 mg of tri-o-tolylphosphine were added, and the mixture was heated and stirred at 86° C. for 6.5 hours.

Then, 52 mg of 2,7-bis(4,4,5,5-tetramethyl-1,3,2-dioxaborolane-2-yl)-9,9-di-n-octylfluorene was added and the mixture was stirred for 0.5 hours, and then 140 mg of bromobenzene was added and the mixture was stirred for 0.5 hours.

Then, 80 ml of toluene and 80 ml of 5 wt % aqueous solution of sodium N,N-diethyldithiocarbamate were added, and the mixture was heated and stirred under reflux for 2 hours.

After the mixture was cooled down to room temperature, a saturated saline solution and toluene were added, and a separation operation was performed to extract an organic layer. The organic layer was dehydrated using magnesium sulfate anhydrous, and then concentrated under reduced pressure to obtain a crude polymer. The crude polymer was dissolved in toluene and adsorbed and purified by adding a silica gel, and then the silica gel was removed through filtering. The obtained filtrate was concentrated under reduced pressure, 50 ml of tetrahydrofuran was added to a dried solid to dissolve the dried solid, the resultant was dripped into 400 ml of methanol, and a precipitate was obtained through filtering. This operation was repeated twice, and the resultant was dried to obtain 2.9 g (with a yield of 84%) of high molecular weight compound A.

Figure 58:
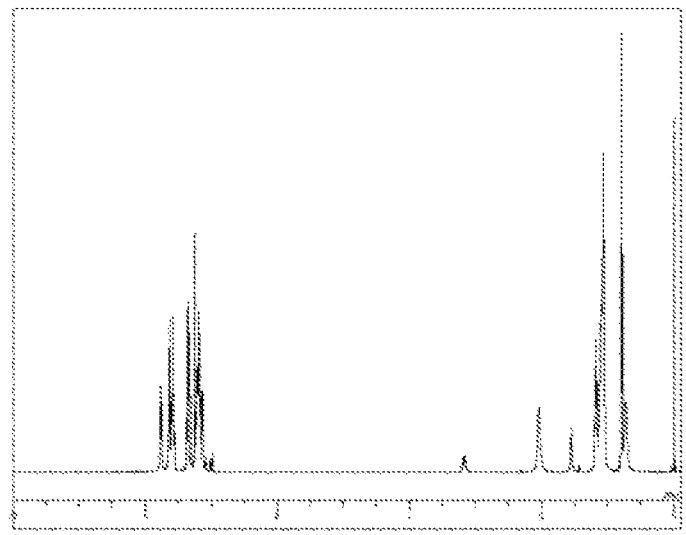
FIG. 58 The diagram showing a $^1$H-NMR chart of a high molecular weight compound (compound A) according to the present invention synthesized in Example 1.

The obtained high molecular weight compound A was subjected to NMR measurement. FIG. 58 shows the result of $^1$H-NMR measurement.

The average molecular weight measured using GPC, the degree of dispersion, and the chemical composition of the high molecular weight compound were as follows.

Number average molecular weight Mn (on a polystyrene conversion basis): 42,000

Weight average molecular weight Mw (on a polystyrene conversion basis): 116,000

Degree of dispersion (Mw/Mn): 2.8

Chemical Composition:

[Chem. 45]

(High Molecular Weight Compound A)

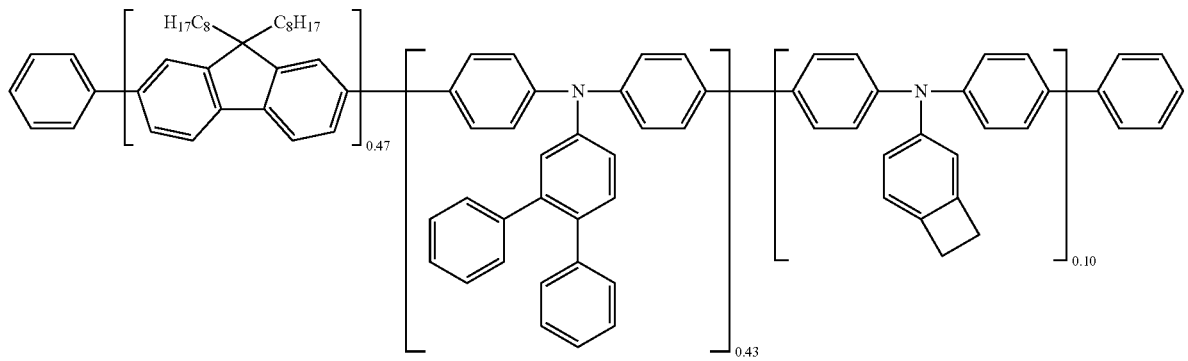

As can be understood from the chemical composition given above, the high molecular weight compound A contained 43 mol % of structural unit A represented by the general formula (1), 47 mol % of structural unit B for improving the solubility in an organic solvent, and 10 mol % of structural unit C for improving thermal crosslinkability.

Example 2

Synthesis of High Molecular Weight Compound B

The following components were placed in a reaction vessel whose internal air was replaced with nitrogen, and nitrogen gas was passed through the reaction vessel for 30 minutes:

3.6 g of 2,7-bis(4,4,5,5-tetramethyl-1,3,2-dioxaborolane-2-yl)-9,9-di-n-octylfluorene;
2.8 g of intermediate 6;
0.5 g of N,N-bis(4-bromophenyl)-N-(benzocyclobutene-4-yl)-amine;
5.0 g of tripotassium phosphate;

Number average molecular weight Mn (on a polystyrene conversion basis): 70,000
Weight average molecular weight Mw (on a polystyrene conversion basis): 427,000
Degree of dispersion (Mw/Mn): 6.1
Chemical Composition:

[Chem. 46]

(High Molecular Weight Compound B)

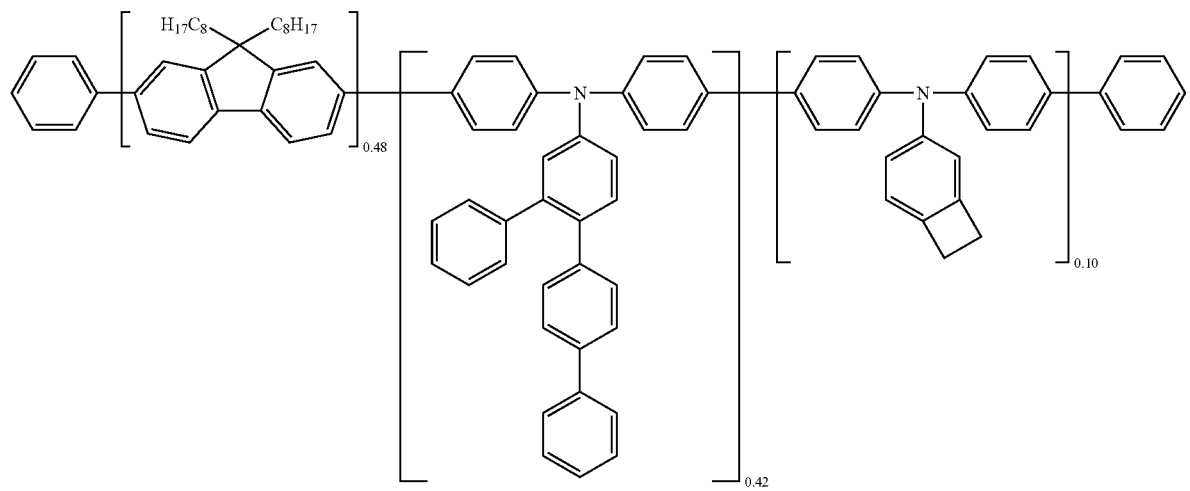

Figure 59:
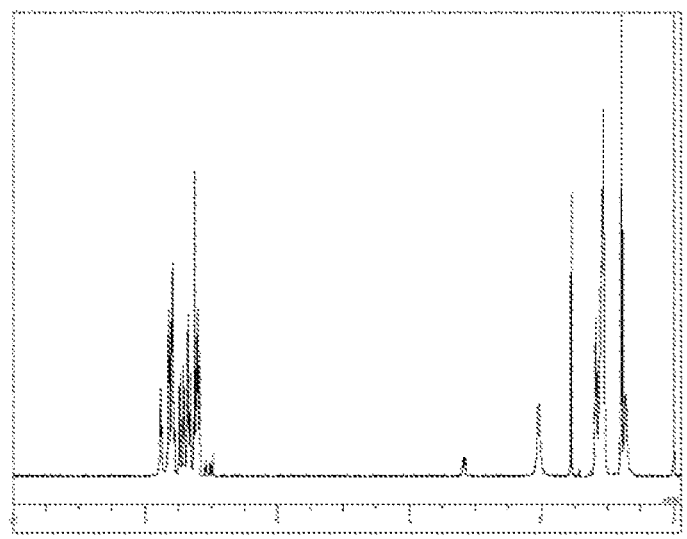
FIG. 59 The diagram showing a $^1$H-NMR chart of a high molecular weight compound (compound B) according to the present invention synthesized in Example 2.

13 ml of toluene;
7 ml of water; and
39 ml of 1,4-dioxane.
Then, 2.0 mg of palladium(II) acetate and 16.7 mg of tri-o-tolylphosphine were added, and the mixture was heated and stirred at 85° C. for 6 hours.
Then, 65 mg of 2,7-bis(4,4,5,5-tetramethyl-1,3,2-dioxaborolane-2-yl)-9,9-di-n-octylfluorene was added and the mixture was stirred for 1 hour, and then 180 mg of bromobenzene was added and the mixture was stirred for 1 hour.
Then, 100 ml of toluene and 100 ml of 5 wt % aqueous solution of sodium N,N-diethyldithiocarbamate were added, and the mixture was heated and stirred under reflux for 2 hours.
After the mixture was cooled down to room temperature, a saturated saline solution and toluene were added, and a separation operation was performed to extract an organic layer. The organic layer was dehydrated using magnesium sulfate anhydrous, and then concentrated under reduced pressure to obtain a crude polymer. The crude polymer was dissolved in toluene and adsorbed and purified by adding a silica gel, and then the silica gel was removed through filtering. The obtained filtrate was concentrated under reduced pressure, 150 ml of tetrahydrofuran was added to a dried solid to dissolve the dried solid, the resultant was dripped into 300 ml of methanol, and a precipitate was obtained through filtering. This operation was repeated twice, and the resultant was dried to obtain 4.5 g (with a yield of 96%) of high molecular weight compound B.
The obtained high molecular weight compound B was subjected to NMR measurement. FIG. 59 shows the result of $^1$H-NMR measurement.
The average molecular weight measured using GPC, the degree of dispersion, and the chemical composition of the high molecular weight compound were as follows.

As can be understood from the chemical composition given above, the high molecular weight compound A contained 42 mol % of structural unit A represented by the general formula (1), 48 mol % of structural unit B for improving the solubility in an organic solvent, and 10 mol % of structural unit C for improving thermal crosslinkability.

Example 3

Synthesis of High Molecular Weight Compound C
The following components were placed in a reaction vessel whose internal air was replaced with nitrogen, and nitrogen gas was passed through the reaction vessel for 30 minutes:
6.5 g of 2,7-bis(4,4,5,5-tetramethyl-1,3,2-dioxaborolane-2-yl)-9,9-di-n-octylfluorene;
5.5 g of intermediate 10;
0.87 g of N,N-bis(4-bromophenyl)-N-(benzocyclobutene-4-yl)-amine;
9.0 g of tripotassium phosphate;
16 ml of toluene;
9 ml of water; and
48 ml of 1,4-dioxane.
Then, 1.9 mg of palladium(II) acetate and 15.0 mg of tri-o-tolylphosphine were added, and the mixture was heated and stirred at 88° C. for 10 hours.
Then, 22 mg of phenylboronic acid was added and the mixture was stirred for 1 hour, and then 0.32 g of bromobenzene was added and the mixture was stirred for 1 hour.
Then, 100 ml of toluene and 100 ml of 5 wt % aqueous solution of sodium N,N-diethyldithiocarbamate were added, and the mixture was heated and stirred under reflux for 2 hours.
After the mixture was cooled down to room temperature, a saturated saline solution and toluene were added, and a separation operation was performed to extract an organic layer. The organic layer was dehydrated using magnesium sulfate anhydrous, and then concentrated under reduced pressure to obtain a crude polymer. The crude polymer was dissolved in toluene and adsorbed and purified by adding a silica gel, and then the silica gel was removed through filtering. The obtained filtrate was concentrated under reduced pressure, 300 ml of toluene was added to a dried solid to dissolve the dried solid, the resultant was dripped into 600 ml of n-hexane, and a precipitate was obtained through filtering. This operation was repeated three times, and the resultant was dried to obtain 8.0 g (with a yield of 92%) of high molecular weight compound C.

Figure 60:
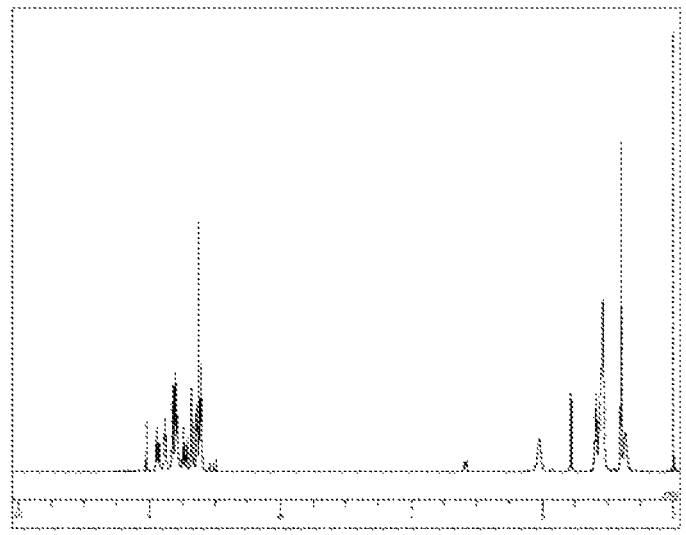
FIG. 60 The diagram showing a $^1$H-NMR chart of a high molecular weight compound (compound C) according to the present invention synthesized in Example 3.

The obtained high molecular weight compound C was subjected to NMR measurement. FIG. 60 shows the result of ¹H-NMR measurement.

The average molecular weight measured using GPC, the degree of dispersion, and the chemical composition of the high molecular weight compound were as follows.

Number average molecular weight Mn (on a polystyrene conversion basis): 45,000

Weight average molecular weight Mw (on a polystyrene conversion basis): 97,000

Degree of dispersion (Mw/Mn): 2.1

Chemical Composition:

3.7 g of intermediate 13;
2.5 g of intermediate 10;
0.4 g of N,N-bis(4-bromophenyl)-N-(benzocyclobutene-4-yl)-amine;
4.1 g of tripotassium phosphate;
9 ml of toluene;
5 ml of water; and
27 ml of 1,4-dioxane.

Then, 1.7 mg of palladium(II) acetate and 13.6 mg of tri-o-tolylphosphine were added, and the mixture was heated and stirred at 88° C. for 10 hours.

Then, 67 mg of intermediate 13 was added and the mixture was stirred for 1 hour, and then 0.14 g of bromobenzene was added and the mixture was stirred for 1 hour.

Then, 50 ml of toluene and 50 ml of 5 wt % aqueous solution of sodium N,N-diethyldithiocarbamate were added, and the mixture was heated and stirred under reflux for 2 hours.

After the mixture was cooled down to room temperature, a saturated saline solution and toluene were added, and a separation operation was performed to extract an organic layer. The organic layer was dehydrated using magnesium sulfate anhydrous, and then concentrated under reduced pressure to obtain a crude polymer. The crude polymer was dissolved in toluene and adsorbed and purified by adding a

[Chem. 47]

(High Molecular Weight Compound C)

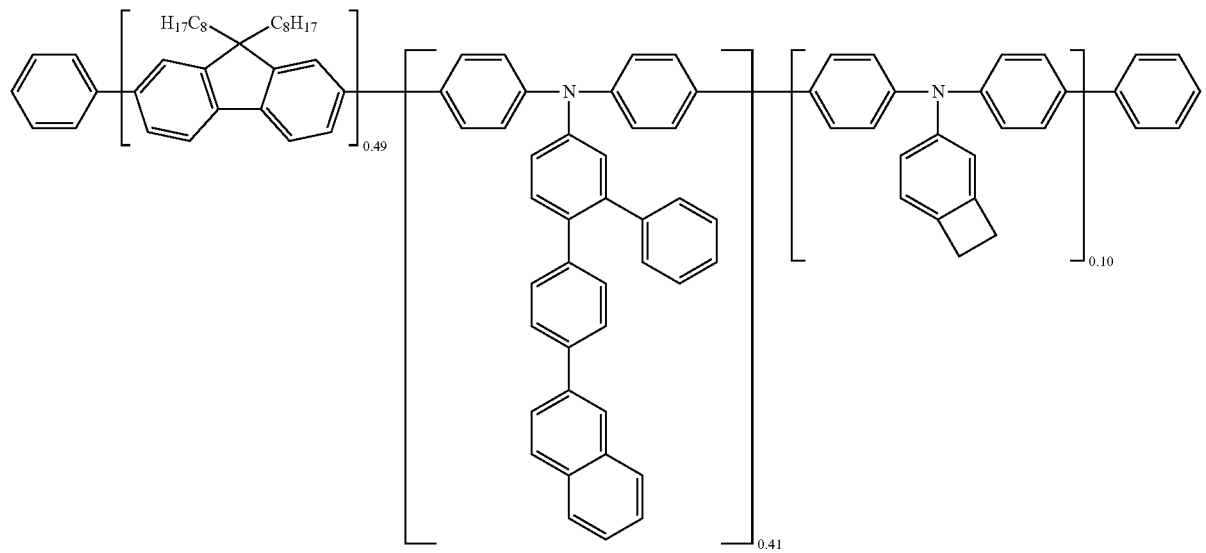

As can be understood from the chemical composition given above, the high molecular weight compound A contained 41 mol % of structural unit A represented by the general formula (1), 49 mol % of structural unit B for improving the solubility in an organic solvent, and 10 mol % of structural unit C for improving thermal crosslinkability.

Example 4

Synthesis of High Molecular Weight Compound D

The following components were placed in a reaction vessel whose internal air was replaced with nitrogen, and nitrogen gas was passed through the reaction vessel for 30 minutes:

silica gel, and then the silica gel was removed through filtering. The obtained filtrate was concentrated under reduced pressure, 150 ml of toluene was added to a dried solid to dissolve the dried solid, the resultant was dripped into n-hexane 150 ml, and a precipitate was obtained through filtering. This operation was repeated three times, and the resultant was dried to obtain 3.9 g (with a yield of 87%) of high molecular weight compound D.

Figure 61:
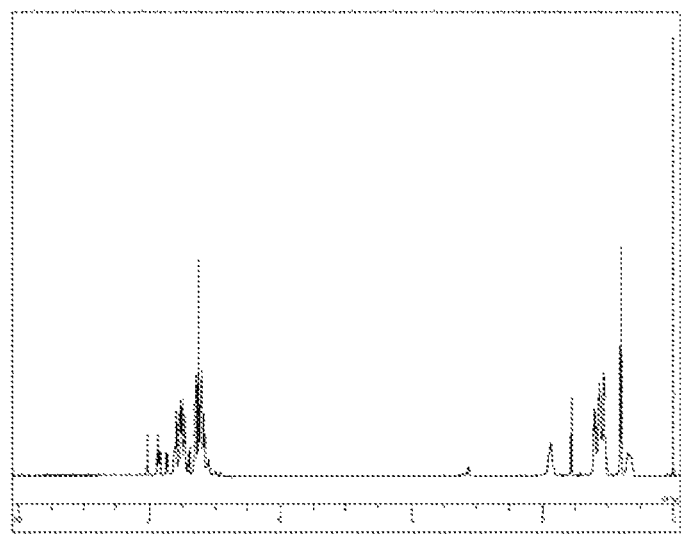
FIG. 61 The diagram showing a $^1$H-NMR chart of a high molecular weight compound (compound D) according to the present invention synthesized in Example 4.

The obtained high molecular weight compound D was subjected to NMR measurement. FIG. 61 shows the result of ¹H-NMR measurement.

The average molecular weight measured using GPC, the degree of dispersion, and the chemical composition of the high molecular weight compound were as follows.

Number average molecular weight Mn (on a polystyrene conversion basis): 51,000

Weight average molecular weight Mw (on a polystyrene conversion basis): 127,000

Degree of dispersion (Mw/Mn): 2.5

Chemical Composition:

[Chem. 48]

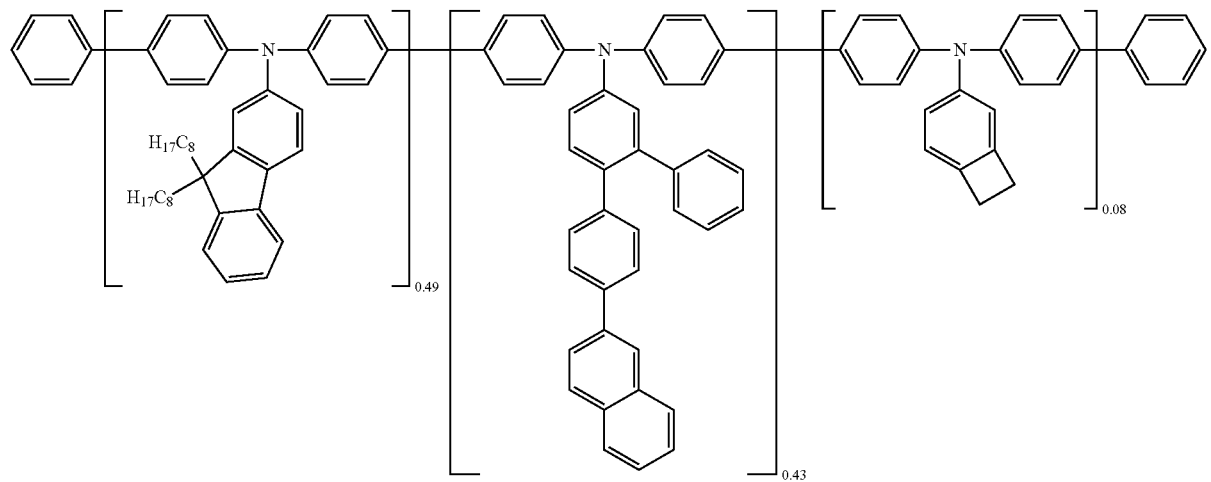

(High Molecular Weight Compound D)

As can be understood from the chemical composition given above, the high molecular weight compound D contained 43 mol % of structural unit A represented by the general formula (1), 49 mol % of structural unit B for improving the solubility in an organic solvent, and 8 mol % of structural unit C for improving thermal crosslinkability.

Example 5

Synthesis of High Molecular Weight Compound E

The following components were placed in a reaction vessel whose internal air was replaced with nitrogen, and nitrogen gas was passed through the reaction vessel for 30 minutes:

4.1 g of 2,7-bis(4,4,5,5-tetramethyl-1,3,2-dioxaborolane-2-yl)-9,9-di-n-octylfluorene;

3.5 g of intermediate 16;

0.55 g of N,N-bis(4-bromophenyl)-N-(benzocyclobutene-4-yl)-amine;

5.7 g of tripotassium phosphate;

16 ml of toluene;

9 ml of water; and 48 ml of 1,4-dioxane.

Then, 2.3 mg of palladium(II) acetate and 19.0 mg of tri-o-tolylphosphine were added, and the mixture was heated and stirred at 86° C. for 8 hours.

Then, 74 mg of 2,7-bis(4,4,5,5-tetramethyl-1,3,2-dioxaborolane-2-yl)-9,9-di-n-octylfluorene was added and the mixture was stirred for 1 hour, and then 0.2 g of bromobenzene was added and the mixture was stirred for 1 hour.

Then, 100 ml of toluene and 100 ml of 5 wt % aqueous solution of sodium N,N-diethyldithiocarbamate were added, and the mixture was heated and stirred under reflux for 2 hours.

After the mixture was cooled down to room temperature, a saturated saline solution and toluene were added, and a separation operation was performed to extract an organic layer. The organic layer was dehydrated using magnesium sulfate anhydrous, and then concentrated under reduced pressure to obtain a crude polymer. The crude polymer was dissolved in toluene and adsorbed and purified by adding a silica gel, and then the silica gel was removed through filtering. The obtained filtrate was concentrated under reduced pressure, 150 ml of tetrahydrofuran was added to a dried solid to dissolve the dried solid, the resultant was dripped into 300 ml of methanol, and a precipitate was obtained through filtering. This operation was repeated twice, and the resultant was dried to obtain 5.2 g (with a yield of 94%) of high molecular weight compound E.

Figure 62:
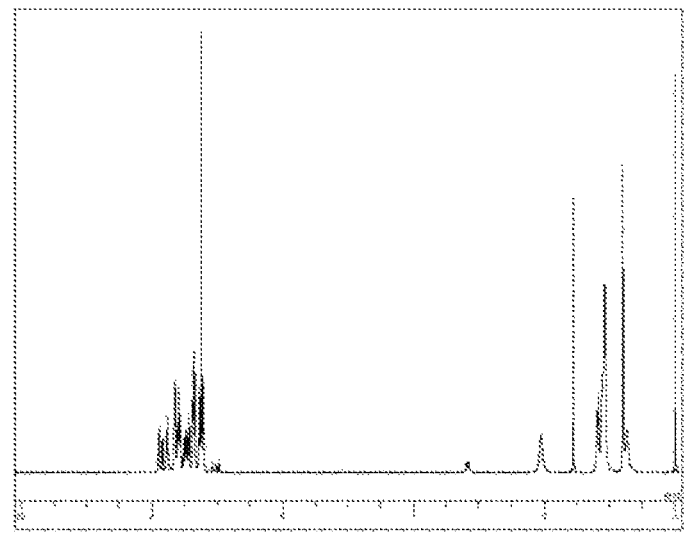
FIG. 62 The diagram showing a $^1$H-NMR chart of a high molecular weight compound (compound E) according to the present invention synthesized in Example 5.

The obtained high molecular weight compound E was subjected to NMR measurement. FIG. 62 shows the result of $^1$H-NMR measurement.

The average molecular weight measured using GPC, the degree of dispersion, and the chemical composition of the high molecular weight compound were as follows.

Number average molecular weight Mn (on a polystyrene conversion basis): 45,000

Weight average molecular weight Mw (on a polystyrene conversion basis): 115,000

Degree of dispersion (Mw/Mn): 2.6

Chemical Composition:

[Chem. 49]

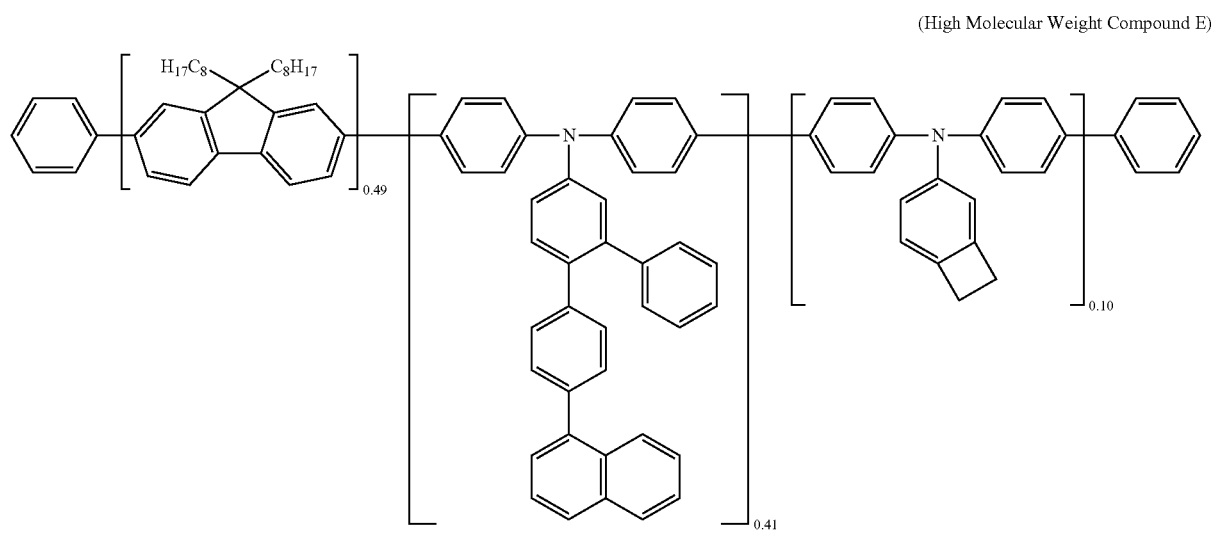

(High Molecular Weight Compound E)

As can be understood from the chemical composition given above, the high molecular weight compound E contained 41 mol % of structural unit A represented by the general formula (1), 49 mol % of structural unit B for improving the solubility in an organic solvent, and 10 mol % of structural unit C for improving thermal crosslinkability.

Example 6

Synthesis of High Molecular Weight Compound F

The following components were placed in a reaction vessel whose internal air was replaced with nitrogen, and nitrogen gas was passed through the reaction vessel for 30 minutes:

6.5 g of 2,7-bis(4,4,5,5-tetramethyl-1,3,2-dioxaborolane-2-yl)-9,9-di-n-octylfluorene;

5.4 g of intermediate 19;

0.87 g of N,N-bis(4-bromophenyl)-N-(benzocyclobutene-4-yl)-amine;

9.0 g of tripotassium phosphate;

16 ml of toluene;

9 ml of water; and 48 ml of 1,4-dioxane.

Then, 1.9 mg of palladium(II) acetate and 115.0 mg of tri-o-tolylphosphine were added, and the mixture was heated and stirred at 86° C. for 10 hours.

Then, 0.12 g of 2,7-bis(4,4,5,5-tetramethyl-1,3,2-dioxaborolane-2-yl)-9,9-di-n-octylfluorene was added and the mixture was stirred for 1 hour, and then 0.32 g of bromobenzene was added and the mixture was stirred for 1 hour.

Then, 100 ml of toluene and 100 ml of 5 wt % aqueous solution of sodium N,N-diethyldithiocarbamate were added, and the mixture was heated and stirred under reflux for 2 hours.

After the mixture was cooled down to room temperature, a saturated saline solution and toluene were added, and a separation operation was performed to extract an organic layer. The organic layer was dehydrated using magnesium sulfate anhydrous, and then concentrated under reduced pressure to obtain a crude polymer. The crude polymer was dissolved in toluene and adsorbed and purified by adding a silica gel, and then the silica gel was removed through filtering. The obtained filtrate was concentrated under reduced pressure, 200 ml of tetrahydrofuran was added to a dried solid to dissolve the dried solid, the resultant was dripped into 400 ml of methanol, and a precipitate was obtained through filtering. This operation was repeated twice, and the resultant was dried to obtain 8.4 g (with a yield of 96%) of high molecular weight compound F.

Figure 63:
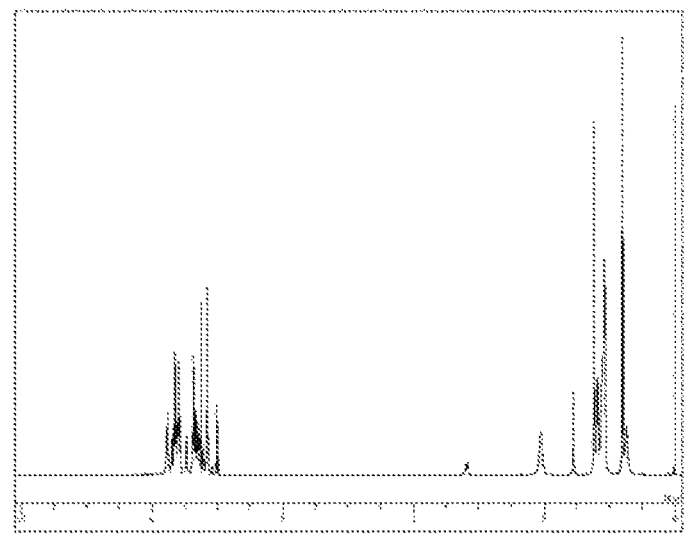
FIG. 63 The diagram showing a $^1$H-NMR chart of a high molecular weight compound (compound F) according to the present invention synthesized in Example 6.

The obtained high molecular weight compound F was subjected to NMR measurement. FIG. 63 shows the result of $^1$H-NMR measurement.

The average molecular weight measured using GPC, the degree of dispersion, and the chemical composition of the high molecular weight compound were as follows.

Number average molecular weight Mn (on a polystyrene conversion basis): 75,000

Weight average molecular weight Mw (on a polystyrene conversion basis): 382,000

Degree of dispersion (Mw/Mn): 5.1

Chemical Composition:

[Chem. 50]

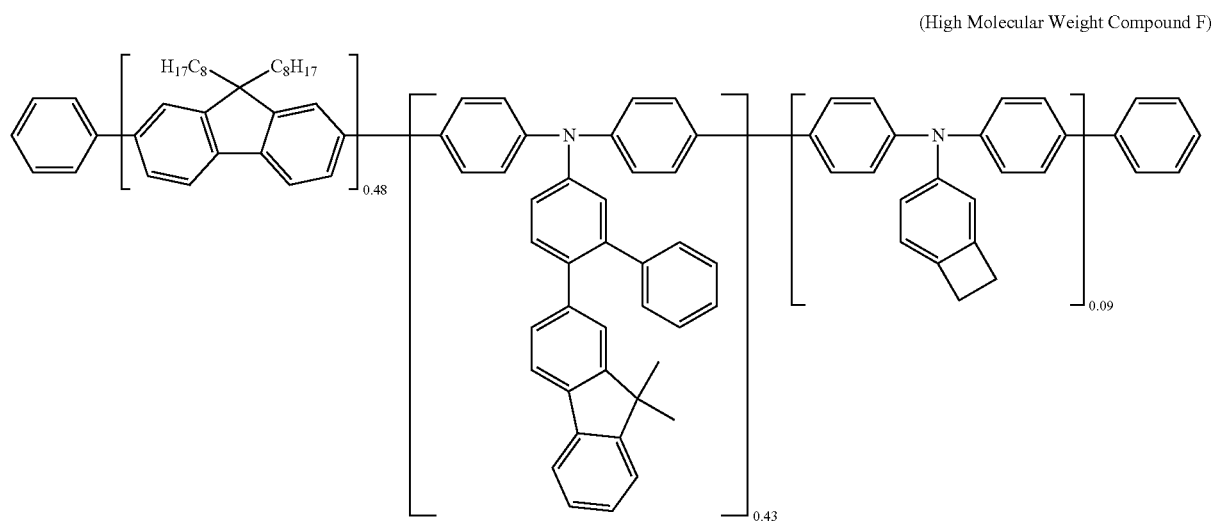

(High Molecular Weight Compound F)

As can be understood from the chemical composition given above, the high molecular weight compound F contained 43 mol % of structural unit A represented by the general formula (1), 48 mol % of structural unit B for improving the solubility in an organic solvent, and 9 mol % of structural unit C for improving thermal crosslinkability.

Example 7

Synthesis of High Molecular Weight Compound G

The following components were placed in a reaction vessel whose internal air was replaced with nitrogen, and nitrogen gas was passed through the reaction vessel for 30 minutes:

6.5 g of 2,7-bis(4,4,5,5-tetramethyl-1,3,2-dioxaborolane-2-yl)-9,9-di-n-octylfluorene;

5.1 g of intermediate 22;

0.9 g of N,N-bis(4-bromophenyl)-N-(benzocyclobutene-4-yl)-amine;

9.0 g of tripotassium phosphate;

16 ml of toluene;

48 ml of 1,4-dioxane; and 9 ml of water.

Then, 2.0 mg of palladium(II) acetate and 16.7 mg of tri-o-tolylphosphine were added, and the mixture was heated and stirred at 85° C. for 7.5 hours. Then, 120 mg of 2,7-bis(4,4,5,5-tetramethyl-1,3,2-dioxaborolane-2-yl)-9,9-di-n-octylfluorene was added and the mixture was stirred for 1 hour, and 320 mg of bromobenzene was added and the mixture was stirred for 1 hour.

Then, 100 ml of toluene and 100 ml of 5 wt % aqueous solution of sodium N,N-diethyldithiocarbamate were added, and the mixture was heated and stirred under reflux for 1 hour.

After the mixture was cooled down to room temperature, a separation operation was performed to extract an organic layer. The organic layer was washed twice with a saturated saline solution. The organic layer was dehydrated using magnesium sulfate anhydrous, and then concentrated under reduced pressure to obtain a crude polymer. The crude polymer was dissolved in toluene and adsorbed and purified by adding a silica gel, and then the silica gel was removed through filtering. The obtained filtrate was concentrated under reduced pressure, 200 ml of tetrahydrofuran was added to a dried solid to dissolve the dried solid, the resultant was dripped into 400 ml of methanol, and a precipitate was obtained through filtering. This operation was repeated twice, and the resultant was dried to obtain 8.0 g (with a yield of 94%) of high molecular weight compound G.

Figure 64:
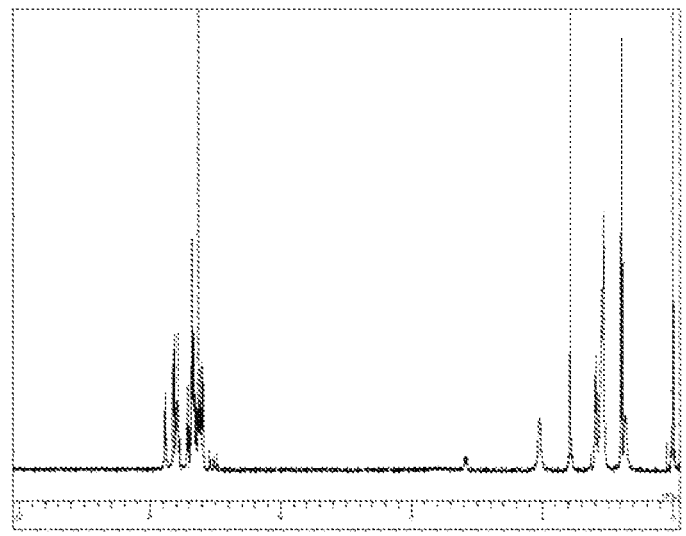
FIG. 64 The diagram showing a $^1$H-NMR chart of a high molecular weight compound (compound G) according to the present invention synthesized in Example 7.

The obtained high molecular weight compound G was subjected to NMR measurement. FIG. 64 shows the result of $^1$H-NMR measurement.

The average molecular weight measured using GPC, the degree of dispersion, and the chemical composition of the high molecular weight compound were as follows.

Average molecular weight Mn (on a polystyrene conversion basis): 52,000

Weight average molecular weight Mw (on a polystyrene conversion basis): 150,000

Degree of dispersion (Mw/Mn): 2.9

Chemical Composition:

[Chem. 51]

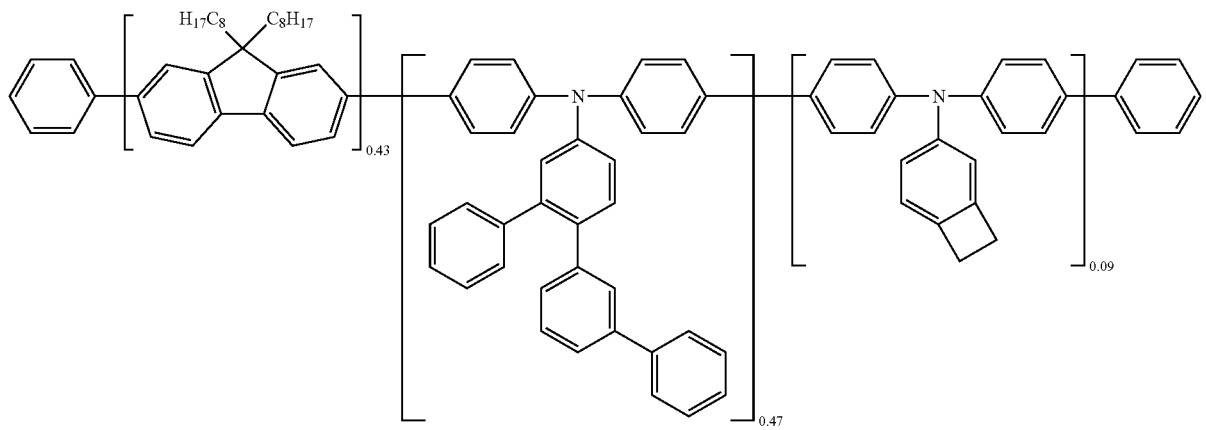

(High Molecular Weight Compound G)

As can be understood from the chemical composition given above, the high molecular weight compound G contained 47 mol % of structural unit A represented by the general formula (1), 43 mol % of structural unit B for improving the solubility in an organic solvent, and 9 mol % of structural unit C for improving thermal crosslinkability.

Example 8

Synthesis of High Molecular Weight Compound H

The following components were placed in a reaction vessel whose internal air was replaced with nitrogen, and nitrogen gas was passed through the reaction vessel for 30 minutes:

3.8 g of 2,7-bis(4,4,5,5-tetramethyl-1,3,2-dioxaborolane-2-yl)-9,9-di-n-octylfluorene;

3.3 g of intermediate 27;

0.5 g of N,N-bis(4-bromophenyl)-N-(benzocyclobutene-4-yl)-amine;

5.3 g of tripotassium phosphate;

10 ml of toluene;

30 ml of 1,4-dioxane; and 5 ml of water.

Then, 1.0 mg of palladium(II) acetate and 8.8 mg of tri-o-tolylphosphine were added, and the mixture was heated and stirred at 85° C. for 10 hours. Then, 70 mg of 2,7-bis(4,4,5,5-tetramethyl-1,3,2-dioxaborolane-2-yl)-9,9-di-n-octylfluorene was added and the mixture was stirred for 1 hour, and 180 mg of bromobenzene was added and the mixture was stirred for 1 hour.

Then, 100 ml of toluene and 100 ml of 5 wt % aqueous solution of sodium N,N-diethyldithiocarbamate were added, and the mixture was heated and stirred under reflux for 1 hour.

After the mixture was cooled down to room temperature, a separation operation was performed to extract an organic layer. The organic layer was washed twice with a saturated saline solution. The organic layer was dehydrated using magnesium sulfate anhydrous, and then concentrated under reduced pressure to obtain a crude polymer. The crude polymer was dissolved in toluene and adsorbed and purified by adding a silica gel, and then the silica gel was removed through filtering. The obtained filtrate was concentrated under reduced pressure, 150 ml of tetrahydrofuran was added to a dried solid to dissolve the dried solid, the resultant was dripped into 300 ml of methanol, and a precipitate was obtained through filtering. This operation was repeated twice, and the resultant was dried to obtain 5.0 g (with a yield of 94%) of high molecular weight compound H.

Figure 65:
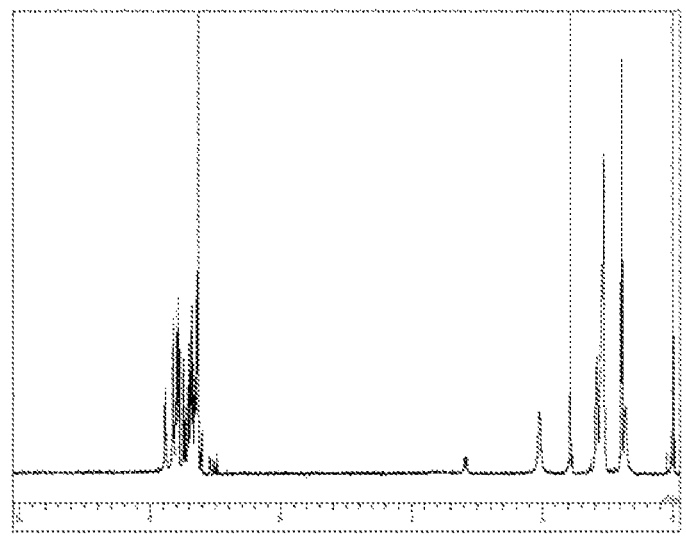
FIG. 65 The diagram showing a $^1$H-NMR chart of a high molecular weight compound (compound H) according to the present invention synthesized in Example 8.

The obtained high molecular weight compound H was subjected to NMR measurement. FIG. 65 shows the result of $^1$H-NMR measurement.

The average molecular weight measured using GPC, the degree of dispersion, and the chemical composition of the high molecular weight compound were as follows Average molecular weight Mn (on a polystyrene conversion basis): 39,000

Weight average molecular weight Mw (on a polystyrene conversion basis): 85,000

Degree of dispersion (Mw/Mn): 2.2

Chemical Composition:

[Chem. 52]

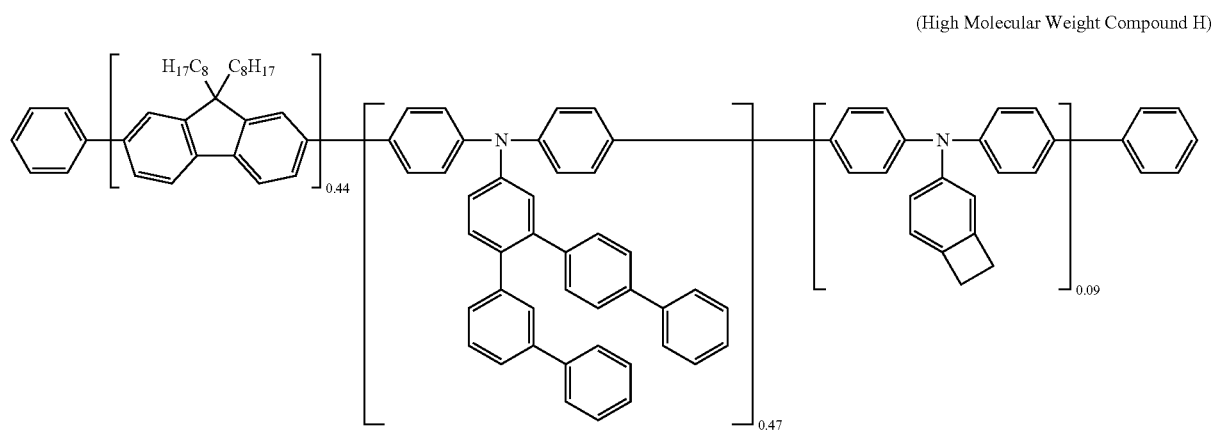

(High Molecular Weight Compound H)

As can be understood from the chemical composition given above, the high molecular weight compound H contained 47 mol % of structural unit A represented by the general formula (1), 44 mol % of structural unit B for improving the solubility in an organic solvent, and 9 mol % of structural unit C for improving thermal crosslinkability.

Example 9

Synthesis of High Molecular Weight Compound I The following components were placed in a reaction vessel whose internal air was replaced with nitrogen, and nitrogen gas was passed through the reaction vessel for 30 minutes:

3.5 g of 2,7-bis(4,4,5,5-tetramethyl-1,3,2-dioxaborolane-2-yl)-9,9-di-n-octylfluorene;

3.3 g of intermediate 32;

0.5 g of N,N-bis(4-bromophenyl)-N-(benzocyclobutene-4-yl)-amine;

4.9 g of tripotassium phosphate;

14 ml of toluene;

42 ml of 1,4-dioxane; and 8 ml of water.

Then, 4.0 mg of palladium(II) acetate and 32.3 mg of tri-o-tolylphosphine were added, and the mixture was heated and stirred at 85° C. for 6 hours. Then, 63 mg of 2,7-bis(4,4,5,5-tetramethyl-1,3,2-dioxaborolane-2-yl)-9,9-di-n-octylfluorene was added and the mixture was stirred for 1 hour, and 171 mg of bromobenzene was added and the mixture was stirred for 1 hour.

Then, 100 ml of toluene and 100 ml of 5 wt % aqueous solution of sodium N,N-diethyldithiocarbamate were added, and the mixture was heated and stirred under reflux for 1 hour.

After the mixture was cooled down to room temperature, a separation operation was performed to extract an organic layer. The organic layer was washed twice with a saturated saline solution. The organic layer was dehydrated using magnesium sulfate anhydrous, and then concentrated under reduced pressure to obtain a crude polymer. The crude polymer was dissolved in toluene and adsorbed and purified by adding a silica gel, and then the silica gel was removed through filtering. The obtained filtrate was concentrated under reduced pressure, 120 ml of toluene was added to a dried solid to dissolve the dried solid, the resultant was dripped into hexane 240 ml, and a precipitate was obtained through filtering. This operation was repeated twice, and the resultant was dried to obtain 4.7 g (with a yield of 92%) of high molecular weight compound I.

Figure 66:
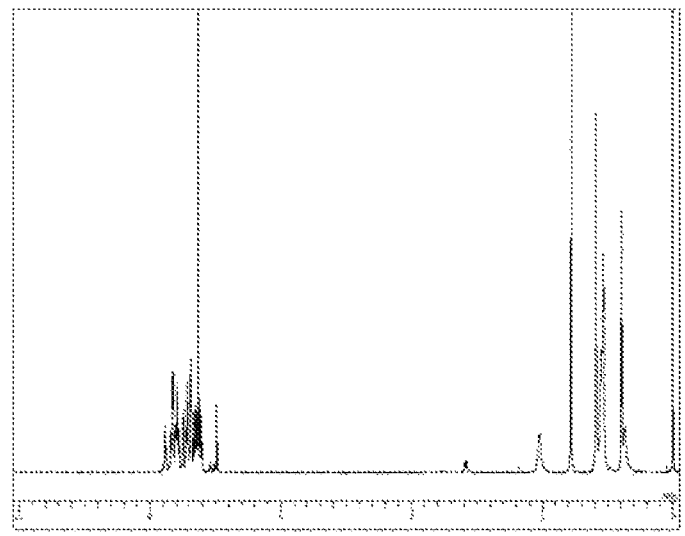
FIG. 66 The diagram showing a $^1$H-NMR chart of a high molecular weight compound (compound I) according to the present invention synthesized in Example 9.

The obtained high molecular weight compound I was subjected to NMR measurement. FIG. 66 shows the result of $^1$H-NMR measurement.

The average molecular weight measured using GPC, the degree of dispersion, and the chemical composition of the high molecular weight compound were as follows Average molecular weight Mn (on a polystyrene conversion basis): 63,000

Weight average molecular weight Mw (on a polystyrene conversion basis): 479,000

Degree of dispersion (Mw/Mn): 7.7

Chemical Composition:

[Chem. 53]

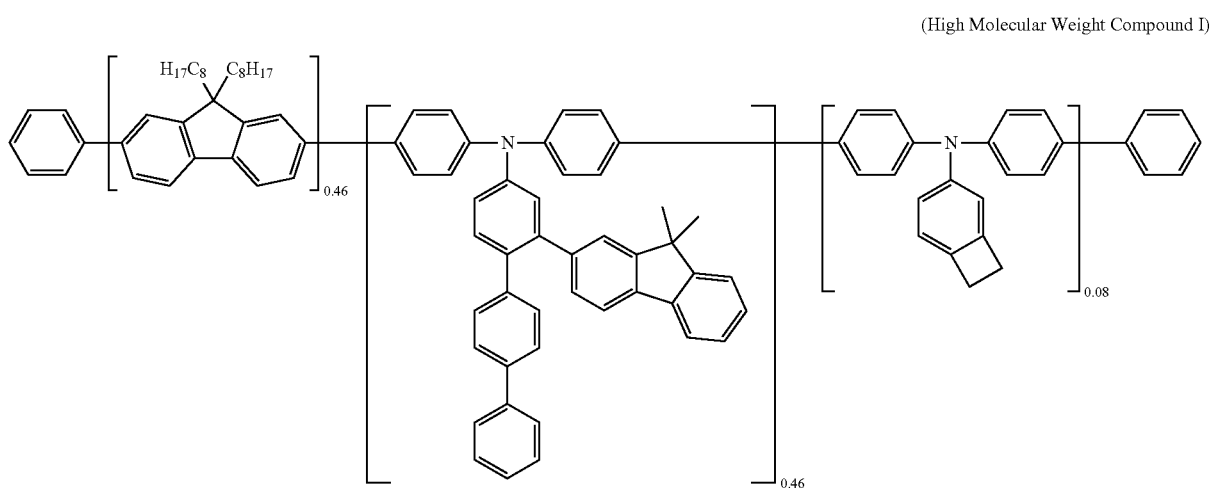

(High Molecular Weight Compound I)

As can be understood from the chemical composition given above, the high molecular weight compound I contained 46 mol % of structural unit A represented by the general formula (1), 46 mol % of structural unit B for improving the solubility in an organic solvent, and 8 mol % of structural unit C for improving thermal crosslinkability.

Example 10

Synthesis of High Molecular Weight Compound J

The following components were placed in a reaction vessel whose internal air was replaced with nitrogen, and nitrogen gas was passed through the reaction vessel for 30 minutes:

3.1 g of 2,7-bis(4,4,5,5-tetramethyl-1,3,2-dioxaborolane-2-yl)-9,9-di-n-octylfluorene;
3.0 g of intermediate 35;
0.4 g of N,N-bis(4-bromophenyl)-N-(benzocyclobutene-4-yl)-amine;
4.3 g of tripotassium phosphate;
16 ml of toluene;
48 ml of 1,4-dioxane; and
9 ml of water.

Then, 3.5 mg of palladium(II) acetate and 28.6 mg of tri-o-tolylphosphine were added, and the mixture was heated and stirred at 85° C. for 5 hours. Then, 56 mg of 2,7-bis(4,4,5,5-tetramethyl-1,3,2-dioxaborolane-2-yl)-9,9-di-n-octylfluorene was added and the mixture was stirred for 1 hour, and 150 mg of bromobenzene was added and the mixture was stirred for 1 hour.

Then, 100 ml of toluene and 100 ml of 5 wt % aqueous solution of sodium N,N-diethyldithiocarbamate were added, and the mixture was heated and stirred under reflux for 1 hour.

After the mixture was cooled down to room temperature, a separation operation was performed to extract an organic layer. The organic layer was washed twice with a saturated saline solution. The organic layer was dehydrated using magnesium sulfate anhydrous, and then concentrated under reduced pressure to obtain a crude polymer. The crude polymer was dissolved in toluene and adsorbed and purified by adding a silica gel, and then the silica gel was removed through filtering. The obtained filtrate was concentrated under reduced pressure, 120 ml of toluene was added to a dried solid to dissolve the dried solid, the resultant was dripped into hexane 240 ml, and a precipitate was obtained through filtering. This operation was repeated twice, and the resultant was dried to obtain 4.2 g (with a yield of 90%) of high molecular weight compound J.

Figure 67:
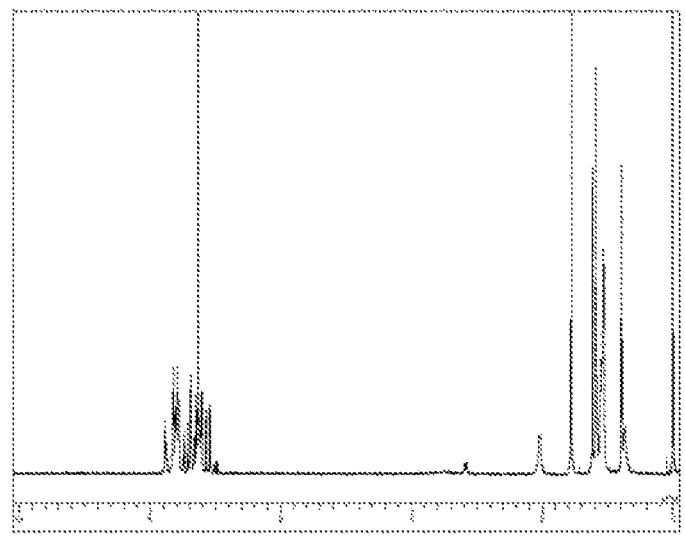
FIG. 67 The diagram showing a $^1$H-NMR chart of a high molecular weight compound (compound J) according to the present invention synthesized in Example 10.

The obtained high molecular weight compound J was subjected to NMR measurement. FIG. 67 shows the result of $^1$H-NMR measurement.

The average molecular weight measured using GPC, the degree of dispersion, and the chemical composition of the high molecular weight compound were as follows Average molecular weight Mn (on a polystyrene conversion basis): 61,000

Weight average molecular weight Mw (on a polystyrene conversion basis): 183,000

Degree of dispersion (Mw/Mn): 3.0

Chemical Composition:

[Chem. 54]

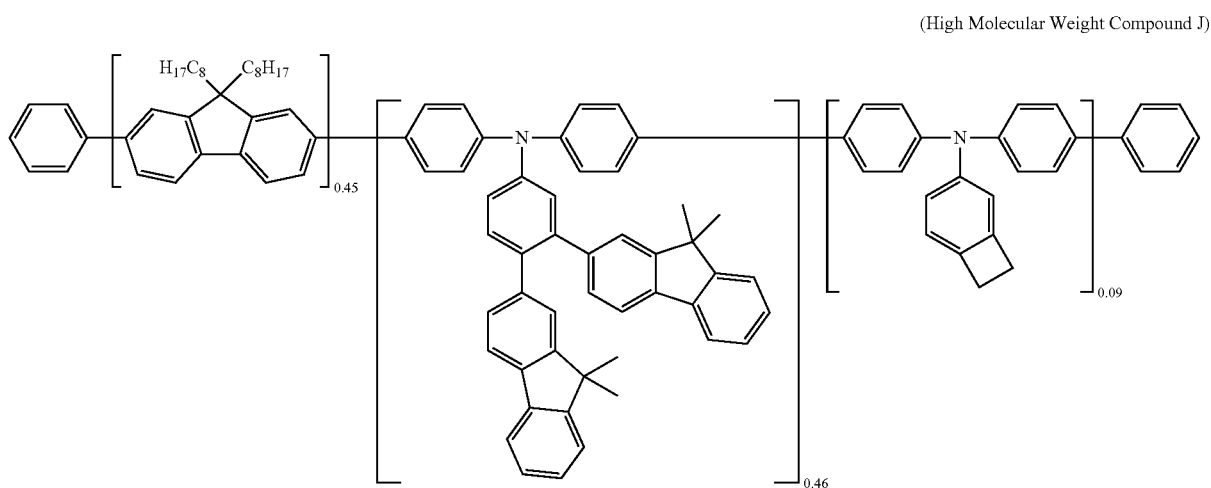

(High Molecular Weight Compound J)

As can be understood from the chemical composition given above, the high molecular weight compound J contained 46 mol % of structural unit A represented by the general formula (1), 45 mol % of structural unit B for improving the solubility in an organic solvent, and 9 mol % of structural unit C for improving thermal crosslinkability.

Example 11

Synthesis of High Molecular Weight Compound K

The following components were placed in a reaction vessel whose internal air was replaced with nitrogen, and nitrogen gas was passed through the reaction vessel for 30 minutes:

4.5 g of 2,7-bis(4,4,5,5-tetramethyl-1,3,2-dioxaborolane-2-yl)-9,9-di-n-octylfluorene;
4.1 g of intermediate 40;
0.6 g of N,N-bis(4-bromophenyl)-N-(benzocyclobutene-4-yl)-amine;
6.2 g of tripotassium phosphate;
18 ml of toluene;
54 ml of 1,4-dioxane; and
10 ml of water.

Then, palladium(II) acetate 5.1 mg, and 41.6 mg of tri-o-tolylphosphine were added, and the mixture was heated and stirred at 85° C. for 5 hours. Then, 80 mg of 2,7-bis(4,4,5,5-tetramethyl-1,3,2-dioxaborolane-2-yl)-9,9-di-n-octylfluorene was added and the mixture was stirred for 1 hour, and 220 mg of bromobenzene was added and the mixture was stirred for 1 hour.

Then, 100 ml of toluene and 100 ml of 5 wt % aqueous solution of sodium N,N-diethyldithiocarbamate were added, and the mixture was heated and stirred under reflux for 1 hour.

After the mixture was cooled down to room temperature, a separation operation was performed to extract an organic layer. The organic layer was washed twice with a saturated saline solution. The organic layer was dehydrated using magnesium sulfate anhydrous, and then concentrated under reduced pressure to obtain a crude polymer. The crude polymer was dissolved in toluene and adsorbed and purified by adding a silica gel, and then the silica gel was removed through filtering. The obtained filtrate was concentrated under reduced pressure, 150 ml of toluene was added to a dried solid to dissolve the dried solid, the resultant was dripped into hexane 300 ml, and a precipitate was obtained through filtering. This operation was repeated twice, and the resultant was dried to obtain 6.1 g (with a yield of 94%) of high molecular weight compound K.

Figure 68:
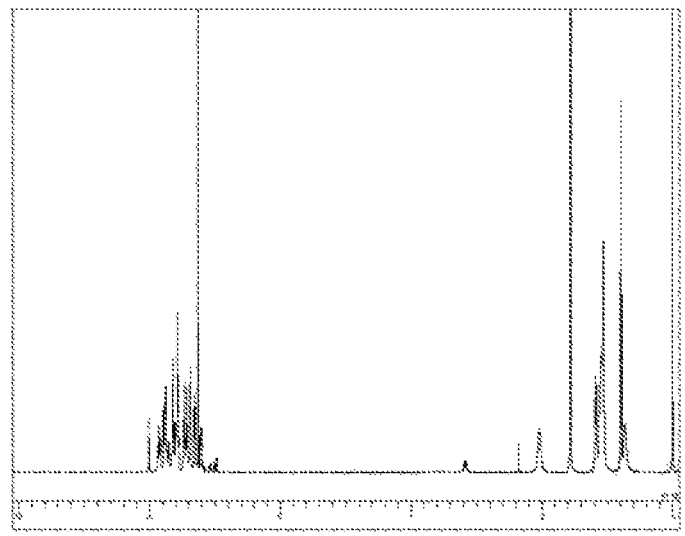
FIG. 68 The diagram showing a $^1$H-NMR chart of a high molecular weight compound (compound K) according to the present invention synthesized in Example 11.

The obtained high molecular weight compound K was subjected to NMR measurement. FIG. 68 shows the result of $^1$H-NMR measurement.

The average molecular weight measured using GPC, the degree of dispersion, and the chemical composition of the high molecular weight compound were as follows Average molecular weight Mn (on a polystyrene conversion basis): 66,000

Weight average molecular weight Mw (on a polystyrene conversion basis): 211,000

Degree of dispersion (Mw/Mn): 3.2

Chemical Composition:

[Chem. 55]

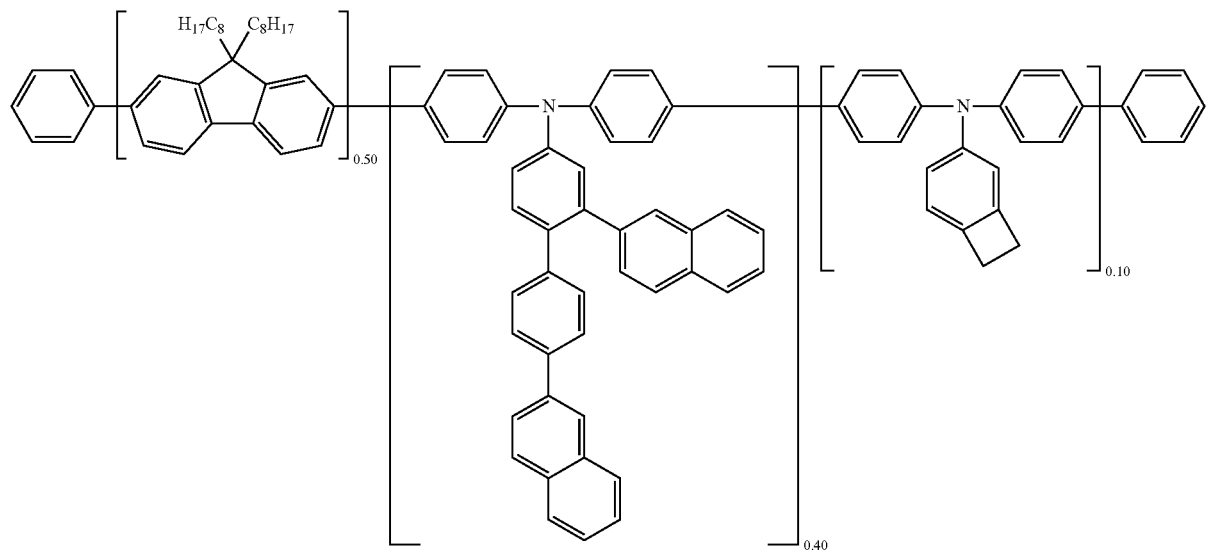

(High Molecular Weight Compound K)

As can be understood from the chemical composition given above, the high molecular weight compound K contained 40 mol % of structural unit A represented by the general formula (1), 50 mol % of structural unit B for improving the solubility in an organic solvent, and 10 mol % of structural unit C for improving thermal crosslinkability.

Example 12

Synthesis of High Molecular Weight Compound L

The following components were placed in a reaction vessel whose internal air was replaced with nitrogen, and nitrogen gas was passed through the reaction vessel for 30 minutes:
  5.0 g of intermediate 41;
  5.5 g of intermediate 10;
  0.9 g of N,N-bis(4-bromophenyl)-N-(benzocyclobutene-4-yl)-amine;
  8.9 g of tripotassium phosphate;
  12 ml of toluene;
  36 ml of 1,4-dioxane; and
  7 ml of water.

Then, 1.8 mg of palladium(II) acetate and 14.9 mg of tri-o-tolylphosphine were added, and the mixture was heated and stirred at 85° C. for 9 hours. Then, 90 mg of intermediate 41 was added and the mixture was stirred for 1 hour, and 320 mg of bromobenzene was added and the mixture was stirred for 1 hour.

Then, 100 ml of toluene and 100 ml of 5 wt % aqueous solution of sodium N,N-diethyldithiocarbamate were added, and the mixture was heated and stirred under reflux for 1 hour.

After the mixture was cooled down to room temperature, a separation operation was performed to extract an organic layer. The organic layer was washed twice with a saturated saline solution. The organic layer was dehydrated using magnesium sulfate anhydrous, and then concentrated under reduced pressure to obtain a crude polymer. The crude polymer was dissolved in toluene and adsorbed and purified by adding a silica gel, and then the silica gel was removed through filtering. The obtained filtrate was concentrated under reduced pressure, 130 ml of toluene was added to a dried solid to dissolve the dried solid, the resultant was dripped into hexane 260 ml, and a precipitate was obtained through filtering. This operation was repeated twice, and the resultant was dried to obtain 6.6 g (with a yield of 90%) of high molecular weight compound L.

Figure 69:
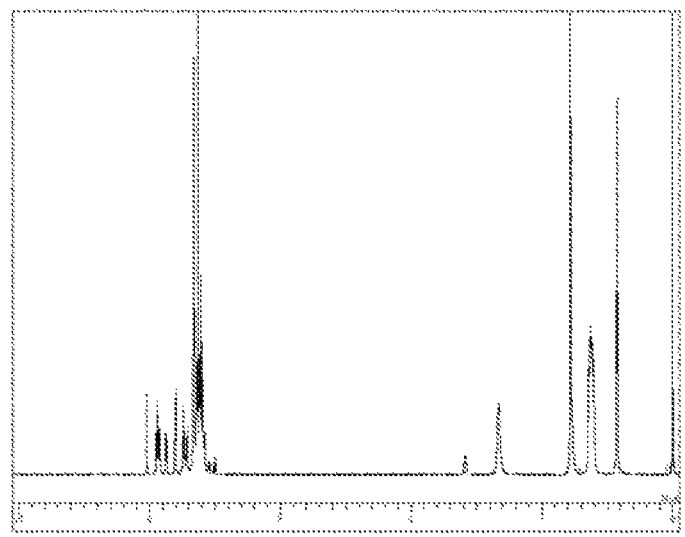
FIG. 69 The diagram showing a $^1$H-NMR chart of a high molecular weight compound (compound L) according to the present invention synthesized in Example 12.

The obtained high molecular weight compound L was subjected to NMR measurement. FIG. 69 shows the result of $^1$H-NMR measurement.

The average molecular weight measured using GPC, the degree of dispersion, and the chemical composition of the high molecular weight compound were as follows
  Average molecular weight Mn (on a polystyrene conversion basis): 38,000
  Weight average molecular weight Mw (on a polystyrene conversion basis): 78,000
  Degree of dispersion (Mw/Mn): 2.0

Chemical Composition:

[Chem. 56]

(High Molecular Weight Compound L)

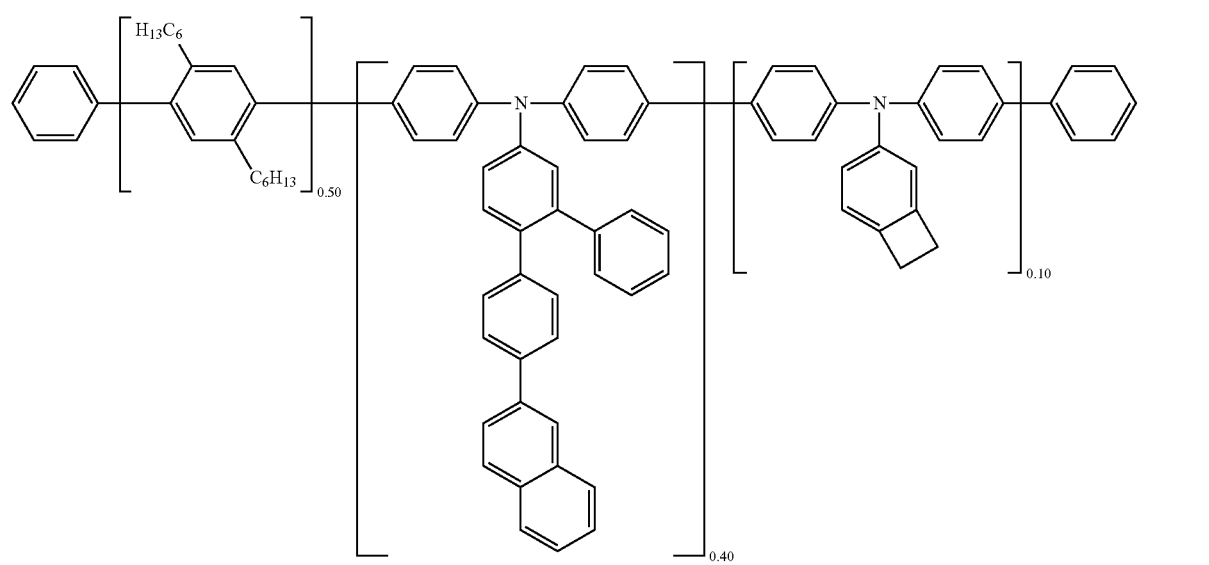

As can be understood from the chemical composition given above, the high molecular weight compound L contained 40 mol % of structural unit A represented by the general formula (1), 50 mol % of structural unit B for improving the solubility in an organic solvent, and 10 mol % of structural unit C for improving thermal crosslinkability.

Example 13

Deposition films each having a thickness of 100 nm were formed on an ITO substrate using the high molecular weight compounds A to L synthesized in Examples 1 to 12, and work function was measured using an ionization potential measurement apparatus (Model PYS-202 available from Sumitomo Heavy Industries, Ltd.). The result was as follows.

|  | Work function |
|---|---|
| High molecular weight compound A (polymer) | 5.65 eV |
| High molecular weight compound B (polymer) | 5.59 eV |
| High molecular weight compound C (polymer) | 5.59 eV |
| High molecular weight compound D (polymer) | 5.40 eV |
| High molecular weight compound E (polymer) | 5.59 eV |
| High molecular weight compound F (polymer) | 5.57 eV |
| High molecular weight compound G (polymer) | 5.59 eV |
| High molecular weight compound H (polymer) | 5.59 eV |
| High molecular weight compound I (polymer) | 5.58 eV |
| High molecular weight compound J (polymer) | 5.55 eV |
| High molecular weight compound K (polymer) | 5.58 eV |
| High molecular weight compound L (polymer) | 5.73 eV |

The high molecular weight compounds A to L according to the present invention exhibited an energy level higher than 5.4 eV that is the work function of ordinary hole transport materials such as NPD and TPD, from which it can be seen that the high molecular weight compound A to L has good hole transport capability.

Example 14

Production and Evaluation of Organic EL Element

Figure 57:
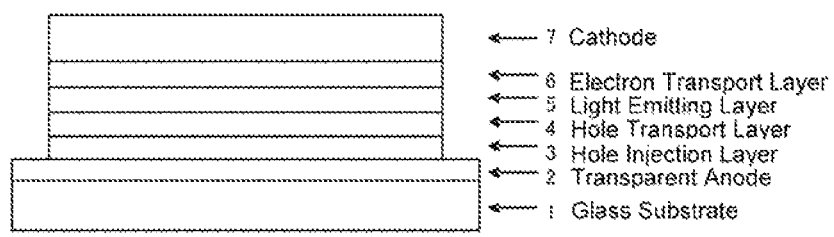
FIG. 57 The diagram showing an example of a layer configuration of an organic element according to the present invention.

An organic EL element having a layer structure shown in FIG. 57 was produced in the following manner.

Specifically, a glass substrate 1 on which an ITO film having a thickness of 50 nm was formed was washed with an organic solvent, and then UV/ozone treatment was performed to wash the surface of the ITO film.

A compound having the following structural formula (AQ-1200 available from Solvay) was applied using a spin coating method so as to cover the transparent anode 2 (ITO film) formed on the glass substrate 1, and a 55 nm thick film was thereby formed. The film was dried on a hot plate at 170° C. for 10 minutes, and a hole injection layer 3 was thereby formed.

[Chem. 57]

(AQ1200)

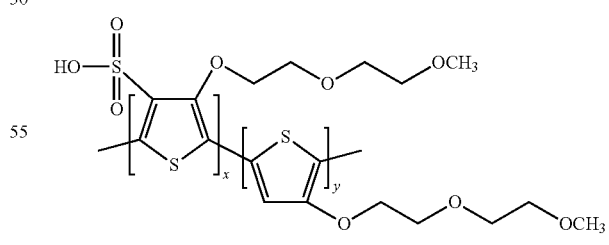

A coating solution was prepared by dissolving the high molecular weight compound A obtained in Example 1 in toluene at a concentration of 0.6 wt %.

The substrate on which the hole injection layer 3 was formed in the manner described above was placed in a glove box whose internal air was replaced with dry nitrogen, and a coating layer having a thickness of 20 nm was formed on the hole injection layer 3 through spin coating using the coating solution described above, and dried on a hot plate at 200° C. for 10 minutes, and a hole transport layer 4 was thereby formed.

The substrate on which the hole transport layer 4 was formed in the manner described above was set in a vacuum deposition apparatus, and the pressure was reduced to 0.001 Pa or less.

A light emitting layer 5 having a thickness of 40 nm was formed on the hole transport layer 4 through dual deposition using SBD 2460 (EMD-1) available from SFC and ABH 401 (EMH-1) available from SFC.

In the dual deposition, the ratio of deposition rate was set to EMD-1:EMH-1=7:93.

Compounds (ETM-1) and (ETM-2) represented by the following structural formulas were prepared as the electron transport materials.

[Chem. 58]

(ETM-1)

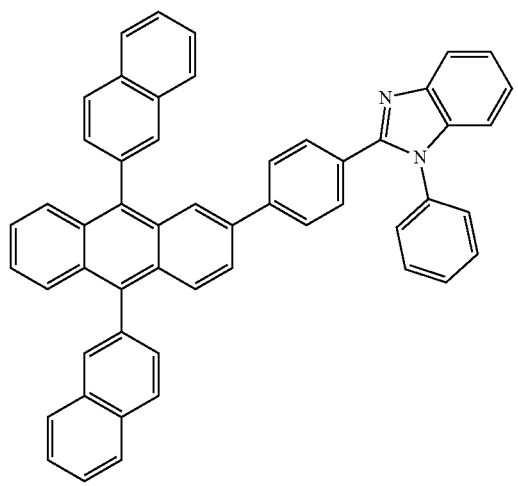

[Chem. 59]

(ETM-2)

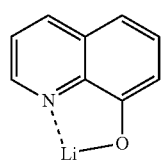

An electron transport material 6 having a thickness of 20 nm was formed on the light emitting layer 5 formed above through dual deposition using the electron transport materials (ETM-1) and (ETM-2).

The dual deposition was performed at a ratio of deposition rate of ETM-1 : ETM-2=50:50.

Finally, aluminum was deposited so as to form a film having a thickness of 100 nm, and a cathode 7 was thereby formed.

The glass substrate on which the transparent anode 2, the hole injection layer 3, the hole transport layer 4, the light emitting layer 5, the electron transport material 6, and the cathode 7 were formed was placed in a glove box whose internal air was replaced with dry nitrogen, and another glass substrate for sealing was bonded using a UV curable resin, and an organic EL element was thereby produced. The characteristics of the produced organic EL element were measured in an atmosphere at room temperature.

Also, light emission characteristics were measured by applying a DC voltage to the produced organic EL element.

The measurement results are shown in Table 1.

Example 15

An organic EL element was produced as in Example 14, except that the hole transport layer 4 was formed using a coating solution prepared by dissolving, instead of the high molecular weight compound A, the compound (the high molecular weight compound B) of Example 2 in toluene at a concentration of 0.6 wt %. The characteristics of the produced organic EL element were measured in an atmosphere at room temperature. The measurement results of light emission characteristics as measured by applying a DC voltage to the produced organic EL element as shown in Table 1.

Example 16

An organic EL element was produced as in Example 14, except that the hole transport layer 4 was formed using a coating solution prepared by dissolving, instead of the high molecular weight compound A, the compound (the high molecular weight compound C) of Example 3 in toluene at a concentration of 0.6 wt %. The characteristics of the produced organic EL element were measured in an atmosphere at room temperature. The measurement results of light emission characteristics as measured by applying a DC voltage to the produced organic EL element as shown in Table 1.

Example 17

An organic EL element was produced as in Example 14, except that the hole transport layer 4 was formed using a coating solution prepared by dissolving, instead of the high molecular weight compound A, the compound (the high molecular weight compound D) of Example 4 in toluene at a concentration of 0.6 wt %. The characteristics of the produced organic EL element were measured in an atmosphere at room temperature. The measurement results of light emission characteristics as measured by applying a DC voltage to the produced organic EL element as shown in Table 1.

Example 18

An organic EL element was produced as in Example 14, except that the hole transport layer 4 was formed using a coating solution prepared by dissolving, instead of the high molecular weight compound A, the compound (the high molecular weight compound E) of Example 5 in toluene at a concentration of 0.6 wt %. The characteristics of the produced organic EL element were measured in an atmosphere at room temperature. The measurement results of light emission characteristics as measured by applying a DC voltage to the produced organic EL element as shown in Table 1.

Example 19

An organic EL element was produced as in Example 14, except that the hole transport layer 4 was formed using a coating solution prepared by dissolving, instead of the high molecular weight compound A, the compound (the high molecular weight compound F) of Example 6 in toluene at a concentration of 0.6 wt %. The characteristics of the produced organic EL element were measured in an atmosphere at room temperature. The measurement results of light emission characteristics as measured by applying a DC voltage to the produced organic EL element as shown in Table 1.

Example 20

An organic EL element was produced as in Example 14, except that the hole transport layer 4 was formed using a coating solution prepared by dissolving, instead of the high molecular weight compound A, the compound (the high molecular weight compound G) of Example 7 in toluene at a concentration of 0.6 wt %. The characteristics of the produced organic EL element were measured in an atmosphere at room temperature. The measurement results of light emission characteristics as measured by applying a DC voltage to the produced organic EL element as shown in Table 1.

Example 21

An organic EL element was produced as in Example 14, except that the hole transport layer 4 was formed using a coating solution prepared by dissolving, instead of the high molecular weight compound A, the compound (the high molecular weight compound H) of Example 8 in toluene at a concentration of 0.6 wt %. The characteristics of the produced organic EL element were measured in an atmosphere at room temperature. The measurement results of light emission characteristics as measured by applying a DC voltage to the produced organic EL element as shown in Table 1.

Example 22

An organic EL element was produced as in Example 14, except that the hole transport layer 4 was formed using a coating solution prepared by dissolving, instead of the high molecular weight compound A, the compound (the high molecular weight compound I) of Example 9 in toluene at a concentration of 0.6 wt %. The characteristics of the produced organic EL element were measured in an atmosphere at room temperature. The measurement results of light emission characteristics as measured by applying a DC voltage to the produced organic EL element as shown in Table 1.

Example 23

An organic EL element was produced as in Example 14, except that the hole transport layer 4 was formed using a coating solution prepared by dissolving, instead of the high molecular weight compound A, the compound (the high molecular weight compound J) of Example 10 in toluene at a concentration of 0.6 wt %. The characteristics of the produced organic EL element were measured in an atmosphere at room temperature. The measurement results of light emission characteristics as measured by applying a DC voltage to the produced organic EL element as shown in Table 1.

Example 24

An organic EL element was produced as in Example 14, except that the hole transport layer 4 was formed using a coating solution prepared by dissolving, instead of the high molecular weight compound A, the compound (the high molecular weight compound K) of Example 11 in toluene at a concentration of 0.6 wt %. The characteristics of the produced organic EL element were measured in an atmosphere at room temperature. The measurement results of light emission characteristics as measured by applying a DC voltage to the produced organic EL element as shown in Table 1.

Example 25

An organic EL element was produced as in Example 14, except that the hole transport layer 4 was formed using a coating solution prepared by dissolving, instead of the high molecular weight compound A, the compound (the high molecular weight compound L) of Example 12 in toluene at a concentration of 0.6 wt %. The characteristics of the produced organic EL element were measured in an atmosphere at room temperature. The measurement results of light emission characteristics as measured by applying a DC voltage to the produced organic EL element as shown in Table 1.

Comparative Example 1

An organic EL element was produced as in Example 14, except that the hole transport layer 4 was formed using a coating solution prepared by dissolving, instead of the high molecular weight compound A, TFB (hole transport polymer) shown below in toluene at a concentration of 0.6 wt %.

[Chem. 60]

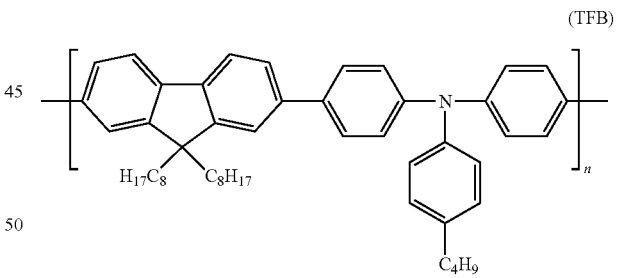

(TFB)

Poly[(9,9-dioctylfluorenyl-2,7-diyl)-co-(4,4'-(N-(4-sec-butylphenyl))diphenylamine] (Hole Transport Polymer ADS259BE available from American Dye Source)

Various characteristics of the organic EL element were evaluated as in Example 14. The results are shown in Table 1.

In the evaluation of various characteristics, element lifespan is defined as the time taken for light emission luminance to decay to 560 cd/m$^2$ (corresponding to 80% of the initial luminance being set to 100%: at a decay of 80%) when constant current driving is performed, with the light emission luminance (initial luminance) when light emission starts being set to 700 cd/m$^2$.

TABLE 1

| | High molecular weight compound | Voltage [V] (@ 10 mA/cm²) | Luminance [cd/m²] (@ 10 mA/cm²) | Light emission efficiency [cd/A] (@ 10 mA/cm²) | Power efficiency [lm/W] (@ 10 mA/cm²) | Element lifespan at a decay of 80% [hr] (@ 700 cd/m²) |
|---|---|---|---|---|---|---|
| Example 14 | A | 4.34 | 791 | 7.9 | 5.71 | 205 hours |
| Example 15 | B | 3.97 | 871 | 8.7 | 6.89 | 531 hours |
| Example 16 | C | 4.01 | 831 | 8.3 | 6.51 | 276 hours |
| Example 17 | D | 3.95 | 680 | 6.8 | 5.23 | 231 hours |
| Example 18 | E | 4.10 | 873 | 8.7 | 6.70 | 251 hours |
| Example 19 | F | 4.05 | 902 | 9.0 | 7.00 | 478 hours |
| Example 20 | G | 4.33 | 861 | 8.6 | 6.24 | 312 hours |
| Example 21 | H | 4.30 | 877 | 8.8 | 6.40 | 264 hours |
| Example 22 | I | 4.10 | 924 | 9.2 | 6.92 | 380 hours |
| Example 23 | J | 4.29 | 956 | 9.6 | 7.00 | 260 hours |
| Example 24 | K | 4.03 | 828 | 8.3 | 6.45 | 210 hours |
| Example 25 | L | 4.42 | 1071 | 10.7 | 7.62 | 87 hours |
| Comparative Example 1 | TFB | 4.19 | 666 | 6.7 | 4.99 | 194 hours |

As shown in Table 1, the light emission efficiency at an electric current density of 10 mA/cm² was 7.9 cd/A in the organic EL element of Example 14, 8.7 cd/A in the organic EL element of Example 15, 8.3 cd/A in the organic EL element of Example 16, 6.8 cd/A in the organic EL element of Example 17, 8.7 cd/A in the organic EL element of Example 18, 9.0 cd/A in the organic EL element of Example 19, 8.6 cd/A in the organic EL element of Example 20, 8.8 cd/A in the organic EL element of Example 21, 9.2 cd/A in the organic EL element of Example 22, 9.6 cd/A in the organic EL element of Example 23, 8.3 cd/A in the organic EL element of Example 24, and 10.7 cd/A in the organic EL element of Example 25, relative to 6.7 cd/A in the organic EL element of Comparative Example 1. That is, all of the organic EL elements of these examples exhibited high efficiency.

Also, the element lifespan (at a decay of 80%) was 205 hours in the organic EL element of Example 14, 531 hours in the organic EL element of Example 15, 276 hours in the organic EL element of Example 16, 231 hours in the organic EL element of Example 17, 251 hours in the organic EL element of Example 18, 478 hours in the organic EL element of Example 19, 312 hours in the organic EL element of Example 20, 264 hours in the organic EL element of Example 21, 380 hours in the organic EL element of Example 22, 260 hours in the organic EL element of Example 23, and 210 hours in the organic EL element of Example 24, relative to 194 hours in the organic EL element of Comparative Example 1. That is, the organic EL elements of these examples exhibited a long lifespan.

As can be seen from the foregoing, an organic EL element including an organic layer formed using the high molecular weight compound according to the present invention can have higher light emission efficiency and a longer lifespan as compared with a conventional organic EL element.

Example 26

Measurement and Evaluation of Residual Film Ratio

A thin film was formed on a glass substrate through spin coating using a solution prepared by dissolving the high molecular weight compound A synthesized in Example 1 in toluene at a concentration of 0.6 wt %.

The obtained film was placed in a glove box whose internal air was replaced with dry nitrogen, and baked on a hot plate at 200° C. for 1 hour.

After the baked film was cooled down to room temperature, absorption intensity of light at a wavelength of 300 to 700 nm was measured using a spectrophotometer (U-3000 available from Hitachi, Ltd.).

Also, the film that has undergone absorption intensity measurement was rinsed with toluene using a spin coater at 2000 rpm for 15 seconds. The absorption intensity of the rinsed film was measured using a spectrophotometer (U-3000 available from Hitachi, Ltd.).

Residual film ratio was calculated, using the following equation, from the absorption intensity values before and after rinsing measured in the manner described above. The results are shown in Table 2.

Residual film ratio (%)=($\alpha$/$\beta$)×100, where $\alpha$ represents the absorption intensity (peak top) after rinsing, and $\beta$ represents the absorption intensity (peak top) before rinsing.

Example 27

The residual film ratio was calculated as in Example 26, except that the high molecular weight compound A was changed to the high molecular weight compound B synthesized in Example 2. The result is shown in Table 2.

Example 28

The residual film ratio was calculated as in Example 26, except that the high molecular weight compound A was changed to the high molecular weight compound C synthesized in Example 3. The result is shown in Table 2.

Example 29

The residual film ratio was calculated as in Example 26, except that the high molecular weight compound A was changed to the high molecular weight compound D synthesized in Example 4. The result is shown in Table 2.

Example 30

The residual film ratio was calculated as in Example 26, except that the high molecular weight compound A was changed to the high molecular weight compound E synthesized in Example 5. The result is shown in Table 2.

Example 31

The residual film ratio was calculated as in Example 26, except that the high molecular weight compound A was changed to the high molecular weight compound F synthesized in Example 6. The result is shown in Table 2.

Example 32

The residual film ratio was calculated as in Example 26, except that the high molecular weight compound A was changed to the high molecular weight compound G synthesized in Example 7. The result is shown in Table 2.

Example 33

The residual film ratio was calculated as in Example 26, except that the high molecular weight compound A was changed to the high molecular weight compound H synthesized in Example 8. The result is shown in Table 2.

Example 34

The residual film ratio was calculated as in Example 26, except that the high molecular weight compound A was changed to the high molecular weight compound I synthesized in Example 9. The result is shown in Table 2.

Example 35

The residual film ratio was calculated as in Example 26, except that the high molecular weight compound A was changed to the high molecular weight compound J synthesized in Example 10. The result is shown in Table 2.

Example 36

The residual film ratio was calculated as in Example 26, except that the high molecular weight compound A was changed to the high molecular weight compound K synthesized in Example 11. The result is shown in Table 2.

Example 37

The residual film ratio was calculated as in Example 26, except that the high molecular weight compound A was changed to the high molecular weight compound L synthesized in Example 12. The result is shown in Table 2.

Comparative Example 2

The residual film ratio was calculated as in Example 26, except that the high molecular weight compound A was changed to TFB used in Comparative Example 1. The result is shown in Table 2.

TABLE 2

| | Compound | Residual film ratio |
|---|---|---|
| Example 26 | High molecular weight compound A | 91.7% |
| Example 27 | High molecular weight compound B | 100% |
| Example 28 | High molecular weight compound C | 100% |
| Example 29 | High molecular weight compound D | 100% |
| Example 30 | High molecular weight compound E | 98.5% |
| Example 31 | High molecular weight compound F | 94.9% |
| Example 32 | High molecular weight compound G | 100% |
| Example 33 | High molecular weight compound H | 100% |
| Example 34 | High molecular weight compound I | 99.1% |
| Example 35 | High molecular weight compound J | 97.3% |
| Example 36 | High molecular weight compound K | 100% |
| Example 37 | High molecular weight compound L | 100% |
| Comparative Example 2 | TFB | 28.9% |

As shown in Table 2, all of the high molecular weight compounds A to L exhibited a residual film ratio of 90% or more when baked at 200° C. for 60 minutes, from which it can be seen that the high molecular weight compound according to the present invention has a high level of curability (thermal crosslinkability).

INDUSTRIAL APPLICABILITY

The high molecular weight compound according to the present invention has high hole transport capability, excellent electron blocking capability, and good thermal crosslinkability. Accordingly, the high molecular weight compound according to the present invention is usable as a compound for producing coating type organic EL elements. By producing coating type organic EL elements using the compound, it is possible to obtain high light emission efficiency and high power efficiency, and also possible to improve durability. The coating type organic EL elements can be applied to, for example, home electric appliances and lighting equipment.

LIST OF REFERENCE NUMERALS

1 Glass substrate
2 Transparent Anode
3 Hole injection layer
4 Hole transport layer
5 Light emitting layer
6 Electrons transport layer
7 Cathode

The invention claimed is:
1. A high molecular weight compound comprising a substituted triarylamine structural unit represented by a general formula (1) below, a structural unit represented by a general formula (2a) to (2v) below, and a structural unit represented by a general formula (3a) to (3y) below as a repeating unit,

[Chem. 1]

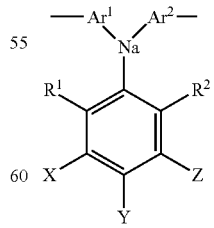

(1)

where $Ar^1$ and $Ar^2$ are each a divalent aromatic hydrocarbon group or a divalent aromatic heterocyclic group, $R^1$ and $R^2$ each represent a hydrogen atom, a heavy hydrogen atom, a fluorine atom, a chlorine atom, a cyano group, a nitro group, an alkyl group with 1 to 8 carbon atoms, a cycloalkyl group with 5 to 10 carbon atoms, an alkenyl group with 2 to 6 carbon atoms, an alkyloxy group with 1 to 6 carbon atoms, or a cycloalkyloxy group with 5 to 10 carbon atoms, and
X and Y are a phenyl group, a biphenylyl group, a terphenyl group, a naphthyl group, a phenanthrenyl group, a fluorenyl group, a naphthyl phenyl group, or a triphenylenyl group, and Z is a hydrogen atom or a heavy hydrogen atom, or
X and Z are a phenyl group, a biphenylyl group, a terphenyl group, a naphthyl group, a phenanthrenyl group, a fluorenyl group, a naphthyl phenyl group, or a triphenylenyl group, and Y is a hydrogen atom or a heavy hydrogen atom, or
X, Y and Z are a phenyl group, a biphenylyl group, a terphenyl group, a naphthyl group, a phenanthrenyl group, a fluorenyl group, a naphthyl phenyl group, or a triphenylenyl group,

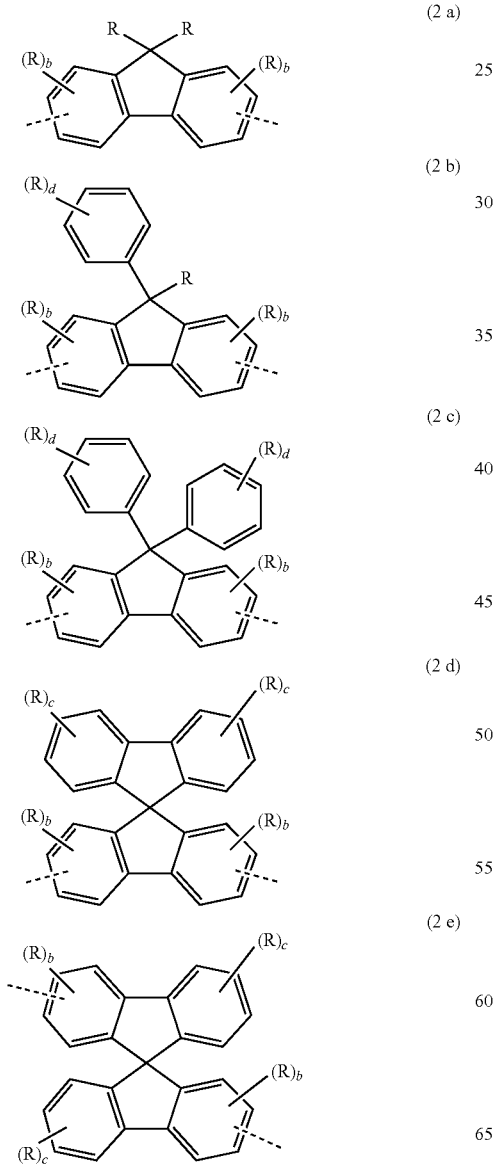

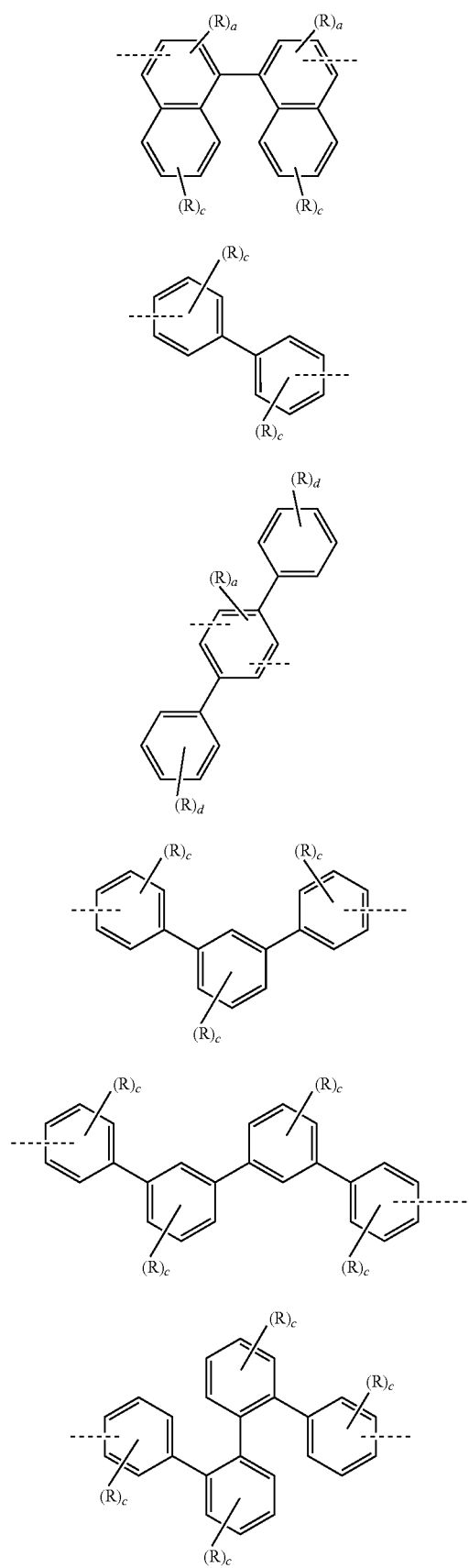
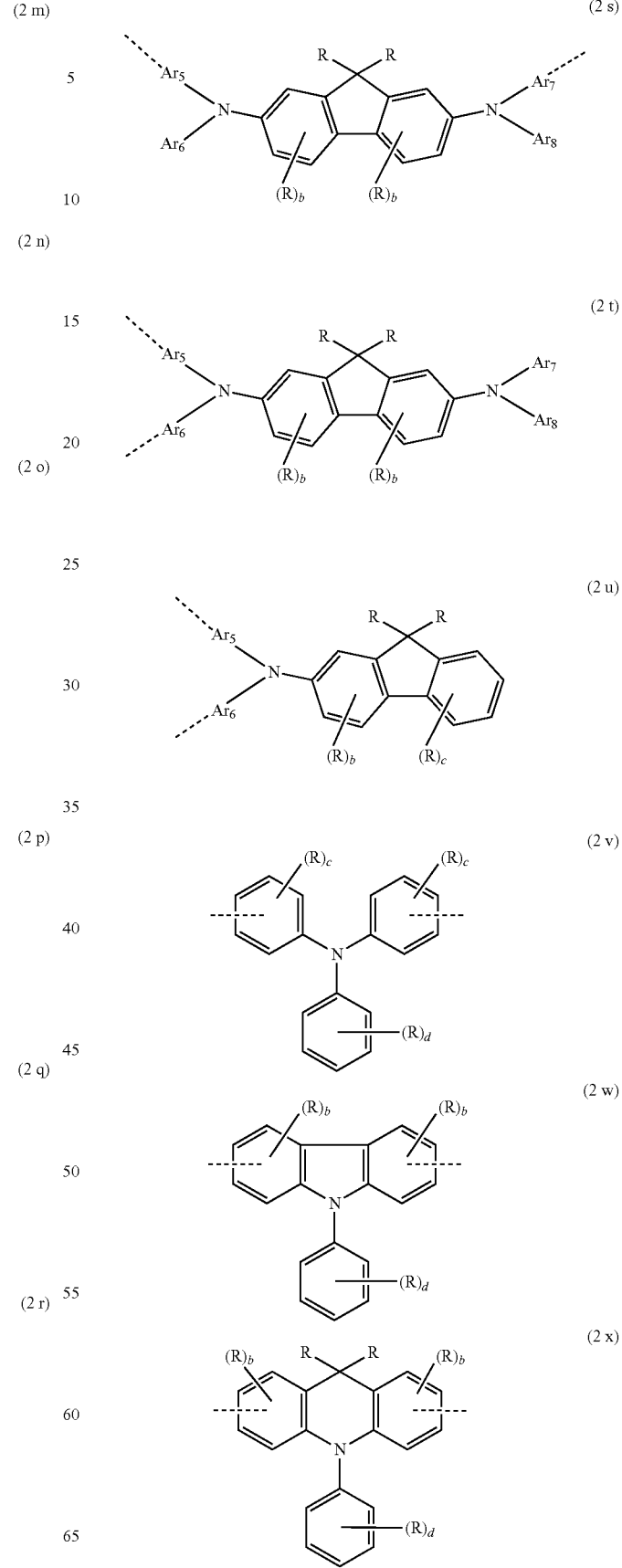

-continued
(3 a)
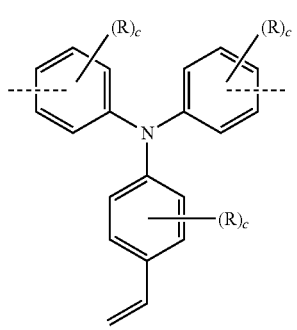
(3 b)
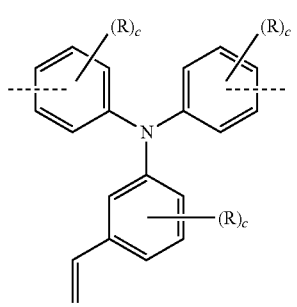
(3 c)
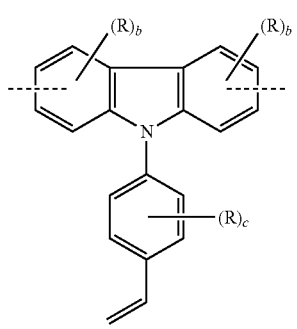
(3 d)
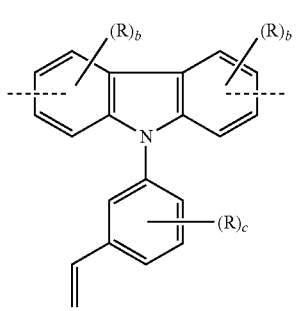
(3 e)
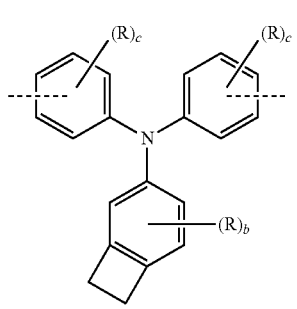
(3 f)
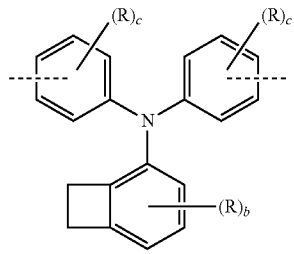
(3 g)
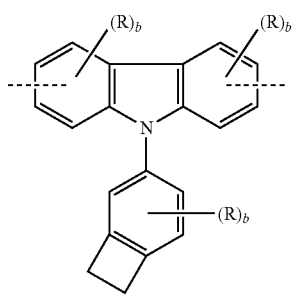
(3 h)
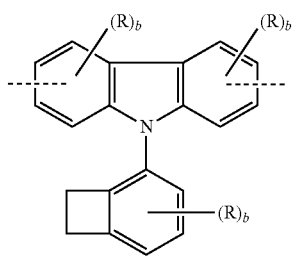
(3 i)
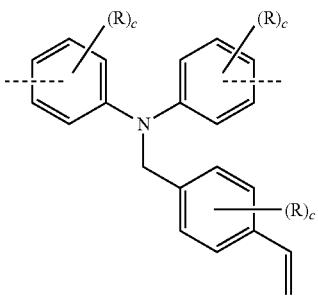
(3 j)
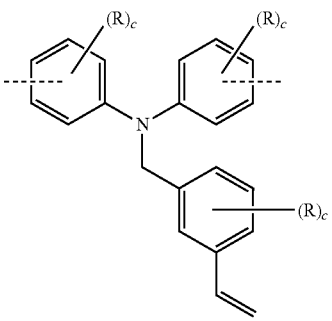

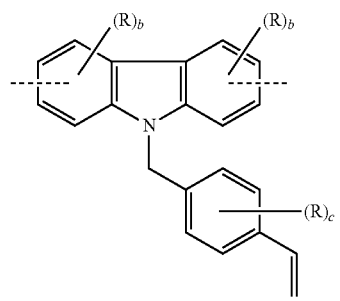
(3 k)
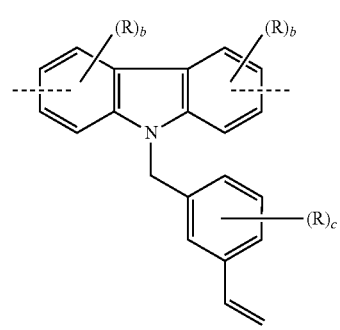
(3 l)
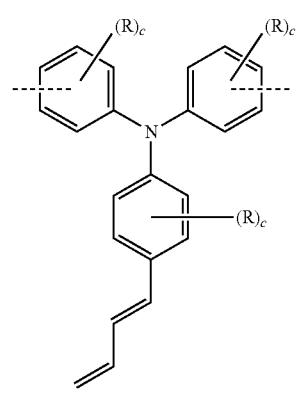
(3 m)
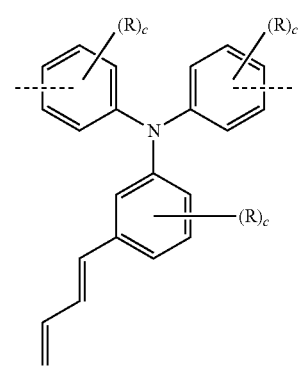
(3 n)
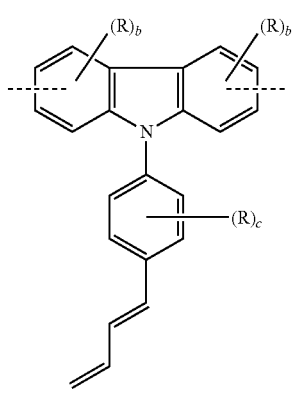
(3 o)
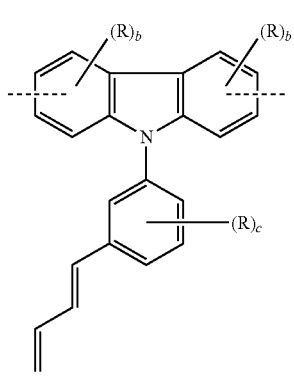
(3 p)
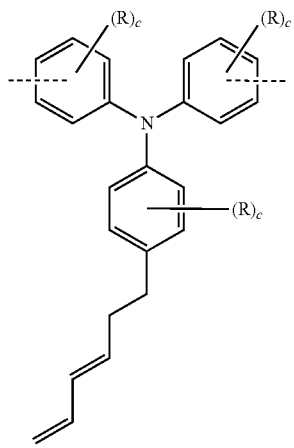
(3 q)
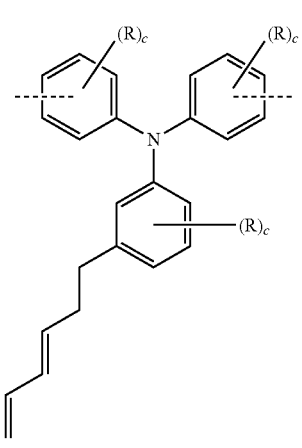
(3 r)

-continued (3 s)
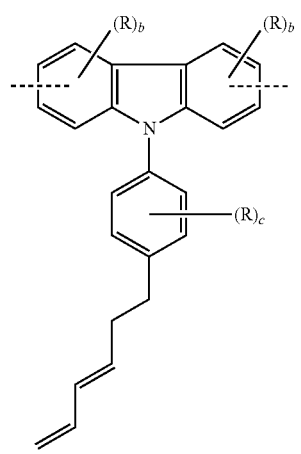

(3 t)
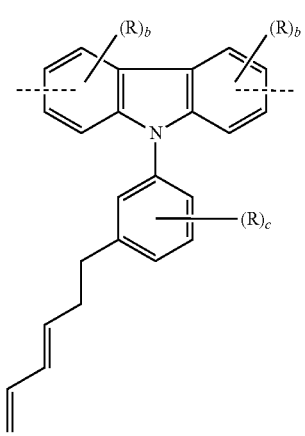

(3 u)
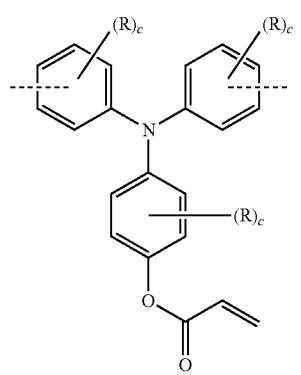

(3 v)
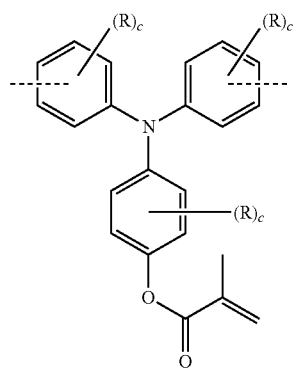

-continued (3 w)
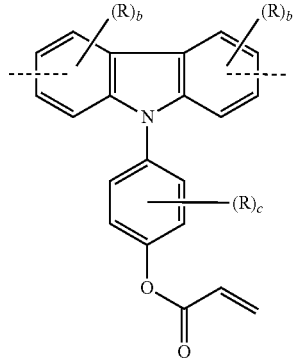

(3 x)
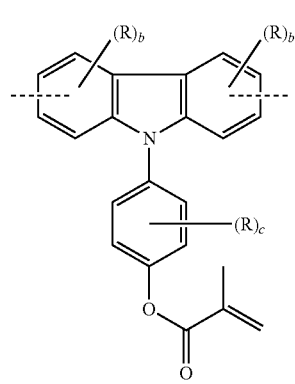

(3 y)
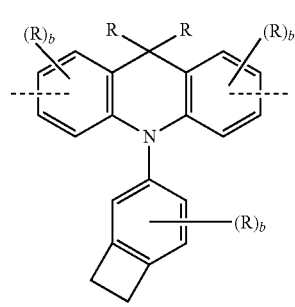

where each broken line indicates a bond to an adjacent structural unit, R represents:
  a hydrogen atom, a heavy hydrogen atom, a cyano group, a nitro group;
  a fluorine atom, a chlorine atom, a bromine atom, or an iodine atom; or
  an alkyl group, a cycloalkyl group, an alkoxy group, or a thioalkoxy group with 40 carbon atoms or less,
$Ar^5$ to AO may be the same or different from each other, and represent a monovalent or divalent aromatic hydrocarbon group, or a monovalent or divalent aromatic heterocyclic group, and
the subscripts a to d represent the following numbers:
a=0, 1, or 2
b=0, 1, 2, or 3
c=0, 1, 2, 3, or 4
d=0, 1, 2, 3, 4, or 5.

2. The high molecular weight compound as set forth in claim 1, wherein the high molecular weight compound is a polymer comprising the structural unit above-mentioned as a repeating unit, and has a weight average molecular weight of 10,000 or more and less than 1,000,000 on a polystyrene conversion basis.

3. The high molecular weight compound as set forth in claim 1, wherein, in the general formula (1) above, $R^1$ and $R^2$ are a hydrogen atom or a heavy hydrogen atom.

4. An organic electroluminescent element comprising:
a pair of electrodes; and
at least one organic layer interposed between the pair of electrodes,
wherein the organic layer contains the high molecular weight compound as set forth in claim 1.

5. The organic electroluminescent element as set forth in claim 4, wherein the organic layer is a hole transport layer.

6. The organic electroluminescent element as set forth in claim 4, wherein the organic layer is an electron blocking layer.

7. The organic electroluminescent element as set forth in claim 4, wherein the organic layer is a hole injection layer.

8. The organic electroluminescent element as set forth in claim 4, wherein the organic layer is a light emitting layer.

\* \* \* \* \*